(12) United States Patent
Lee et al.

(10) Patent No.: US 12,376,375 B2
(45) Date of Patent: Jul. 29, 2025

(54) DISPLAY APPARATUS INCLUDING AUXILIARY SUB-PIXELS CONFIGURED TO IMPROVE LIGHT TRANSMITTANCE OF COMPONENT AREA

(71) Applicant: Samsung Display Co., Ltd., Yongin-Si (KR)

(72) Inventors: Jiseon Lee, Yongin-si (KR); Sungho Kim, Yongin-si (KR); Seokje Seong, Yongin-si (KR); Jinsung An, Yongin-si (KR); Minwoo Woo, Yongin-si (KR); Seunghyun Lee, Yongin-si (KR); Wangwoo Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 897 days.

(21) Appl. No.: 17/531,282

(22) Filed: Nov. 19, 2021

(65) Prior Publication Data

US 2022/0246687 A1 Aug. 4, 2022

(30) Foreign Application Priority Data

Jan. 29, 2021 (KR) .......................... 10-2021-0013471

(51) Int. Cl.
*H10D 86/40* (2025.01)
*H10D 30/67* (2025.01)
(Continued)

(52) U.S. Cl.
CPC ......... *H10D 86/423* (2025.01); *H10K 59/121* (2023.02); *H10K 59/1213* (2023.02); *H10K 59/1216* (2023.02); *H10K 59/126* (2023.02); *H10K 59/131* (2023.02); *H10K 71/00* (2023.02); *H10D 30/6723* (2025.01); *H10D 30/6731* (2025.01); *H10D 30/6745* (2025.01);
(Continued)

(58) Field of Classification Search
CPC ............. H10K 59/121; H10K 59/1213; H10K 59/1216; H10K 59/126; H10K 59/131; H10K 59/65
USPC .......................................................... 257/40
See application file for complete search history.

(56) References Cited

U.S. PATENT DOCUMENTS 9,640,681 B2  5/2017 Min
2023/0422552 A1* 12/2023 Huang ................. H10K 59/123

FOREIGN PATENT DOCUMENTS

CN  110288945 A  *  9/2019  ........... G09G 3/3225
CN  111180494 A  *  5/2020  ......... H01L 27/3234
(Continued)

*Primary Examiner* — Matthew E. Gordon
(74) *Attorney, Agent, or Firm* — Innovation Counsel LLP

(57) ABSTRACT

A display apparatus includes a substrate including a main display area and an auxiliary display area, the auxiliary display area including a component area and a middle area, a main pixel circuit and a main display element connected to the main pixel circuit, the main pixel circuit and the main display element being arranged on the main display area, a first auxiliary display element arranged on the component area, a first auxiliary pixel circuit, a second auxiliary pixel circuit, and a second auxiliary display element connected to the second auxiliary pixel circuit, wherein the first auxiliary pixel circuit, the second auxiliary pixel circuit, and the second auxiliary display element are arranged on the middle area, and a connecting line connecting the first auxiliary display element to the first auxiliary pixel circuit.

19 Claims, 34 Drawing Sheets

(51) Int. Cl.
*H10D 86/60* (2025.01)
*H10K 59/12* (2023.01)
*H10K 59/121* (2023.01)
*H10K 59/126* (2023.01)
*H10K 59/131* (2023.01)
*H10K 59/65* (2023.01)
*H10K 71/00* (2023.01)

(52) U.S. Cl.
CPC ....... *H10D 30/6755* (2025.01); *H10D 86/443* (2025.01); *H10D 86/471* (2025.01); *H10D 86/481* (2025.01); *H10D 86/60* (2025.01); *H10K 59/1201* (2023.02); *H10K 59/65* (2023.02)

(56) References Cited

FOREIGN PATENT DOCUMENTS

| | | |
|---|---|---|
| CN | 111627339 A | 9/2020 |
| CN | 111667766 A | 9/2020 |
| KR | 10-2031654 B1 | 10/2019 |

* cited by examiner

DISPLAY APPARATUS INCLUDING AUXILIARY SUB-PIXELS CONFIGURED TO IMPROVE LIGHT TRANSMITTANCE OF COMPONENT AREA

CROSS-REFERENCE TO RELATED APPLICATION

This application is based on and claims priority under 35 U.S.C. § 119 to Korean Patent Application No. 10-2021-0013471, filed on Jan. 29, 2021, in the Korean Intellectual Property Office, the disclosure of which is incorporated by reference herein in its entirety.

BACKGROUND

1. Field

The disclosure relates to a display apparatus, and more particularly, to a display apparatus capable of providing high-quality images and also improving the quality of an image displayed through a component.

2. Description of the Related Art

Generally, a display apparatus includes a display element and electronic devices for controlling electrical signals applied to the display element. The electronic devices include a thin-film transistor (TFT), a storage capacitor, and a plurality of lines.

Recently, the usage of a display apparatus has diversified. Also, the display apparatus has become thinner and lighter, and thus, the range of uses of the display apparatus has expanded. As the usage range of the display apparatus has been diversified, various methods for designing a shape of the display apparatus have been studied.

SUMMARY

A display panel according to the related art and a display apparatus including the same has a problem in that the quality of an image captured by a camera is low. This problem is caused in a process of designing the display panel to display high-quality images.

In order to solve various problems including the problem described above, the disclosure provides a display apparatus, in which while a high-quality image is provided, the quality of an image displayed through a component is improved. However, these objectives are examples and do not limit the scope of the disclosure.

Additional aspects will be set forth in part in the description which follows and, in part, will be apparent from the description, or may be learned by practice of the presented embodiments of the disclosure.

According to one or more embodiments, a display apparatus includes a substrate including a main display area and an auxiliary display area, the auxiliary display area including a component area and a middle area, wherein each of a main pixel circuit and a main display element connected to the main pixel circuit, the main pixel circuit and the main display element arranged on the main display area, a first auxiliary display element arranged on the component area, a first auxiliary pixel circuit, a second auxiliary pixel circuit, and a second auxiliary display element connected to the second auxiliary pixel circuit, wherein the first auxiliary pixel circuit, the second auxiliary pixel circuit, and the second auxiliary display element are arranged on the middle area, and a connecting line connecting the first auxiliary display element to the first auxiliary pixel circuit, wherein the auxiliary display area includes a first area including a central portion of the component area and a portion of the middle area, and a second area at a side of the first area, the second area including a portion of the component area and a portion of the middle area, and the connecting line includes a first connecting line and a second connecting line arranged on the first area and the second area, respectively, wherein the first connecting line extends in a first direction, and the second connecting line extends in a second direction crossing the first direction.

The auxiliary display area may further include a third area at an other side of the first area, the third area being symmetrically arranged with the second area and including a portion of the component area and a portion of the middle area, and the connecting line may further include a third connecting line arranged on the third area, wherein the third connecting line extends in the second direction.

The auxiliary display area may further include a fourth area contacting each of the main display area, the first area, the second area, and the third area and including a portion of the component area and a portion of the middle area, and the connecting line may further include a fourth connecting line arranged on the fourth area and extending in the second direction.

Each of the first connecting line, the second connecting line, the third connecting line, and the fourth connecting line each may include a transmissive conductive material.

The fourth area may have a first width in the first direction, and the component area may have a second width in the first direction, wherein the first width is about 25% of a maximum value of the second width.

The fourth connecting line disposed on the fourth area may be symmetrically arranged based on a virtual central line crossing a center of the fourth area.

The first auxiliary display element may include a first auxiliary pixel electrode, and the first auxiliary pixel electrode may have an oval shape.

The first auxiliary pixel electrode may include a first contact portion at a side thereof, and the first contact portion is electrically connected to the first auxiliary pixel circuit and overlaps the first auxiliary pixel electrode.

The second auxiliary display element may include a second auxiliary pixel electrode, and the second auxiliary pixel electrode may have a circular shape.

The second auxiliary pixel electrode may include an extension portion extending in a direction, and the extension portion may include a second contact portion electrically connected to the second auxiliary pixel circuit.

Each of the first auxiliary pixel circuit and the second auxiliary pixel circuit may include a silicon semiconductor layer and an oxide semiconductor layer arranged on different layers from each other, a first gate electrode arranged to overlap the silicon semiconductor layer, a first electrode layer arranged on the first gate electrode and connected to the silicon semiconductor layer, a second gate electrode arranged to overlap the oxide semiconductor layer, and a second electrode layer arranged on the second gate electrode and connected to the oxide semiconductor layer.

The display apparatus may further include a first transmissive conductive layer arranged on a same layer as the first electrode layer and the second electrode layer.

The display apparatus may further include a second transmissive conductive layer arranged on the first transmissive conductive layer.

Each of the first transmissive conductive layer and the second transmissive conductive layer may be provided in a multiple number, and the first transmissive conductive layer and the second transmissive conductive layer may be alternately arranged on a plane.

The connecting line may be provided as the first transmissive conductive layer or the second transmissive conductive layer.

Each of the first auxiliary pixel circuit and the second auxiliary pixel circuit may include a first bottom surface metal layer arranged between the substrate and the silicon semiconductor layer, and a second bottom surface metal layer arranged between the substrate and the oxide semiconductor layer, wherein the first bottom surface metal layer and the second bottom surface metal layer are arranged on different layers from each other.

Each of the first auxiliary pixel circuit and the second auxiliary pixel circuit may further include a storage capacitor including a lower electrode which is integral with the first gate electrode, and an upper electrode overlapping the lower electrode disposed on the lower electrode, and the second bottom surface metal layer may be arranged on a same layer as the upper electrode.

The display apparatus may further include a first conductive line and a second conductive line arranged to correspond to at least a portion of the intermediate layer of the first area, wherein the first connecting line is connected to the first conductive line or the second conductive line.

Each of the first conductive line and the second conductive line each may include a reflective conductive material.

The first conductive line and the second conductive line may be arranged on different layers from each other and may be alternately arranged on a plane.

The substrate may further include a peripheral area surrounding the main display area, and the display apparatus may further include a third auxiliary pixel circuit arranged on the peripheral area adjacent to the auxiliary display area, and a third auxiliary display element arranged on the component area and electrically connected to the third auxiliary pixel circuit.

The first area may contact the second area, the third area, the fourth area, and the main display area.

According to one or more embodiments, a method of manufacturing a display apparatus includes steps of: preparing a substrate including a main display area and an auxiliary display area, the auxiliary display area including a component area and a middle area, forming a silicon semiconductor layer disposed on the substrate, forming a first gate electrode disposed on the silicon semiconductor layer to overlap the silicon semiconductor layer, forming an upper electrode disposed on the first gate electrode to overlap the first gate electrode, forming an oxide semiconductor layer disposed on the upper electrode, forming a second gate electrode disposed on the oxide semiconductor layer to overlap the oxide semiconductor layer, forming, on the second gate electrode, a first electrode layer connected to the silicon semiconductor layer and a second electrode layer connected to the oxide semiconductor layer, forming a first transmissive conductive layer on a same layer as the first electrode layer and the second electrode layer, forming a contact metal layer disposed on the first transmissive conductive layer, forming a second transmissive conductive layer disposed on the contact metal layer, and forming a first auxiliary pixel electrode and a second auxiliary pixel electrode disposed on the second transmissive conductive layer, wherein the first auxiliary pixel electrode is connected to the second electrode layer through the contact metal layer, and the second auxiliary pixel electrode is connected to the first transmissive conductive layer or the second transmissive conductive layer.

The forming of the first transmissive conductive layer may be performed immediately after the forming of the first electrode layer and the second electrode layer.

The forming of the first transmissive conductive layer may include steps of: applying a first transmissive conductive material layer to directly cover the first electrode layer and the second electrode layer and patterning the first transmissive conductive material layer by an etchant.

The etchant may not etch the first electrode layer and the second electrode layer.

The first auxiliary pixel electrode may be formed on the middle area, and the second auxiliary pixel electrode may be formed on the component area.

The method may further include steps of: forming a first auxiliary pixel circuit and a second auxiliary pixel circuit disposed on the middle area, forming a first connecting line, a second connecting line, a third connecting line, and a fourth connecting line such that each of the first through fourth connecting lines is arranged throughout the middle area and the component area, wherein the first connecting line extends in a first direction, and each of the second connecting line and the third connecting line extends in a second direction crossing the first direction.

The forming of the first, second, third, and fourth connecting lines may be simultaneously performed with the forming of the first transmissive conductive layer or the forming of the second transmissive conductive layer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1A:
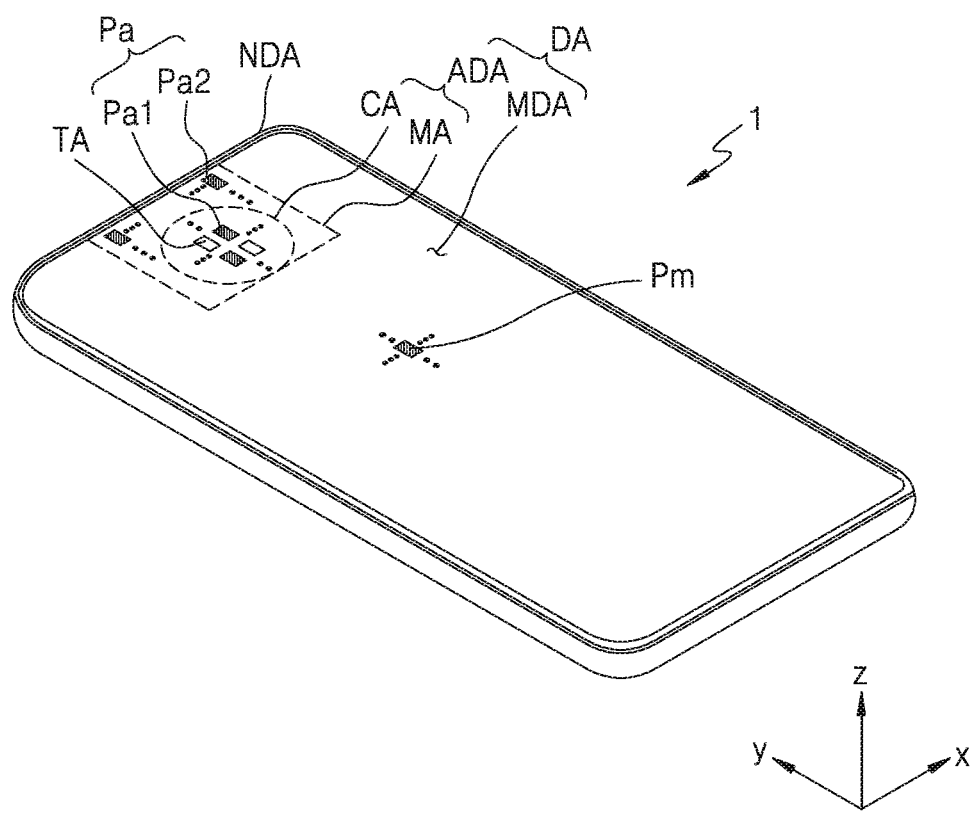
FIGS. 1A, 1B, and 1C are schematic perspective views of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

While the disclosure is capable of various modifications and alternative forms, embodiments thereof are shown by way of example in the drawings and will herein be described in detail. Effects and characteristics of the disclosure, and realizing methods thereof will become apparent by referring to the drawings and embodiments described in detail below. However, the disclosure is not limited to the embodiments disclosed hereinafter and may be realized in various forms.

Hereinafter, embodiments of the disclosure will be described in detail by referring to the accompanying drawings. In descriptions with reference to the drawings, the same reference numerals are given to components that are the same or substantially the same and descriptions will not be repeated.

It will be understood that although the terms "first," "second," etc. may be used herein to describe various components, these components should not be limited by these terms. These components are only used to distinguish one component from another.

As used herein, the singular expressions "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or element is referred to as being formed "on" another layer, area, or element, it can be directly or indirectly formed on the other layer, region, or element. That is, for example, intervening layers, regions, or elements may be present.

In the embodiments hereinafter, it will be understood that when an element, an area, or a layer is referred to as being connected to another element, area, or layer, it can be directly and/or indirectly connected to the other element, area, or layer. For example, it will be understood in this specification that when an element, an area, or a layer is referred to as being in contact with or being electrically connected to another element, area, or layer, it can be directly and/or indirectly in contact with or electrically connected to the other element, area, or layer.

In this specification, the expression "A and/or B" may indicate A, B, or A and B. Also, the expression "at least one of A and B" may indicate A, B, or A and B.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

Sizes of elements in the drawings may be exaggerated for convenience of explanation. For example, sizes and thicknesses of the elements in the drawings are randomly indicated for convenience of explanation, and thus, the disclosure is not necessarily limited to the illustrations of the drawings.

Figure 1B:
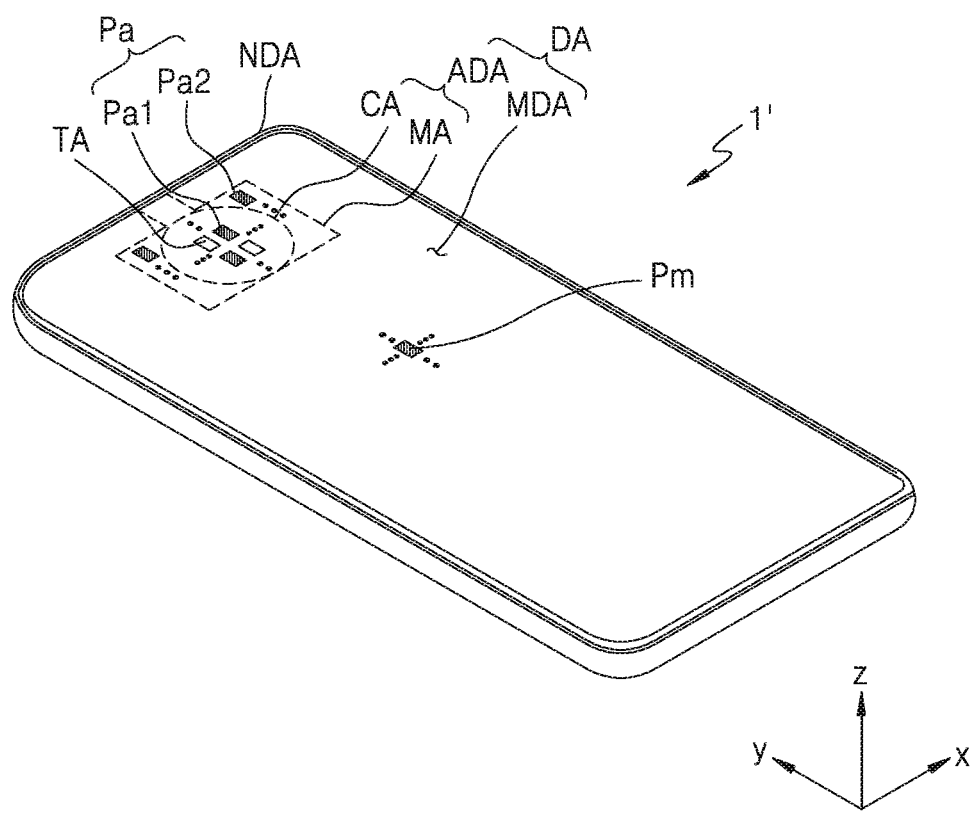
Figure 1C:
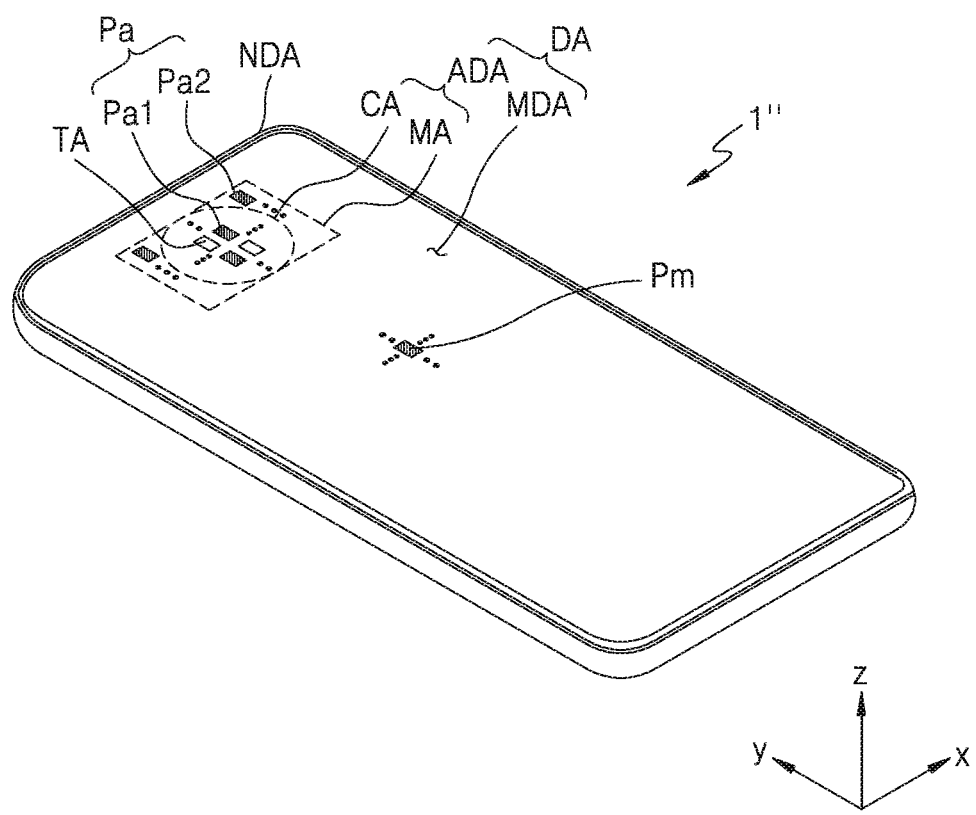

FIGS. 1A, 1B, and 1C are schematic perspective views of a display apparatus 1 according to an embodiment.

Referring to FIG. 1A, the display apparatus 1 may include a display area DA and a peripheral area NDA outside the display area DA. The display area DA may include an auxiliary display area ADA and a main display area MDA at least partially surrounding the auxiliary display area ADA. The auxiliary display area ADA may display an auxiliary image, and the main display area MDA may display a main image, so that the auxiliary display area ADA and the main display area MDA may separately or together display an image. The peripheral area NDA may be a type of non-display area, in which display elements are not arranged. The display area DA may be completely surrounded by the peripheral area NDA.

FIG. 1A illustrates that the main display area MDA surrounds at least a portion of one component area CA. According to another embodiment, the display apparatus 1 may include two or more auxiliary display areas ADA, wherein the auxiliary display areas ADA may have different shapes and sizes from each other. When the auxiliary display area ADA is seen from a direction that is approximately perpendicular to an upper surface of the display apparatus 1, the auxiliary display area ADA may have various shapes, such as a polygonal shape including a circular shape, an oval shape, a quadrangular shape, etc., a star shape, a diamond shape, etc. Also, FIG. 1A illustrates that the auxiliary display area ADA is arranged at an upper center (a +y direction) of the main display area MDA that approximately has a quadrangular shape when seen from the direction approximately perpendicular to the upper surface of the display apparatus 1. However, the auxiliary display area ADA may be arranged at a side of the main display area MDA that has the quadrangular shape, wherein the side includes, for example, an upper right side or an upper left side.

The display apparatus 1 may provide an image by using a plurality of main sub-pixels Pm arranged in the main display area MDA and a plurality of auxiliary sub-pixels, that is, first and second auxiliary sub-pixels Pa1 and Pa2, arranged in the auxiliary display area ADA. The auxiliary display area ADA may include a component area CA and a middle area MA at least partially surrounding the component area CA. Thus, the middle area MA may be located between the component area CA and the main display area MDA.

In FIGS. 1A, 1B, and 1C, the component area CA may be the same, but the middle area MA may be modified, and thus, the auxiliary display areas ADA may have various shapes. As illustrated in FIG. 1A, a side of the auxiliary display area ADA may contact the peripheral area NDA. Also, as illustrated in FIG. 1B, an extending side portion of the auxiliary display area ADA may have a reduced width compared to the auxiliary display area ADA illustrated in FIG. 1A. In addition, as illustrated in FIG. 1C, the auxiliary display area ADA may be located at an inner side of the main display area MDA. With respect to the component area CA, as described below with reference to FIG. 2, a component 40, which is an electronic element, may be arranged below a display panel to correspond to the component area CA. The component area CA may include a transmission area TA through which light output from the component 40 to the outside or proceeding from the outside toward the component 40 may be transmitted.

The component 40 may include an electronic element using light or sound. For example, the electronic element may include a sensor configured to measure a distance, such as a proximity sensor, a sensor configured to recognize a part (for example, a fingerprint, an iris, a face, etc.) of a body of a user, a small lamp configured to output light, an image sensor (for example, a camera) configured to capture an image, and the like. The electronic elements using light may use light of various wavelength ranges, such as visible rays, infrared rays, ultraviolet rays, etc. The electronic elements using sound may use ultrasonic sound waves or sound of other frequency bands. In some embodiments, the component 40 may include sub-components, such as a light emitter and a light receiver. The light emitter and the light receiver may be provided as an integrated structure or a physically separate structure, and a pair of a light emitter and a light receiver may be included in one component 40.

In the case of a display panel and a display apparatus including the display panel according to an embodiment, when light is transmitted through the component area CA, a light transmittance may be about 10% or greater, more specifically, about 40% or greater, about 25% or greater, about 50% or greater, about 85% or greater, or about 90% or greater.

The plurality of auxiliary sub-pixels, that is, the first and second auxiliary sub-pixels Pa1 and Pa2, may be arranged in the auxiliary display area ADA. The first auxiliary sub-pixel Pa1 may be located on the component area CA, and the second auxiliary sub-pixel Pa2 may be located on the middle area MA.

The first and second auxiliary sub-pixels Pa1 and Pa2 may emit light to provide a certain image. The image displayed in the auxiliary display area ADA may correspond to an auxiliary image, which may have a lower resolution than an image displayed in the main display area MDA.

That is, the component area CA in the auxiliary display area ADA may include the transmission area TA through which light and sound may be transmitted, and thus, when a sub-pixel is not arranged on the transmission area TA, the number of first auxiliary sub-pixels Pa1 to be arranged per unit area of the component area CA may be less than the number of main sub-pixels Pm to be arranged per unit area of the main display area MDA.

Also, while the middle area MA in the auxiliary display area ADA may not include the transmission area TA, one or more pixel circuits (for example, a first auxiliary pixel circuit PCa1 of FIG. 2) may be arranged on the middle area MA to drive the first auxiliary sub-pixel Pa1 on the component area CA. Thus, the number of second auxiliary sub-pixels Pa2 to be arranged per unit area of the middle area MA may be less than the number of main sub-pixels Pm to be arranged per unit area of the main display area MDA.

Hereinafter, an organic light-emitting display apparatus is described as an example of the display apparatus 1 according to an embodiment. However, the display apparatus according to an embodiment is not limited thereto. According to another example, the display apparatus 1 according to an embodiment may include an inorganic light-emitting display apparatus, an inorganic electroluminescent (EL) display apparatus, or a quantum dot light-emitting display apparatus. For example, an emission layer of a display element included in the display apparatus 1 may include an organic material, an inorganic material, a quantum dot, an organic material and a quantum dot, or an inorganic material and a quantum dot.

Figure 2:
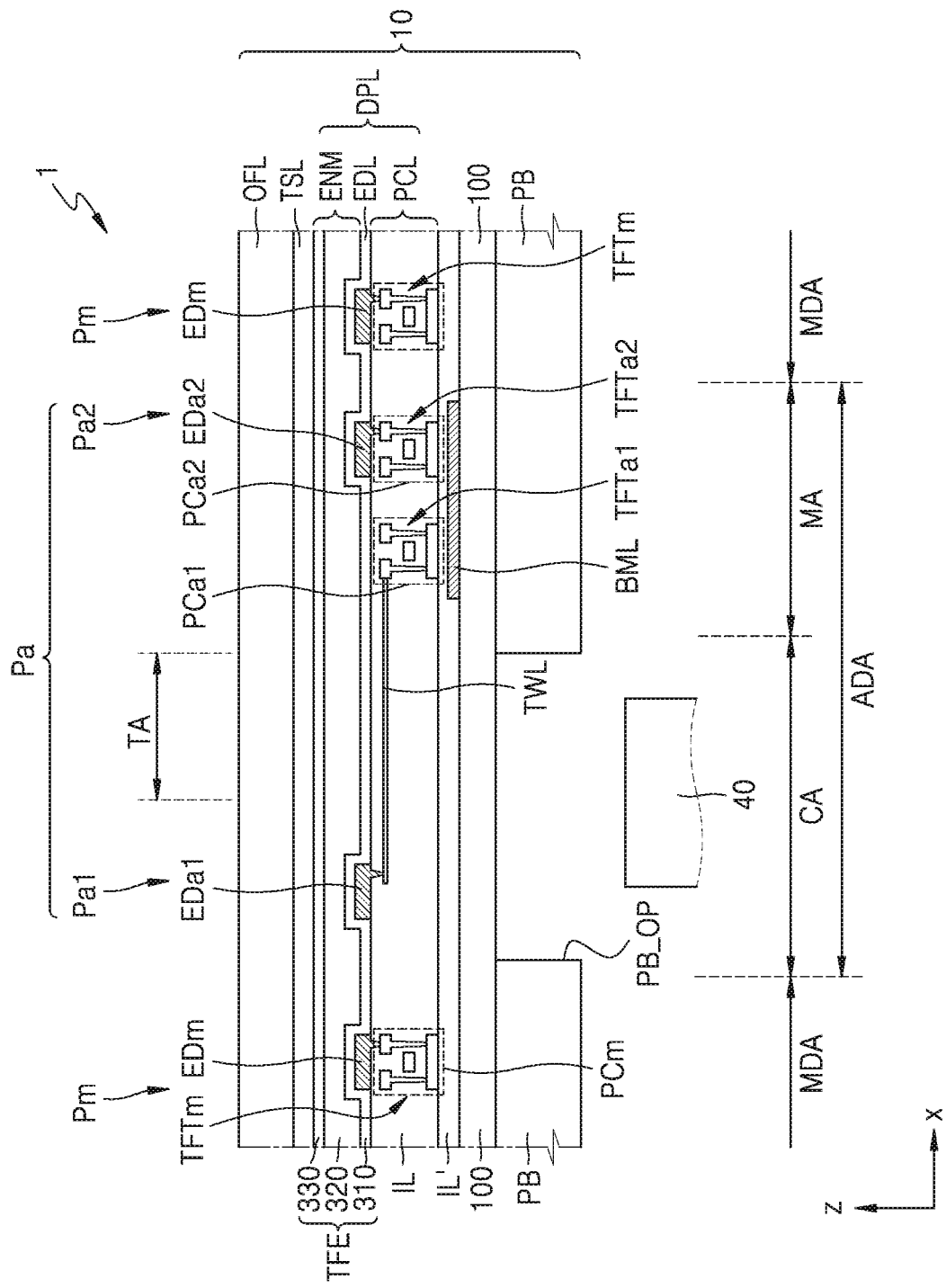
FIGS. 2 and 3 are schematic cross-sectional views of a portion of a display apparatus according to embodiments.
Figure 3:
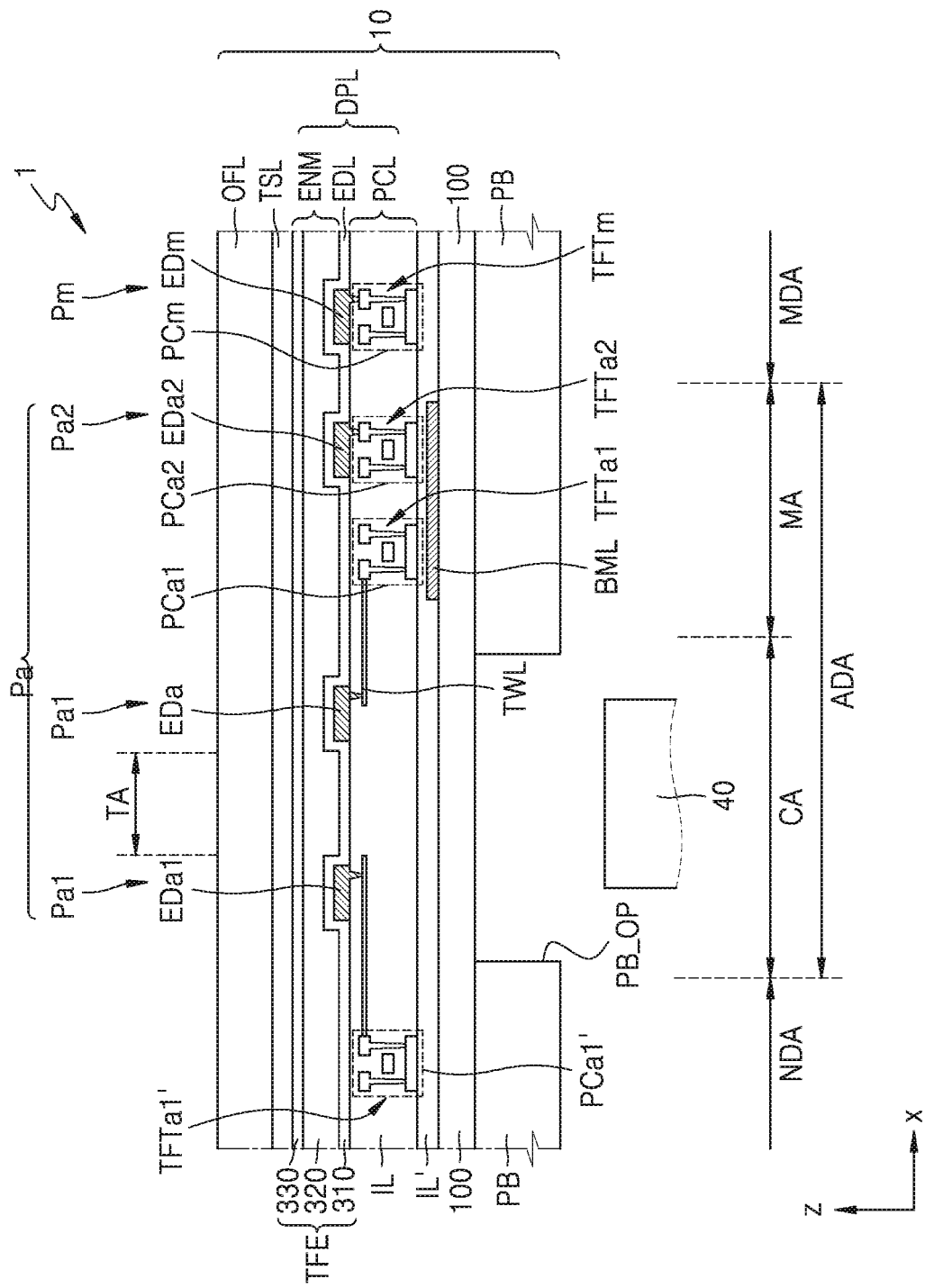

FIGS. 2 and 3 are schematic cross-sectional views of a portion of the display apparatus 1 according to embodiments.

Referring to FIG. 2, the display apparatus 1 may include a display panel 10 and the component 40 arranged to overlap the display panel 10. A cover window (not shown) protecting the display panel 10 may further be arranged above the display panel 10.

The display panel 10 may include the auxiliary display area ADA on which an auxiliary image is displayed and the main display area MDA on which a main image is displayed. The auxiliary display area ADA may include the component area CA which is an area overlapping the component 40 and the middle area MA surrounding the component area CA.

The display panel 10 may include a substrate 100, a display layer DPL disposed on the substrate 100, a touch screen layer TSL disposed on the display layer DPL, an optical functional layer OFL disposed on the touch screen layer TSL, and a panel protection member PB disposed below the substrate 100.

The display layer DPL may include a circuit layer PCL including thin-film transistors, that is, a main thin-film transistor TFTm, a first auxiliary thin-film transistor TFTa1, and a second auxiliary thin-film transistor TFTa2, a display element layer EDL including display elements, that is, a main display element EDm, a first auxiliary display element EDa1, and a second auxiliary display element EDa2, which are emitting devices, and an encapsulation member ENM, such as a thin-film encapsulation layer TFE or an encapsulation substrate (not shown). Insulating layers IL and IL' may be arranged in the display layer DPL disposed between the substrate 100 and the display layer DPL. For example, the display elements, that is, the main display element EDm, the first auxiliary display element EDa1, and the second auxiliary display element EDa2, may be organic light-emitting diodes OLED.

The substrate 100 may include an insulating material, such as glass, quartz, and polymer resins. The substrate 100 may include a rigid substrate or a flexible substrate, which may be bent, folded, or rolled.

A main display element EDM and a main pixel circuit PCm connected thereto may be arranged on the main display area MDA of the display panel 10. The main pixel circuit PCm may include at least one main thin-film transistor TFTm and may be configured to control an operation of the main display element EDm. The main sub-pixel Pm may be realized via emission of the main display element EDm.

The first auxiliary display element EDa1 may be arranged on the component area CA of the display panel 10 to realize the first auxiliary sub-pixel Pa1. According to the present embodiment, the first auxiliary pixel circuit PCa1 may be arranged not to overlap the first auxiliary display element EDa1. That is, the first auxiliary pixel circuit PCa1 configured to drive the first auxiliary display element EDa1 may not be arranged on the component area CA and may be arranged on the middle area MA disposed between the main display element MDA and the component area CA. Alternatively, according to another embodiment, as illustrated in FIG. 3, the first auxiliary pixel circuit PCa1 configured to drive the first auxiliary display element EDa1 may be arranged on the middle area MA and may be arranged at the same time on the peripheral area NDA, which is a non-display area. FIG. 3 may correspond to a structure of FIG. 17 to be described below.

The first auxiliary pixel circuit PCa1 may include at least one first auxiliary thin-film transistor TFTa1 and may be electrically connected to the first auxiliary light-emitting device EDa through a connecting line TWL. The connecting line TWL may include a transparent conductive material. The first auxiliary pixel circuit PCa1 may be configured to control an operation of the first auxiliary display element EDa1. The first auxiliary sub-pixel Pa1 may be realized via emission of the first auxiliary display element EDa1.

An area of the component area CA, on which the first auxiliary display element EDa1 is not arranged, may be defined as the transmission area TA. The transmission area TA may be an area through which light/a signal emitted from or incident into the component 40 may pass through, the component 40 being arranged to correspond to the component area CA.

The connecting line TWL connecting the first auxiliary pixel circuit PCa1 with the first auxiliary display element EDa1 may be arranged on the transmission area TA. The connecting line TWL may include a transparent conductive material having a high transmittance, and thus, even when the connecting line TWL is arranged on the transmission area TA, the transmittance of the transmission area TA may be secured. According to the present embodiment, the auxiliary pixel circuit PCa may not be arranged on the component area CA, and thus, it may be easy to increase an area of the transmission area TA, and a light transmittance may further be improved.

The second auxiliary display element EDa2 and the second auxiliary pixel circuit PCa2 connected thereto may be arranged on the middle area MA of the display panel 10 to realize the second auxiliary sub-pixel Pa2. The first auxiliary pixel circuit PCa1 and the second auxiliary pixel circuit PCa2 arranged on the middle area MA may be adjacent to each other and may be alternately arranged.

The display element layer EDL may be covered by the thin-film encapsulation layer TFE as illustrated in FIG. 2 or may be covered by an encapsulation substrate. In an embodiment, the thin-film encapsulation layer TFE may include at least one inorganic encapsulation layer and at least one organic encapsulation layer as illustrated in FIG. 2. For example, the thin-film encapsulation layer TFE may include a first inorganic encapsulation layer 310, a second inorganic encapsulation layer 330, and an organic encapsulation layer 320 therebetween.

The first and second inorganic encapsulation layers 310 and 330 may include at least one inorganic insulating material, such as, $SiO_2$, $SiN_x$, $SiO_xN_y$, $Al_2O_3$, $TiO_2$, $Ta_2O_5$, $HfO_2$, and $ZnO_2$, and may be formed by using chemical vapor deposition (CVD). The organic encapsulation layer 320 may include a polymer-based material. The polymer-based material may include silicon-based resins, acryl-based resins (for example, polymethylmethacrylate, polyacrylic acid, etc.), epoxy-based resins, polyimide, polyethylene, etc.

The first inorganic encapsulation layer 310, the organic encapsulation layer 320, and the second inorganic encapsulation layer 330 may be integrally formed to cover the main display area MDA and the auxiliary display area ADA.

A touch screen layer TSL may obtain coordinate information based on an external input, for example, a touch event. The touch screen layer TSL may include a touch electrode and touch lines connected to the touch electrode. The touch screen layer TSL may sense an external input based on a magnetic capacitance method or a mutual capacitance method.

The touch screen layer TSL may be formed on the thin-film encapsulation layer TFE. Alternatively, the touch screen layer TSL may be separately formed on a touch substrate and then may be coupled onto the thin-film encapsulation layer TFE through an adhesive layer, such as an optical clear adhesive (OCA). According to an embodiment, the touch screen layer TSL may be formed directly above the thin-film encapsulation layer TFE, and in this case, the adhesive layer may not be arranged between the touch screen layer TSL and the thin-film encapsulation layer TFE.

An optical functional layer OFL may include a reflection prevention layer. The reflection prevention layer may reduce reflectivity of light (external light) incident toward the display apparatus 1 from the outside. In an embodiment, the optical functional layer OFL may include a polarization film. In another embodiment, the optical functional layer OFL may include an opening (not shown) corresponding to the transmission area TA. Thus, the light transmittance of the transmission area TA may be significantly improved. The opening may be filled with a transparent material, such as an optically clear resin (OCR), etc. In another embodiment, the optical functional layer OFL may include a filter plate including a black matrix and color filters.

The panel protection member PB may be coupled under the substrate 100 to support and protect the substrate 100. The panel protection member PB may include an opening PB_OP corresponding to the component area CA. When the panel protection member PB includes the opening PB_OP, the light transmittance of the component area CA may be improved. The panel protection member PB may include polyethylene terephthalate or polyimide.

An area of the component area CA may be greater than an area of the component 40. Accordingly, an area of the opening PB_OP provided in the panel protection member PB may not correspond to the area of the component area CA. FIG. 2 illustrates that the component 40 is arranged to be apart from a side of the display panel 10. However, at least a portion of the component 40 may be inserted into the opening PB_OP provided in the panel protection member PB.

Also, the component 40 may be provided in a multiple number on the component area CA. The plurality of components 40 may have different functions from one another. For example, the components 40 may include at least two of a camera (an imaging device), a solar battery, a flash device, a proximity sensor, an illuminance sensor, and an iris sensor.

As illustrated in FIG. 2, a bottom metal layer BML may be arranged below the first and second auxiliary pixel circuits PCa1 and PCa2 on the middle area MA. The bottom metal layer BML may be arranged to overlap the pixel circuits to protect the pixel circuits. In an embodiment, the bottom metal layer BML may be arranged between the substrate 100 and the first and second auxiliary pixel circuits PCa1 and PCa2 corresponding to the middle area MA, to overlap the first and second auxiliary pixel circuits PCa1 and PCa2. The bottom metal layer BML may prevent external light from reaching the first and second auxiliary pixel circuits PCa1 and PCa2. In another embodiment, the bottom metal layer BML may be formed to correspond to the entire display area DA and may include a bottom hole corresponding to the component area CA. In another embodiment, the bottom metal layer BML may be omitted.

Figure 4:
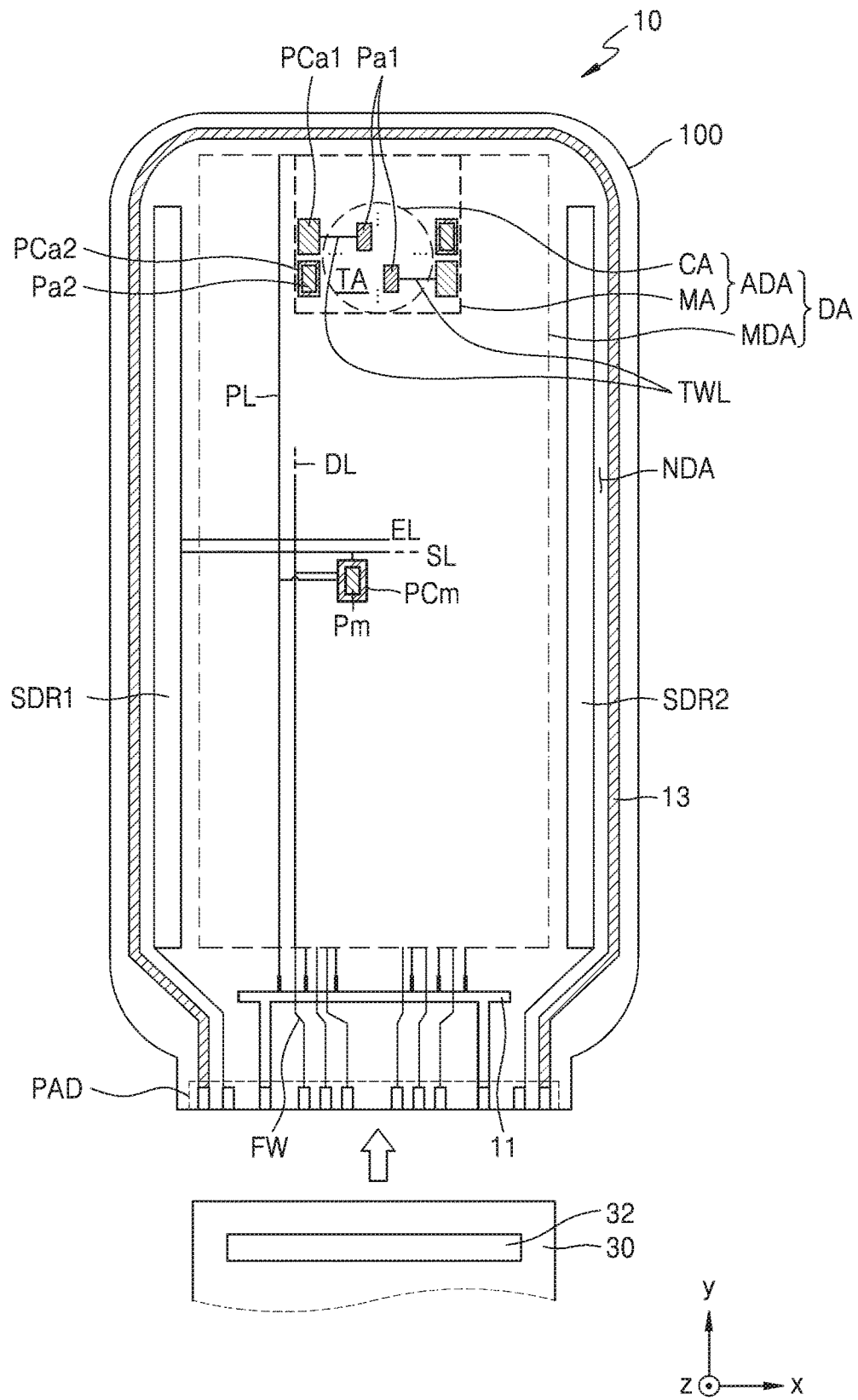
FIG. 4 is a schematic plan view of a display panel, which may be included in the display apparatus of FIG. 1.

FIG. 4 is a schematic plan view of the display panel 10, which may be included in the display apparatus 1 of FIG. 1.

Referring to FIG. 4, various components included in the display panel 10 may be arranged on the substrate 100.

The plurality of main sub-pixels Pm may be arranged on the main display area MDA. Each of the main sub-pixels Pm may be realized as a light-emitting device via a display element such as an organic light-emitting diode OLED. The main pixel circuit PCm configured to drive the main sub-pixel Pm may be arranged on the main display area MDA, and the main pixel circuit PCm may be arranged to overlap the main sub-pixel Pm. Each main sub-pixel Pm may emit, for example, red, green, blue, or white light. The main display area MDA may be covered by an encapsulation member and may be protected from external air, moisture, etc.

The auxiliary display area ADA may be located at a side of the main display area MDA as described above, or may be arranged in the display area DA to be surrounded by the main display area MDA. The plurality of auxiliary sub-pixels Pa1 and Pa2 may be arranged in the auxiliary display area ADA. Each of the plurality of auxiliary sub-pixels Pa1 and Pa2 may be realized as a light-emitting device via a display element such as an organic light-emitting diode OLED. Each auxiliary sub-pixel may emit, for example, red, green, blue, or white light. The auxiliary display area ADA may be covered by an encapsulation member and may be protected from external air, moisture, etc.

The auxiliary display area ADA may include the component area CA and the middle area MA at least partially surrounding the component area CA. The first auxiliary sub-pixel Pa1 may be realized on the component area CA, and the second auxiliary sub-pixel Pa2 may be realized on the middle area MA. This may denote that the first auxiliary sub-pixel Pa1 may substantially emit light on the component area CA, and the second auxiliary sub-pixel Pa2 may substantially emit light on the middle area MA.

Both of the first auxiliary pixel circuit PCa1 configured to drive the first auxiliary sub-pixel Pa1 and the second auxiliary pixel circuit PCa2 configured to drive the second auxiliary sub-pixel Pa2 may be arranged on the middle area MA. In this case, the first auxiliary display element EDa1 realizing the first auxiliary sub-pixel Pa1 may be arranged on the component area CA, and the first auxiliary pixel circuit PCa may be arranged on the middle area MA, and thus, the first auxiliary display element EDa1 and the first auxiliary pixel circuit PCa may be connected by the connecting line TWL.

The component area CA may have the transmission area TA. The transmission area TA may be defined as an area on which the first auxiliary sub-pixel Pa1 may not be arranged.

Because the component area CA has the transmission area TA, a resolution of the component area CA may be lower than a resolution of the main display area MDA. For example, the resolution of the component area CA may be about ½, ⅜, ⅓, ¼, ⅖, ⅛, ⅑, 1/16, etc. of the resolution of the main display area MDA. For example, the resolution of the main display area MDA may be about 400 ppi or higher, and the resolution of the component area CA may be about 200 ppi or about 100 ppi.

Each of the pixel circuits PCm, PCa1, and PCa2 configured to drive the sub-pixels Pm, Pa1, Pa2 on the display area DA may be electrically connected to external circuits arranged on the peripheral area NDA. A first scan driving circuit SDR1, a second scan driving circuit SDR2, a terminal portion PAD, a driving voltage supply line 11, and a common voltage supply line 13 may be arranged on the peripheral area NDA.

The first scan driving circuit SDR1 may be configured to apply, through a scan line SL, a scan signal to the main pixel circuit PCm configured to drive the main sub-pixel Pm. In addition, the first scan driving circuit SDR1 may be configured to apply, through an emission control line EL, an emission control signal to each pixel circuit. The second scan driving circuit SDR2 may be symmetrically arranged with the first scan driving circuit SDR1 based on the main display area MDA. One or more of the main pixel circuits PCm of the main sub-pixel Pm of the main display area MDA may be electrically connected to the first scan driving circuit SDR1, and the others may be electrically connected to the second scan driving circuit SDR2.

The terminal portion PAD may be arranged at a side of the substrate 100. The terminal portion PAD may not be covered by an insulating layer and may be exposed so as to be connected to a display circuit board 30. A display driver 32 may be arranged on the display circuit board 30.

The display driver 32 may generate a control signal to be transmitted to the first scan driving circuit SDR1 and the second scan driving circuit SDR2. The display driver 32 may generate a data signal, and the generated data signal may be transmitted to the main pixel circuit PCm through a fan-out wire FW and a data line DL connected to the fan-out wire FW.

The display driver 32 may supply a driving voltage ELVDD to the driving voltage supply line 11 and supply a common voltage ELVSS to the common voltage supply line 13. The driving voltage ELVDD may be applied to the pixel circuits of the main and auxiliary sub-pixels Pm and Pa1 and Pa2 through a driving voltage line PL connected to the driving voltage supply line 11, and the common voltage ELVSS may be connected to the common voltage supply line 13 and may be applied to an opposite electrode of the display element.

The driving voltage supply line 11 may extend in an x direction under the main display area MDA. The common voltage supply line 13 may have a loop shape having an open side and may partially surround the main display area MDA.

Figure 5:
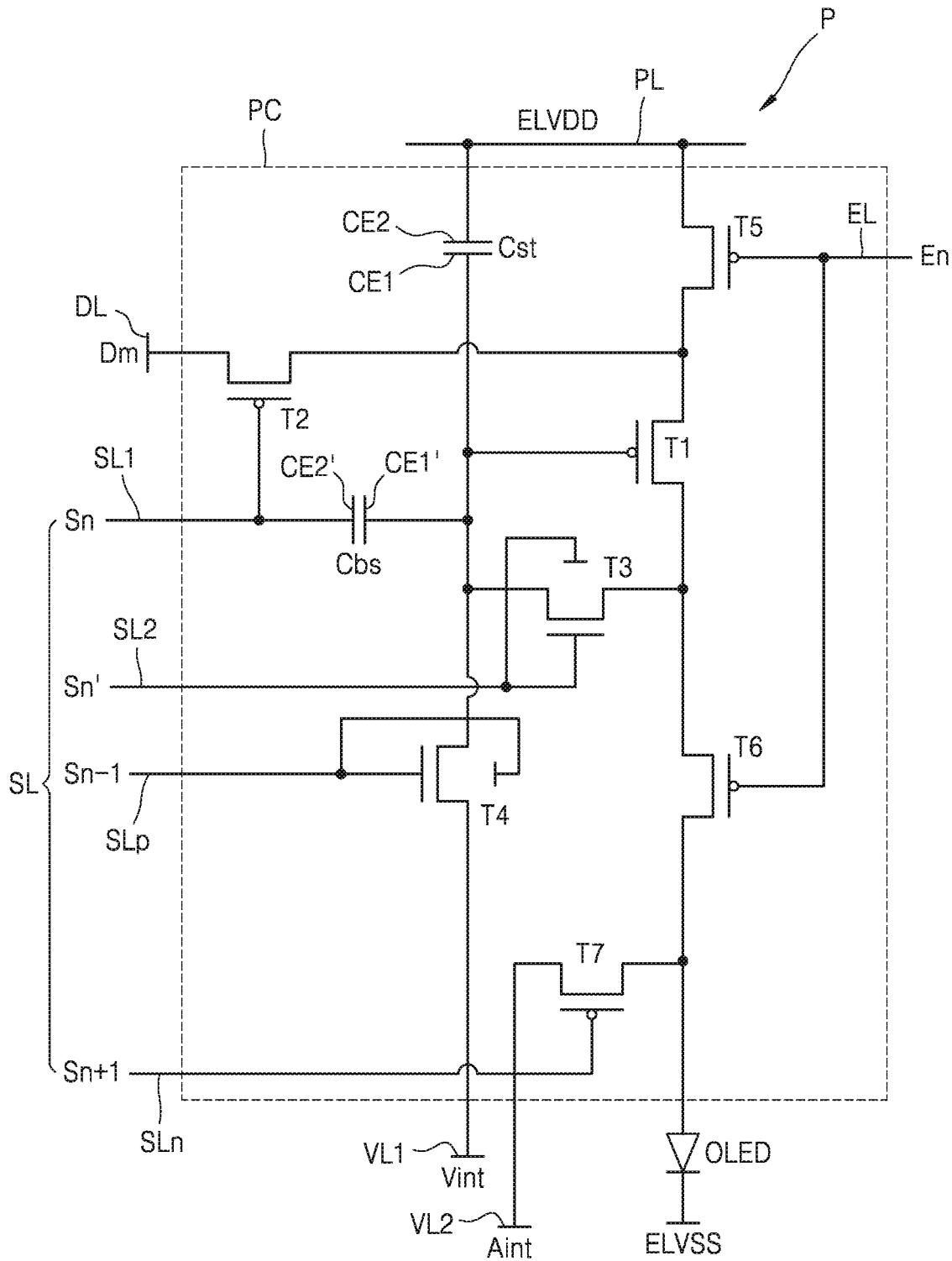
FIG. 5 is a schematic equivalent circuit diagram of an organic light-emitting diode of a display apparatus and a pixel circuit connected to the organic light-emitting diode, according to an embodiment.

FIG. 5 is a schematic equivalent circuit diagram of an organic light-emitting diode OLED of a display apparatus and a pixel circuit PC connected to the organic light-emitting diode OLED, according to an embodiment.

The pixel circuit PC illustrated in FIG. 5 may correspond to at least one of the main pixel circuit PCm, the first auxiliary pixel circuit PCa1, and the second auxiliary pixel circuit PCa2 described above with reference to FIG. 4.

For example, the pixel circuit PC may include a plurality of thin-film transistors T1, T2, T3, T4, T5, T6, and T7 and a storage capacitor Cst. The plurality of thin-film transistors T1, T2, T3, T4, T5, T6, and T7 and the storage capacitor Cst may be connected to signal lines SL1, SL2, SLp, SLn, EL, and DL, a first initialization voltage line VL1, a second initialization voltage line VL2 (or an anode initialization voltage line), and a driving voltage line PL. In an embodiment, at least one of the lines described above, for example, the driving voltage line PL, may be shared by adjacent pixels P.

The plurality of thin-film transistors T1, T2, T3, T4, T5, T6, and T7 may include a driving thin-film transistor T1, a switching thin-film transistor T2, a compensation thin-film transistor T3, a first initialization thin-film transistor T4, an operation control thin-film transistor T5, an emission control thin-film transistor T6, and a second initialization thin-film transistor T7.

The organic light-emitting diode OLED may include a first electrode (for example, an anode electrode) and a second electrode (for example, a cathode electrode). A first terminal of the organic light-emitting diode OLED may be connected to the driving thin-film transistor T1 through the emission control thin-film transistor T6 so as to receive a driving current, and a second terminal may receive a lower power voltage ELVSS. The organic light-emitting diode OLED may generate light having a brightness according to the driving current.

One or more of the plurality of thin-film transistors T1, T2, T3, T4, T5, T6, and T7 may be provided as n-channel metal-oxide semiconductor field-effect transistors MOSFET (NMOS), and the others may be provided as p-channel MOSFET (PMOS). For example, the compensation thin-film transistor T3 and the first initialization thin-film transistor T4 from among the plurality of thin-film transistors T1 through T7 may be provided as NMOS transistors, and the others may be provided as PMOS transistors.

In another embodiment, the compensation thin-film transistor T3, the first initialization thin-film transistor T4, and the second initialization thin-film transistor T7 from among the plurality of thin-film transistors T1, T2, T3, T4, T5, T6, and T7 may be provided as NMOS transistors, and the others may be provided as PMOS transistors. Alternatively, only one of the plurality of thin-film transistors T1, T2, T3, T4, T5, T6, and T7 may be provided as an NMOS transistor, and the others may be provided as PMOS transistors. Alternatively, all of the plurality of thin-film transistors T1, T2, T3, T4, T5, T6, and T7 may be provided as NMOS transistors.

The signal lines may include a first scan line SL1 transmitting a first scan signal Sn, a second scan line SL2 transmitting a second scan signal Sn', a previous scan line SLp transmitting a previous scan signal Sn-1 to a first initialization thin-film transistor T4, an emission control line EL transmitting an emission control signal En to the operation control thin-film transistor T5 and the emission control thin-film transistor T6, a next scan line SLn transmitting a next scan signal Sn+1 to the second initialization thin-film transistor T7, and a data line DL crossing the first scan line SL1 and transmitting a data signal Dm.

The driving voltage line PL may transmit a driving voltage ELVDD to the driving thin film transistor T1, and a first initialization voltage line VL1 may transmit an initialization voltage Vint for initializing the driving thin film transistor T1 and a pixel electrode.

A driving gate electrode of the driving thin-film transistor T1 may be connected to the storage capacitor Cst, a driving source area of the driving thin-film transistor T1 may be connected to the driving voltage line PL through the operation control thin-film transistor T5, and a driving drain area of the driving thin-film transistor T1 may be electrically connected to the pixel electrode of the organic light-emitting diode OLED through the emission control thin-film transistor T6. The driving thin-film transistor T1 may be configured to receive the data signal Dm according to a switching operation of the switching thin-film transistor T2 and supply a driving current IDLED to the organic light-emitting diode OLED.

A switching gate electrode of the switching thin-film transistor T2 may be connected to the first scan line SL1 transmitting the first scan signal Sn, a switching source area of the switching thin-film transistor T2 may be connected to the data line DL, and a switching drain area of the switching thin-film transistor T2 may be connected to the diving source area of the driving thin-film transistor T1 and may be connected to the driving voltage line PL through the operation control thin-film transistor T5. The switching thin-film transistor T2 may be turned on in response to a first scan signal Sn transmitted through the first scan line SL and may be configured to perform a switching operation of transmitting a data signal Dm transmitted through the data line DL to the driving source area of the driving thin-film transistor T1.

A compensation gate electrode of the compensation thin-film transistor T3 may be connected to the second scan line SL2. A compensation drain area of the compensation thin-film transistor T3 may be connected to the driving drain area of the driving thin-film transistor T1 and may be connected to the pixel electrode of the organic light-emitting diode OLED through the emission control thin-film transistor T6. A compensation source area of the compensation thin-film transistor T3 may be connected to a lower electrode CE1 of the storage capacitor Cst and the driving gate electrode of the driving thin-film transistor T1. In addition, the compensation source area may be connected to a first initialization drain area of the first initialization thin-film transistor T4.

The compensation thin-film transistor T3 may be turned on in response to a second scan signal Sn' received through the second scan line SL2 and may be configured to electrically connect the driving gate electrode and the driving drain area of the driving thin-film transistor T1 to diode-connect the driving thin-film transistor T1.

A first initialization gate electrode of the first initialization thin-film transistor T4 may be connected to the previous scan line SLp. A first initialization source area of the first initialization thin-film transistor T4 may be connected to a second initialization source area of the second initialization thin-film transistor T7 and the first initialization voltage line VL1. The first initialization drain area of the first initialization thin-film transistor T4 may be connected to the lower electrode CE1 of the storage capacitor Cst, the compensation source area of the compensation thin-film transistor T3, and the driving gate electrode of the driving thin-film transistor T1. The first initialization thin-film transistor T4 may be turned on in response to a previous scan signal Sn-1 received through the previous scan line SLp and may be configured to perform an initialization operation of initializing a voltage of the driving gate electrode of the driving thin-film transistor T1 by transmitting an initialization voltage Vint to the driving gate electrode of the driving thin-film transistor T1.

An operation control gate electrode of the operation control thin-film transistor T5 may be connected to the emission control line EL, an operation control source area of the operation control thin-film transistor T5 may be connected to the driving voltage line PL, and an operation control drain area of the operation control thin-film transistor T5 may be connected to the driving source area of the driving thin-film transistor T1 and the switching drain area of the switching thin-film transistor T2.

An emission control gate electrode of the emission control thin-film transistor T6 may be connected to the emission control line EL, an emission control source area of the emission control thin-film transistor T6 may be connected to the driving drain area of the driving thin-film transistor T1 and the compensation drain area of the compensation thin-film transistor T3, and an emission control drain area of the emission control thin-film transistor T6 may be electrically connected to a second initialization drain area of the second initialization thin-film transistor T7 and the pixel electrode of the organic light-emitting diode OLED.

The operation control thin-film transistor T5 and the emission control thin-film transistor T6 may be simultaneously turned on in response to an emission control signal En received through the emission control line EL so that a driving voltage ELVDD may be transmitted to the organic light-emitting diode OLED and a driving current IDLED may flow in the organic light-emitting diode OLED.

A second initialization gate electrode of the second initialization thin-film transistor T7 may be connected to the next scan line SLn, the second initialization drain area of the second initialization thin-film transistor T7 may be connected to the emission control drain area of the emission control thin-film transistor T6 and the pixel electrode of the organic light-emitting diode OLED, and the second initialization source area of the second initialization thin-film transistor T7 may be connected to the second initialization voltage line VL2 and may receive an anode initialization voltage Aint. The second initialization thin-film transistor T7 may be turned on in response to a next scan signal Sn+1 received through the next scan line SLn and may initialize the pixel electrode of the organic light-emitting diode OLED.

The second initialization thin-film transistor T7 may be connected to the next scan line SLn as illustrated in FIG. 2. In an another embodiment, the second initialization thin-film transistor T7 may be connected to the emission control line EL and may be driven in response to an emission control signal En. The source areas and the drain areas may change locations thereof with each other according to a transistor type (p-type or n-type).

The storage capacitor Cst may include the lower electrode CE1 and the upper electrode CE2. The lower electrode CE1 of the storage capacitor Cst may be connected to the driving gate electrode of the driving thin-film transistor T1, and the upper electrode CE2 of the storage capacitor Cst may be connected to the driving voltage line PL. The storage capacitor Cst may store a charge corresponding to a difference between a driving gate electrode voltage of the driving thin-film transistor T1 and the driving voltage ELVDD.

A boosting capacitor Cbs may include a lower electrode CE1' and an upper electrode CE2'. The lower electrode CE1' of the boosting capacitor Cbs may be connected to the lower electrode CE1 of the storage capacitor Cst, and the upper electrode CE2' of the boosting capacitor Cbs may receive a first scan signal Sn'. The boosting capacitor Cbs may increase a voltage of a gate terminal of the driving thin-film transistor T1 at a point at which provision of the first scan signal Sn' is stopped, thus compensating for a voltage drop of the gate terminal.

A detailed operation of each pixel P according to an embodiment is described below.

During an initialization period, when a previous scan signal Sn-1 is supplied through the previous scan line SLp, the first initialization thin-film transistor T4 may be turned on in response to the previous scan signal Sn-1, and the driving thin-film transistor T1 may be initialized via an initialization voltage Vint supplied from the first initialization voltage line VL1.

During a data programming period, when a first scan signal Sn and a second scan signal Sn' are supplied through the first scan line SL1 and the second scan line SL2, the switching thin-film transistor T2 and the compensation thin-film transistor T3 may be turned on in response to the first scan signal Sn and the second scan signal Sn'. Here, the driving thin-film transistor T1 may be diode-connected and biased in a forward direction via the compensation thin-film transistor T3 that is turned on.

Then, a compensation voltage Dm+Vth (Vth is a negative (−) value) obtained by subtracting a threshold voltage Vth of the driving thin-film transistor T1 from the data signal Dm supplied from the data line DL may be applied to the driving gate electrode of the driving thin-film transistor T1.

The driving voltage ELVDD and the compensation voltage Dm+Vth may be applied to both ends of the storage capacitor Cst, and a charge corresponding to a voltage difference between both ends may be stored in the storage capacitor Cst.

During an emission period, the operation control thin-film transistor T5 and the emission control thin-film transistor T6 may be turned on in response to an emission control signal En supplied from the emission control line EL. A driving current IDLED corresponding to a difference between a value of a voltage of the driving gate electrode of the driving thin-film transistor T1 and a value of the driving voltage ELVDD may be generated, and the driving current IDLED may be supplied to the organic light-emitting diode OLED through the emission control thin-film transistor T6.

According to the present embodiment, at least one of the plurality of thin-film transistors T1, T2, T3, T4, T5, T6, and T7 may include a semiconductor layer including oxide, and the others may include semiconductor layers including silicon.

In detail, the driving thin-film transistor T1, which may directly affect the brightness of a display apparatus, may be provided to include a semiconductor layer including polycrystalline silicon having a high reliability, and thus, the display apparatus having a high resolution may be realized.

An oxide semiconductor may have a high carrier mobility and a low leakage current, and thus, even when a driving time is increased, a voltage drop may not be significant. That is, even during low frequency driving, a color change of an image due to a voltage drop may not be significant. Accordingly, low frequency driving may be possible.

As described above, the oxide semiconductor may have the benefit of a less leakage current, and thus, at least one of the compensation thin-film transistor T3, the first initialization thin-film transistor T4, and the second initialization thin-film transistor T7, connected to the driving gate electrode of the driving thin-film transistor T1, may be implemented as the oxide semiconductor, in order to prevent a flow of the leakage current to the driving gate electrode and at the same time to reduce the power consumption.

Figure 6:
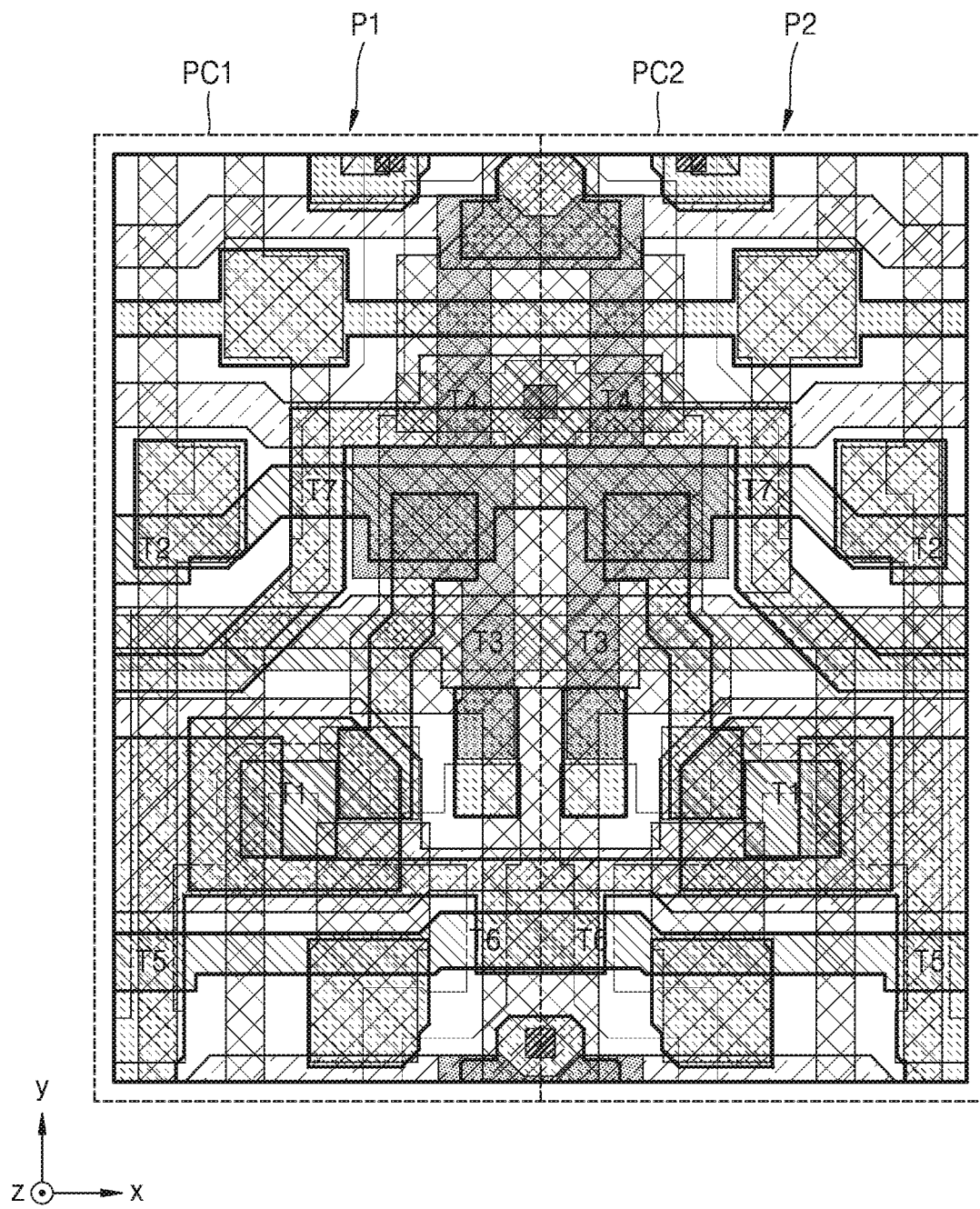
FIG. 6 is a schematic plan view of a structure of a pixel circuit, according to an embodiment.
Figure 7A:
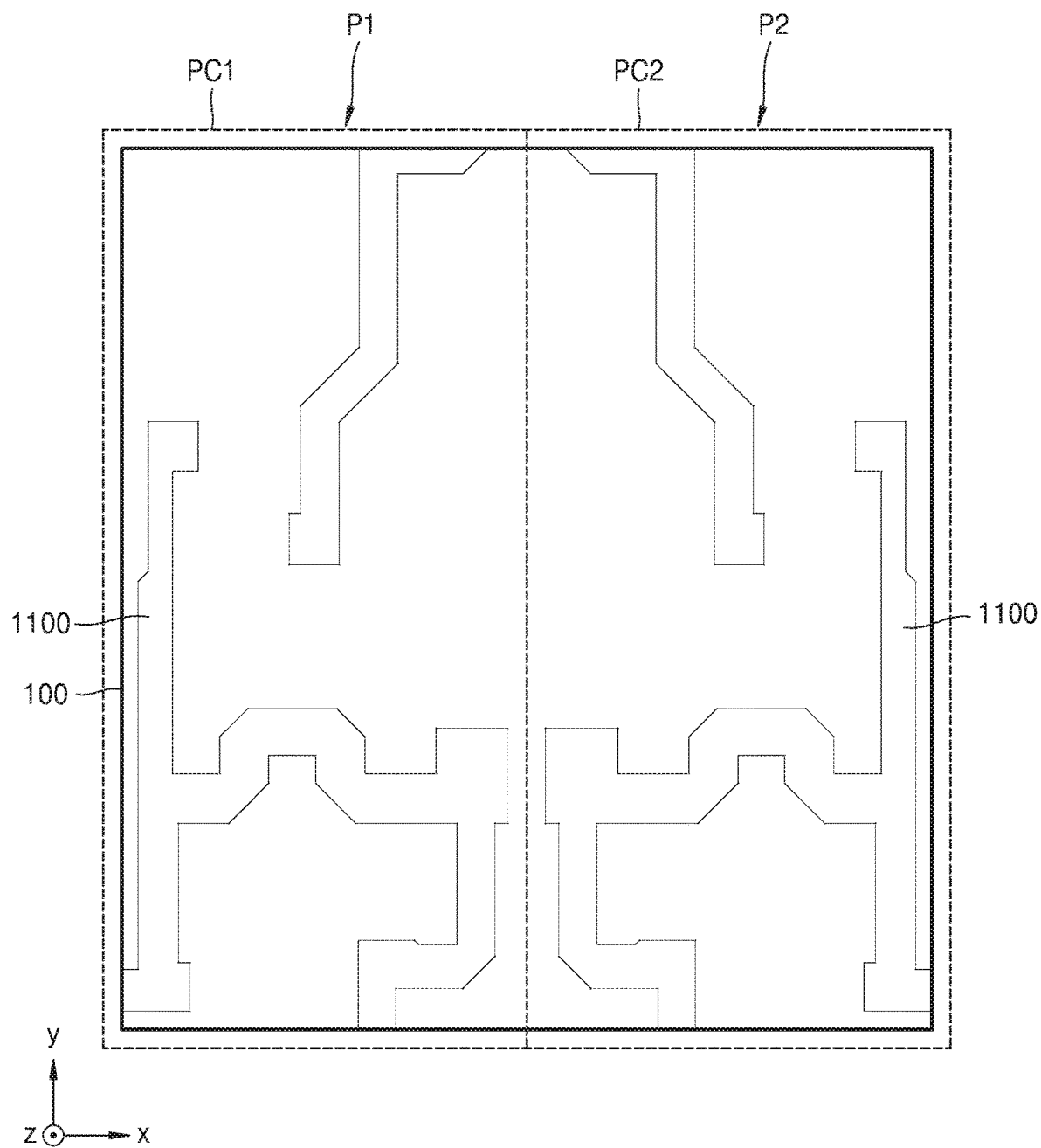
FIGS. 7A, 7B, 7C, 7D, 7E, 7F, and 7G are plan views of layers of conductive patterns included in the pixel circuit of FIG. 6.
Figure 7B:
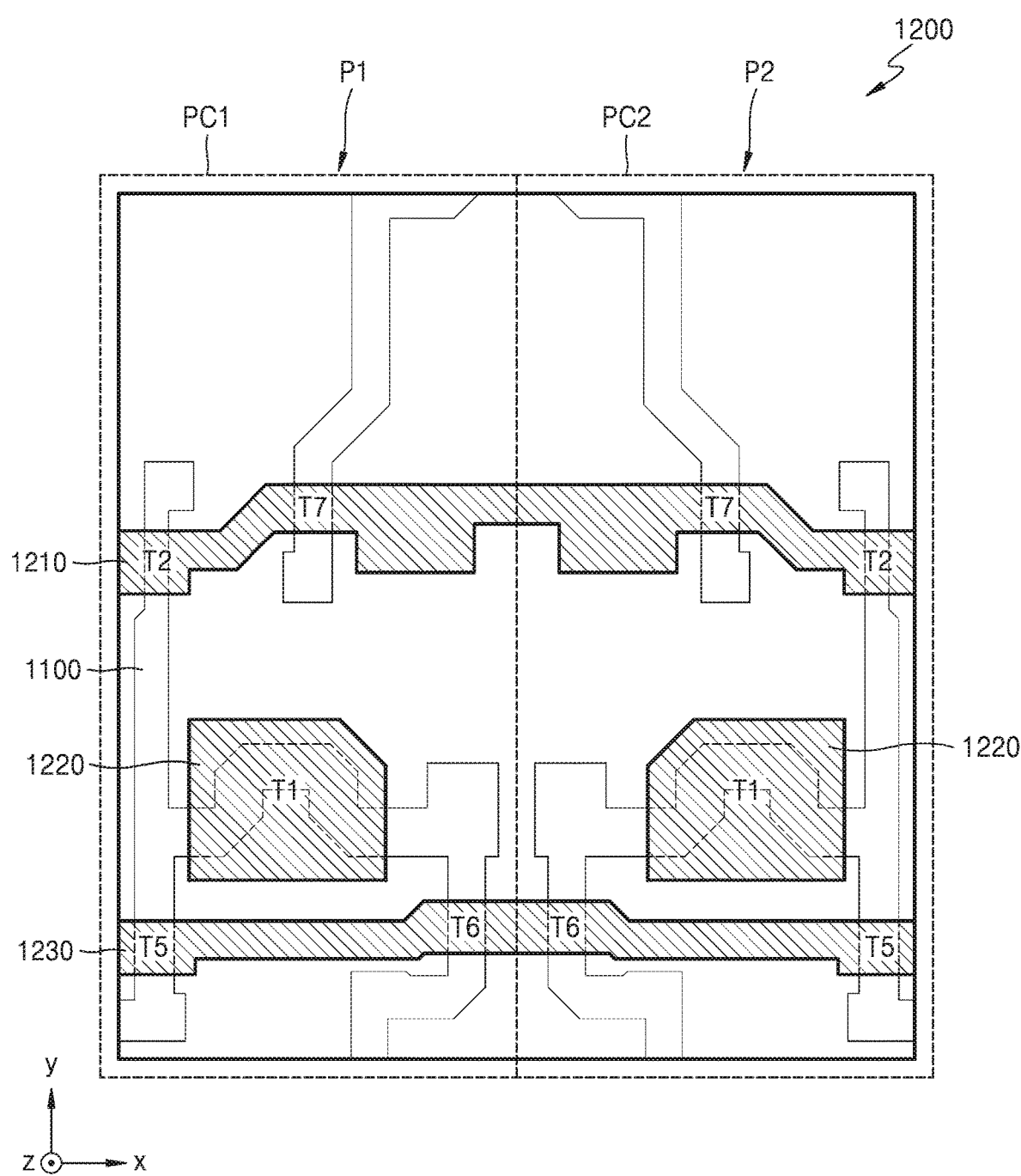
Figure 7C:
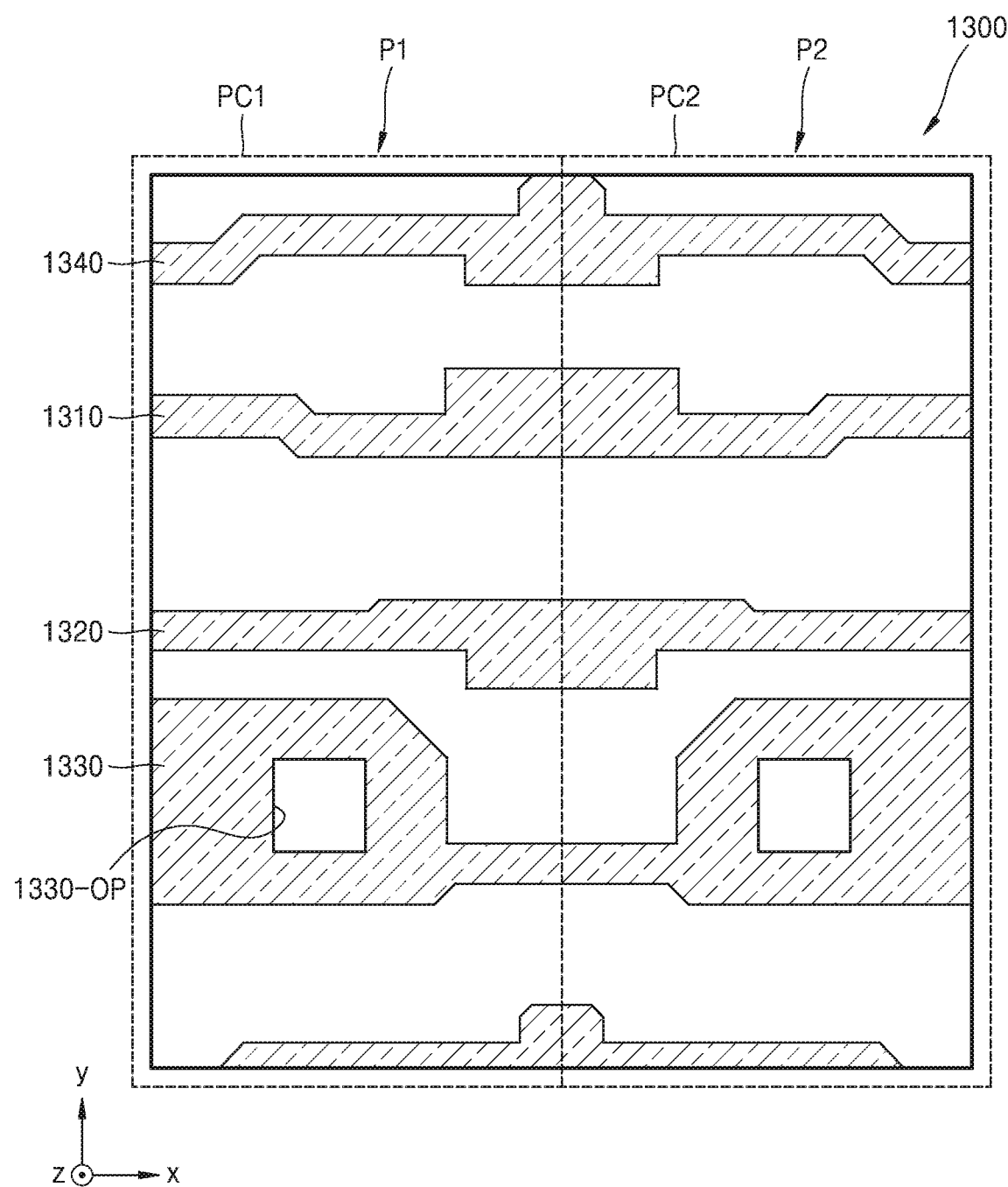
Figure 7D:
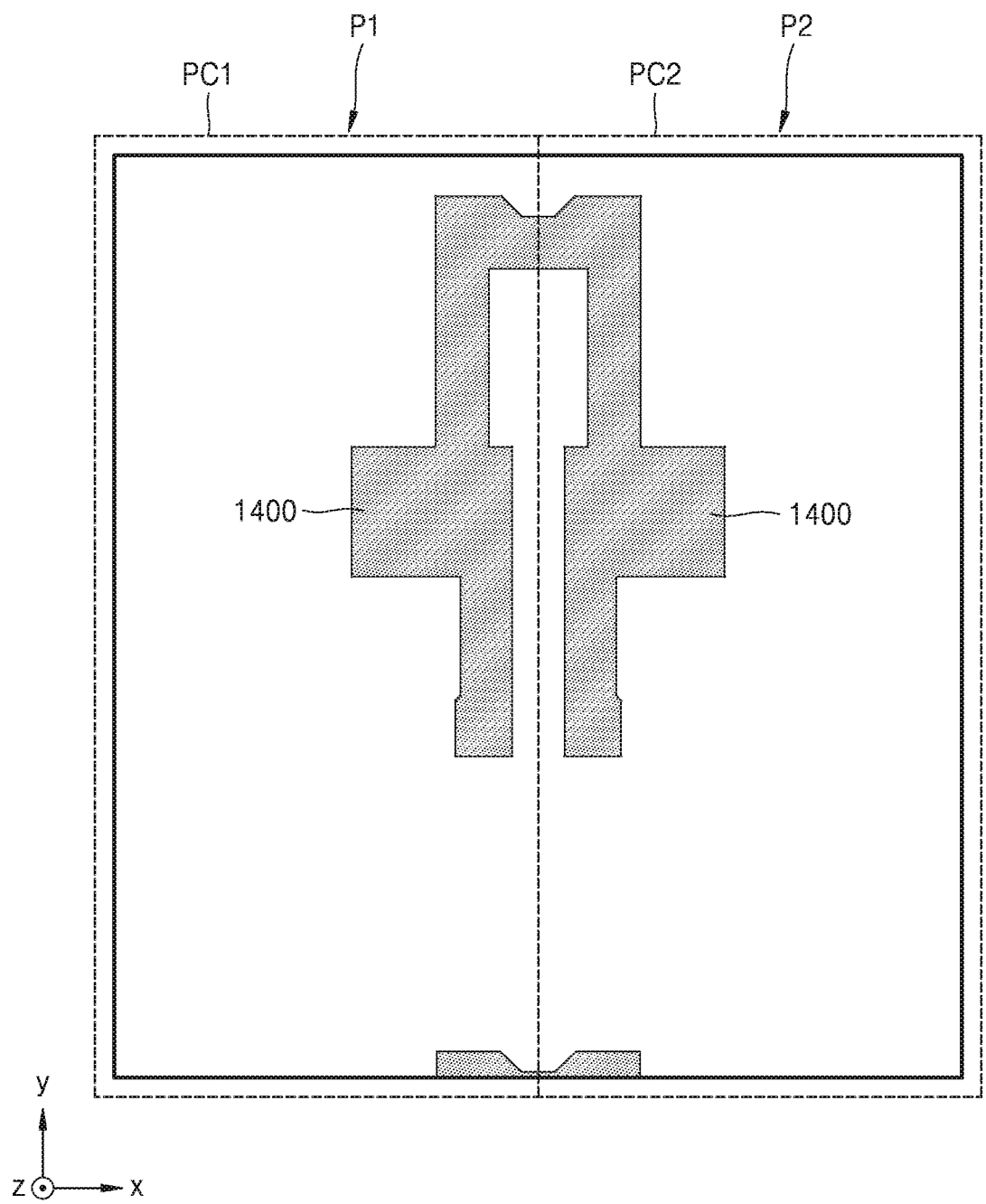
Figure 7E:
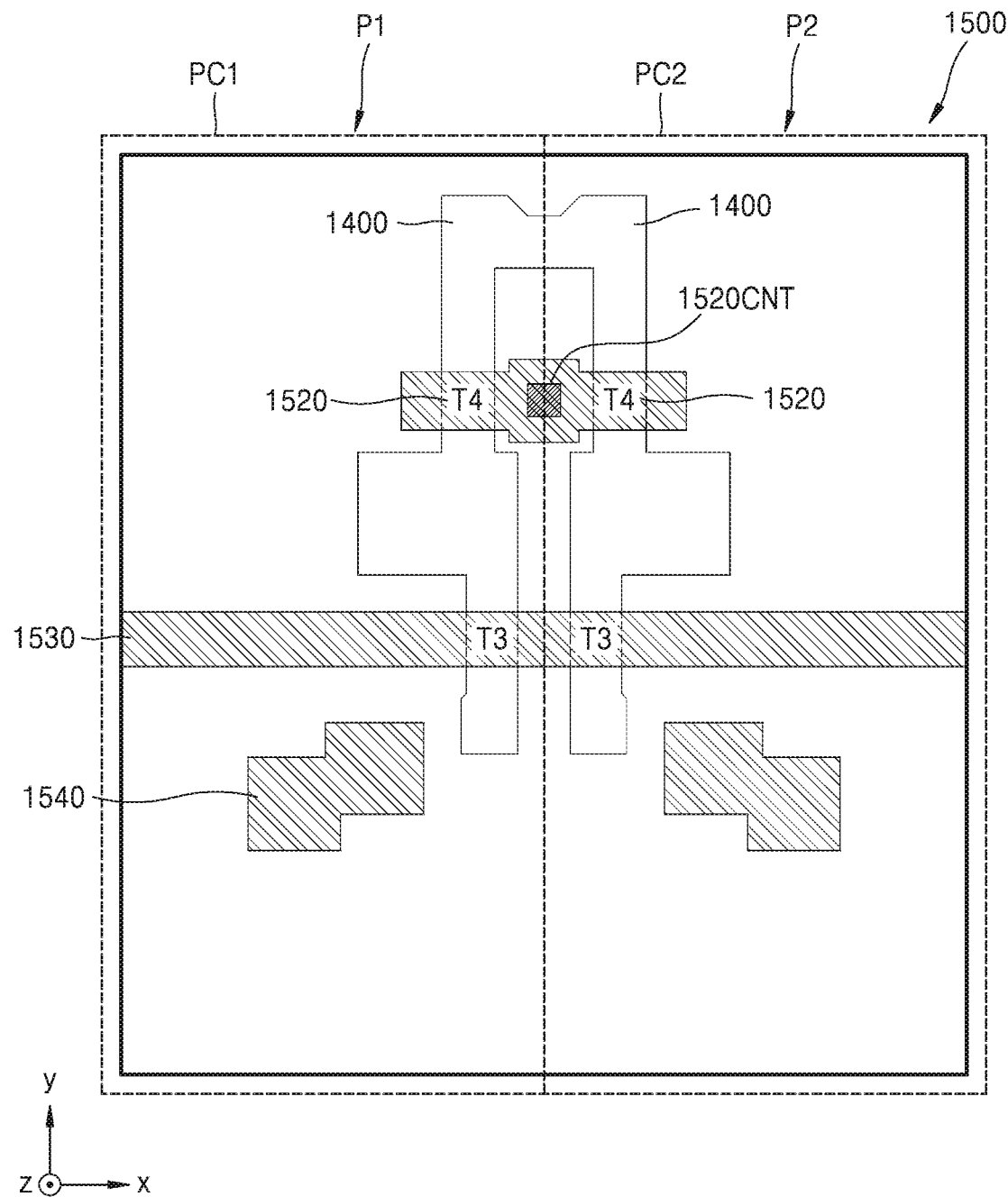
Figure 7F:
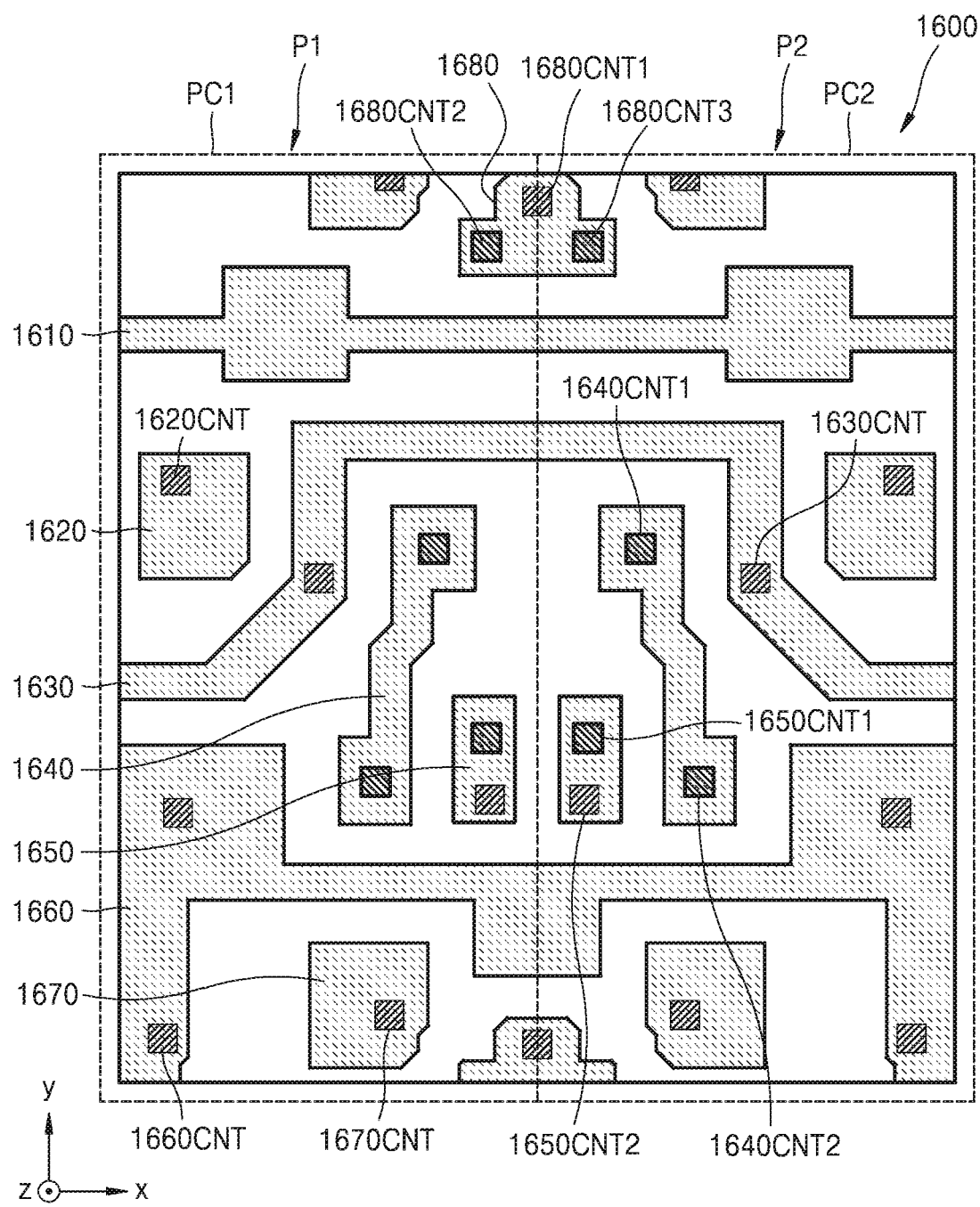
Figure 7G:
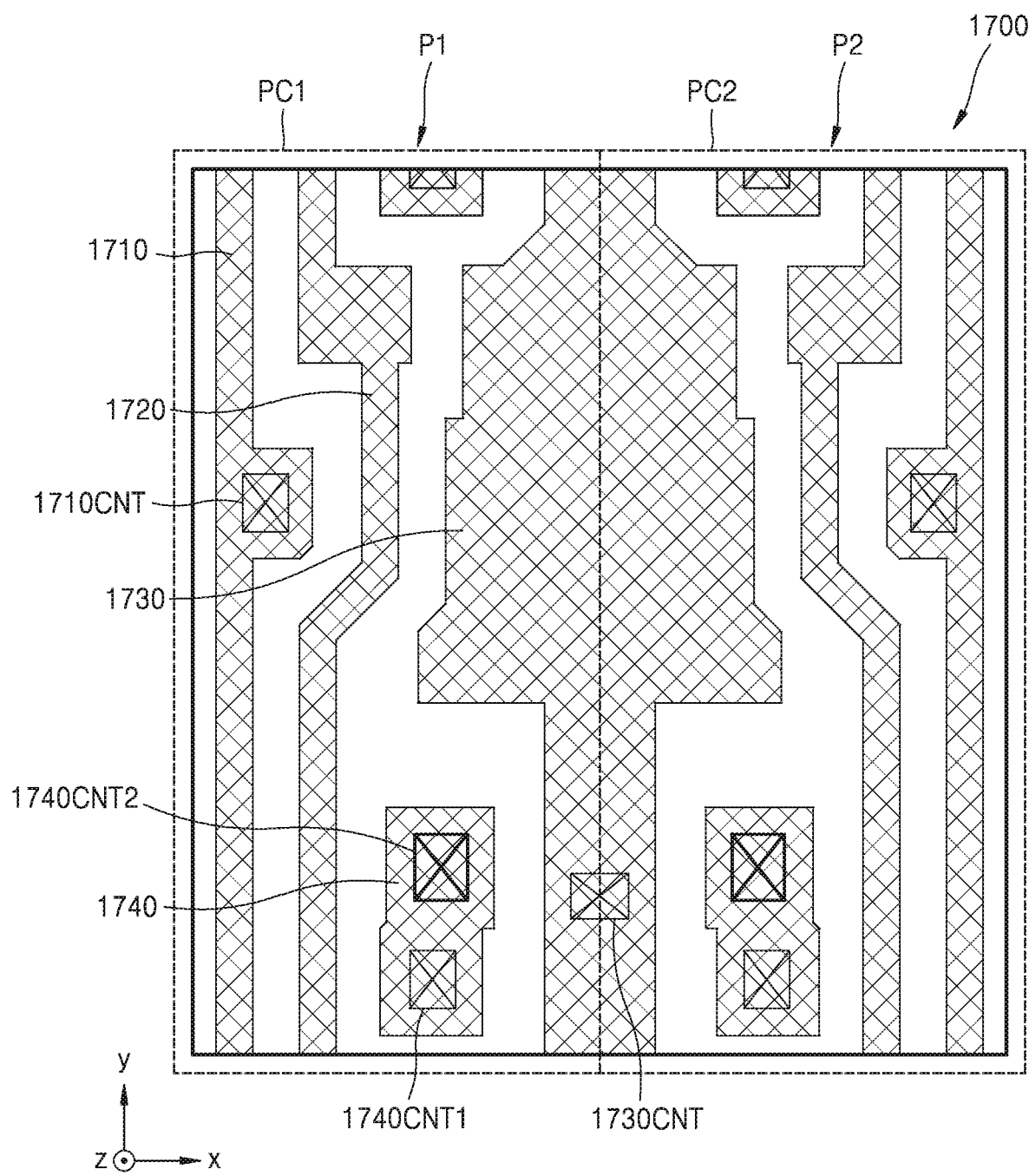
Figure 8:
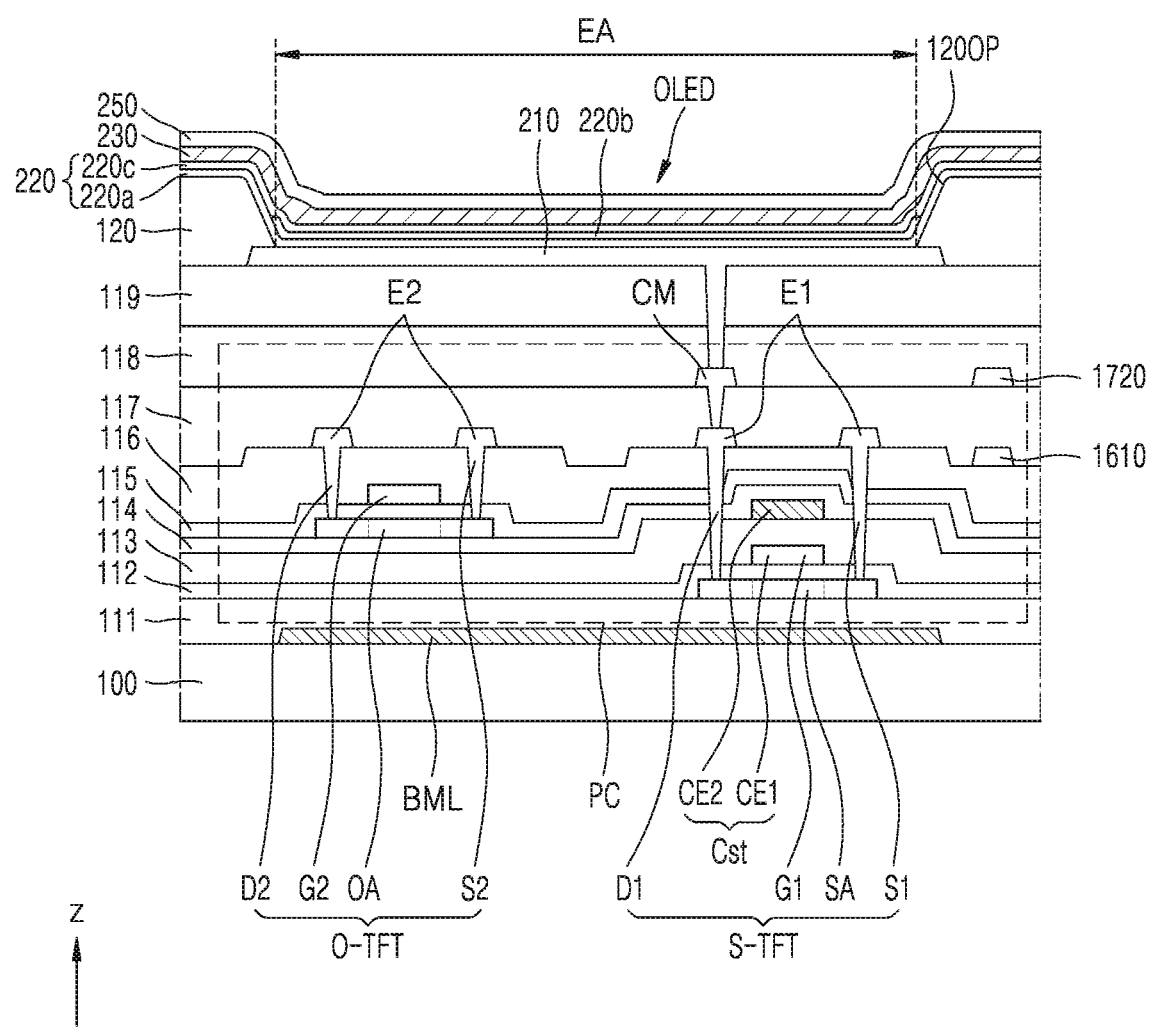
FIG. 8 is a schematic cross-sectional view of a partial structure of a pixel circuit, according to an embodiment.

FIG. 6 is a schematic plan view of a structure of a pixel circuit, according to an embodiment, FIGS. 7A, 7B, 7C, 7D, 7E, 7F, and 7G are plan views of layers of conductive patterns included in the pixel circuit of FIG. 6, and FIG. 8 is a schematic cross-sectional view of a partial structure of a pixel circuit, according to an embodiment.

Referring to FIG. 6, the display apparatus 1 may include a first sub-pixel P1 and a second sub-pixel P2 adjacent to each other. In an embodiment, the first sub-pixel P1 and the second sub-pixel P2 may have a structure in which the first sub-pixel P1 and the second sub-pixel P2 are symmetrical based on a virtual line. In another embodiment, the first sub-pixel P1 and the second sub-pixel P2 may correspond to the same pixel structures repeatedly arranged, rather than a symmetrical structure. The first sub-pixel P1 may include a first pixel circuit PC1, and the second sub-pixel P2 may include a second pixel circuit PC2.

Hereinafter, for convenience of explanation, some conductive patterns are described based on the first pixel circuit PC1. However, the conductive patterns may also be symmetrically formed with respect to the second pixel circuit PC2. Also, the first sub-pixel P1 and the second sub-pixel P2 described hereinafter with reference to FIGS. 6 and 7A, 7B, 7C, 7D, 7E, 7F, and 7G may be at least one of the main sub-pixel Pm, the first auxiliary sub-pixel Pa1, and the second auxiliary sub-pixel Pa2 described above with reference to FIG. 4, or the like.

A buffer layer 111 (see FIG. 8) of the substrate 100 may be arranged on the substrate 100. The buffer layer 111 may prevent the diffusion of metal atoms or impurities to a first active pattern 1100 from the substrate 100. Also, the buffer layer 111 may allow the first active pattern 1100 to be uniformly formed by adjusting a heat provision speed during a crystallization process for forming the first active pattern 1100.

As illustrated in FIG. 7A, the first active pattern 1100 may be arranged on the buffer layer 111. In an embodiment, the first active pattern 1100 may include a silicon semiconductor. For example, the silicon semiconductor may include amorphous silicon, polycrystalline silicon, etc. For example, the first active pattern 1100 may include low temperature polysilicon (LTPS).

In an embodiment, ions may be injected to the first active pattern 1100. For example, when the driving thin-film transistor T1, the switching thin-film transistor T2, the operation control thin-film transistor T5, the emission control thin-film transistor T6, and the second initialization thin-film transistor T7 are PMOS transistors, ions, such as boron, may be injected to the first active pattern 1100.

A first gate insulating layer 112 (see FIG. 8) may cover the first active pattern 1100 and may be arranged on the substrate 100. The first gate insulating layer 112 may include an insulating material. For example, the first gate insulating layer 112 may include silicon oxide, silicon nitride, silicon oxynitride, aluminum oxide, etc.

As illustrated in FIG. 7B, a first conductive pattern 1200 may be arranged on the first gate insulating layer 112. The first conductive pattern 1200 may include metal, an alloy, a conductive metal oxide, a transparent conductive material, etc. For example, the first conductive pattern 1200 may include Ag, an alloy including Ag, Mo, an alloy including Mo, Al, an alloy including Al, AlN, W, WN, Cu, ITO, IZO, etc.

The first conductive pattern 1200 may include a first gate line 1210, a first gate electrode 1220, and a second gate line 1230.

The first gate line 1210 may extend in an x direction. The first gate line 1210 may correspond to the first scan line SL1 of FIG. 5. The first gate line 1210 may form the switching thin-film transistor T2 together with the first active pattern 1100. For example, the first scan signal Sn may be provided to the first gate line 1210. Also, the first gate line 1210 may form the second initialization thin-film transistor T7 together with the first active pattern 1100. For example, the next scan signal Sn+1 may be provided to the first gate line 1210. The first scan signal Sn and the next scan signal Sn+1 may have substantially identical waveforms with a time difference.

The first gate electrode 1220 may be arranged to have an island shape. The first gate electrode 1220 may form the driving thin-film transistor T1 together with the first active pattern 1100.

The second gate line 1230 may extend in an x direction. The second gate line 1230 may correspond to the emission control line EL of FIG. 5. The second gate line 1230 may form the operation control and emission control thin-film transistors T5 and T6 together with the first active pattern 1100. For example, the emission control signal En may be provided to the second gate line 1230.

The second gate insulating layer 113 (see FIG. 8) may cover the first conductive pattern 1200 and may be arranged on the first gate insulating layer 112. The second gate insulating layer 113 may include an insulating material as the first gate insulating layer 112.

As illustrated in FIG. 7C, a first conductive pattern 1300 may be arranged on the second gate insulating layer 113. The second conductive pattern 1300 may include, for example, metal, an alloy, a conductive metal oxide, a transparent conductive material, etc.

The second conductive pattern 1300 may include a third gate line 1310, a fourth gate line 1320, a storage capacitor electrode 1330 (that is, the upper electrode CE2 of FIG. 5), and a first initialization voltage line 1340 (that is, the first initialization voltage line VL1 of FIG. 5).

The third gate line 1310 may extend in an x direction. The third gate line 1310 may correspond to the previous scan line SLp of FIG. 5. The third gate line 1310 may be arranged to be spaced apart from the first gate line 1210 on a plane. The previous scan signal Sn-1 may be provided to the third gate line 1310.

The fourth gate line 1320 may extend in the x direction. The fourth gate line 1320 may correspond to the second scan line SL2 of FIG. 5. The fourth gate line 1320 may be spaced apart from the first gate line 1210 and the third gate line 1310 on a plane. The second scan signal Sn' may be provided to the fourth gate line 1320.

The storage capacitor electrode 1330 may overlap the first gate electrode 1220 and may extend in the x direction. For example, the storage capacitor electrode 1330 may form the storage capacitor Cst together with the first gate electrode 1220. The driving voltage ELVDD may be provided to the storage capacitor electrode 1330. In addition, a hole 1330-OP penetrating the storage capacitor electrode 1330 may be formed in the storage capacitor electrode 1330, and the first gate electrode 1220 may be exposed through the hole 1330-OP.

The first initialization voltage line 1340 may extend in the x direction. The first initialization voltage line 1340 may be apart from the third gate line 1310 on a plane. The first initialization voltage Vint may be provided through the first initialization voltage line 1340. The first initialization voltage line 1340 may at least partially overlap a second active pattern 1400 to be described below and may transmit the first initialization voltage Vint to the second active pattern 1400. The first initialization voltage line 1340 may be electrically connected to the second active pattern 1400 through contact portions 1680CNT1, 1680CNT2, and 1680CNT3 illustrated in FIG. 7F to be described below. The first initialization voltage line 1340 may be the first initialization voltage line VL1 of FIG. 5.

A first interlayer insulating layer 114 (see FIG. 8) may cover the second conductive pattern 1300 and may be arranged on the second gate insulating layer 113. The first interlayer insulating layer 114 may include an insulating material. For example, the first interlayer insulating layer 114 may include silicon oxide, silicon nitride, silicon oxynitride, aluminum oxide, etc.

As illustrated in FIG. 7D, the second active pattern 1400 may be arranged on the first interlayer insulating layer 114.

According to the present embodiment, the second active pattern 1400 may include an oxide semiconductor. The second active pattern 1400 may be arranged on a layer that is different from a layer on which the first active pattern 1100 is arranged and may not overlap the first active pattern 1100.

The second interlayer insulating layer 115 may cover the second active pattern 1400 and may be arranged on the first interlayer insulating layer 114. A second interlayer insulating layer 115 may include an insulating material.

In an embodiment, the second interlayer insulating layer 115 may be patterned to cover a portion of the second active pattern 1400 and expose the other portion of the second active pattern 1400 as illustrated in FIG. 8. In this case, the second interlayer insulating layer 115 may be formed to have the same pattern as a second gate electrode 1520 of FIG. 7E to be described below. Thus, except for a channel area of the second active pattern 1400, the channel area overlapping the second gate electrode 1520, a source area and a drain area of the second active pattern 1400 may be exposed. The source area and the drain area may directly contact a third interlayer insulating layer 116 as illustrated in FIG. 8.

As illustrated in FIG. 7E, a third conductive pattern 1500 may be arranged on the second interlayer insulating layer 115. The third conductive pattern 1500 may include, for example, metal, an alloy, a conductive metal oxide, a transparent conductive material, etc.

The third conductive pattern 1500 may include a second gate electrode 1520, a fifth gate line 1530, and a first transmission pattern 1540.

The second gate electrode 1520 may overlap the third gate line 1310 and the second active pattern 1400. According to the present embodiment, the second gate electrode 1520 may be electrically connected to the third gate line 1310. For example, the second gate electrode 1520 may contact the third gate line 1310 through a contact portion 1520CNT. The contact portion 1520CNT may be formed via a contact hole penetrating the insulating layers (for example, the first interlayer insulating layer 114 and the second interlayer insulating layer 115) arranged between the third gate line 1310 and the second gate electrode 1520.

The second scan signal Sn' may be provided to the second gate electrode 1520. The third gate line 1310, the second active pattern 1400, and the second gate electrode 1520 may form the first initialization thin-film transistor T4. For example, the third gate line 1310 may correspond to a back-gate electrode of the first initialization thin-film transistor T4, and the second gate electrode 1520 may correspond to a gate electrode of the first initialization thin-film transistor T4.

The fifth gate line 1530 may extend in the x direction. The fifth gate line 1530 may overlap the fourth gate line 1320 and the second active pattern 1400. In some embodiments, the fifth gate line 1530 may be electrically connected to the fourth gate line 1320. For example, the fifth gate line 1530 may contact the fourth gate line 1320 through a contact portion.

The second scan signal Sn' may be provided to the fifth gate line 1530. The fourth gate line 1320, the second active pattern 1400, and the fifth gate line 1530 may form the compensation thin-film transistor T3. For example, the fourth gate line 1320 may correspond to a back-gate electrode of the compensation thin-film transistor T3, and the fifth gate line 1530 may correspond to a gate electrode of the compensation thin-film transistor T3.

The first transmission pattern 1540 may contact the first gate electrode 1220 exposed through the opening 1330_OP of the storage capacitor electrode 1330. The first transmission pattern 1540 may transmit the initialization voltage Vint to the first gate electrode 1220.

A third interlayer insulating layer 116 may be arranged to cover at least a portion of the third conductive pattern 1500 as illustrated in FIG. 8. The third interlayer insulating layer 116 may include an insulating material. For example, the third interlayer insulating layer 116 may include silicon oxide, silicon nitride, silicon oxynitride, aluminum oxide, etc.

As illustrated in FIG. 7F, a fourth conductive pattern 1600 may be arranged on the third interlayer insulating layer 116. The fourth conductive pattern 1600 may include, for example, metal, an alloy, a conductive metal oxide, a transparent conductive material, etc.

The fourth conductive pattern 1600 may include a first signal transmission line 1610, a second transmission pattern 1620, a second initialization voltage line 1630, a third transmission pattern 1640, a fourth transmission pattern 1650, a fifth transmission pattern 1660, a sixth transmission pattern 1670, and a seventh transmission pattern 1680.

The first signal transmission line 1610 may extend in the x direction. The data signal Dm may be provided through the first signal transmission line 1610. The first signal transmission line 1610 may correspond to a first signal transmission line CL-H illustrated in FIG. 19.

The second transmission pattern 1620 may contact the first active pattern 1100 through the contact portion 1620CNT. The data signal Dm may be transmitted to the first active pattern 1100 through the second transmission pattern 1620.

The second initialization voltage line 1630 (that is, the second initialization voltage line VL2 of FIG. 5) may extend in the x direction. The second initialization voltage Aint may be provided through the second initialization voltage line 1630. The second initialization voltage line 1630 may contact the first active pattern 1100 through the contact portion 1630CNT and may transmit the second initialization voltage Aint to the first active pattern 1100.

The third transmission pattern 1640 may contact the second active pattern 1400 and the first transmission pattern 1540 through contact portions 1640CNT1 and 1640CNT2 respectively formed at a side and the other side of the third transmission pattern 1640. The first initialization voltage Vint may be transmitted to the first gate electrode 1220 through the second active pattern 1400, the third transmission pattern 1640, and the first transmission pattern 1540.

The fourth transmission pattern 1650 may contact the second active pattern 1400 and the first active pattern 1100 through contact portions 1650CNT1 and 1650CNT2 respectively formed at a side and the other side of the fourth transmission pattern 1650. The fourth transmission pattern 1650 may electrically connect the second active pattern 1400 with the first active pattern 1100.

The fifth transmission pattern 1660 may extend in the x direction. The driving voltage ELVDD may be provided to the fifth transmission pattern 1660. The fifth transmission pattern 1660 may contact the first active pattern 1100 through a contact portion 1660CNT and may transmit the driving voltage ELVDD to the first active pattern 1100.

The sixth transmission pattern 1670 may contact the first active pattern 1100 through a contact portion 1670CNT. The sixth transmission pattern 1670 may transmit a driving current or the second initialization voltage Aint to the organic light-emitting diode OLED from the first active pattern 1100.

The seventh transmission pattern 1680 may contact the second active pattern 1400 through contact portions 1680CNT1, 1680CNT2, and 1680CNT3. The seventh transmission pattern 1680 may contact the first initialization voltage line 1340 of FIG. 7C through the contact portion 1680CNT1 and may contact the second active pattern 1400 of FIG. 7D through the contact portions 1680CNT2 and 1680CNT3, in order to transmit the first initialization voltage Vint to the first initialization thin-film transistor T4.

A first organic insulating layer 117 (see FIG. 8) may cover the fourth conductive pattern 1600 and may be arranged on the third interlayer insulating layer 116.

As illustrated in FIG. 7G, a fifth conductive pattern 1700 may be arranged on the first organic insulating layer 117. The fifth conductive pattern 1700 may include a data line 1710, a second signal transmission line 1720, a voltage line 1730, and an eighth transmission pattern 1740.

The data line 1710 may extend in a y direction. The data line 1710 may correspond to the data line DL of FIG. 5. The data line 1710 may contact the second transmission pattern 1620 through a contact portion 1710CNT. The data signal Dm may be transmitted to the first active pattern 1100 through the data line 1710 and the second transmission pattern 1620.

The second signal transmission line 1720 may extend in the y direction. The second signal transmission line 1720 may contact the first signal transmission line 1610 so that the data signal Dm may be provided to the second signal transmission line 1720. The second signal transmission line 1720 may correspond to a second signal transmission line CL-V illustrated in FIG. 19.

For example, different data voltages may be provided to the data line 1710 and the second signal transmission line 1720. In detail, a first data voltage may be transmitted to the first active pattern 1100 through the data line 1710, and a second data voltage that is different from the first data voltage may be transmitted through the first signal transmission line 1610 through the second signal transmission line 1720.

The voltage line 1730 may extend in the y direction. The voltage line 1730 may correspond to the driving voltage line PL of FIG. 5. The voltage line 1730 may provide the driving voltage ELVDD. The voltage line 1730 may be connected to the fifth transmission pattern 1660 through a contact portion 1730CNT and may provide the driving voltage ELVDD to the storage capacitor electrode 1330 and the operation control thin-film transistor T5.

The voltage line 1730 may be shared by the first pixel circuit PC1 and the second pixel circuit PC2 adjacent to each other. In another embodiment, the voltage line 1730 may be provided in each of the first pixel circuit PC1 and the second pixel circuit PC2.

The eighth transmission pattern 1740 may contact the sixth transmission pattern 1670 through a contact portion 1740CNT1. The eighth transmission pattern 1740 may transmit the driving current IDLED or the anode initialization voltage Aint to the organic light-emitting diode OLED from the sixth transmission pattern 1670.

Also, the eighth transmission pattern 1740 may contact a pixel electrode 210 (see FIG. 8) through a contact portion 1740CNT2. The eighth transmission pattern 1740 may electrically connect the emission control thin-film transistor T6 with the pixel electrode 210.

A stack structure on the fifth conductive pattern 1700 is described with reference to FIG. 8. A second organic insulating layer 118 may be arranged to cover the fifth conductive pattern 1700. A third organic insulating layer 119 may be arranged on the second organic insulating layer 118. The first through third organic insulating layers 117 through 119 may include, for example, general-purpose polymers, such as benzocyclobutene (BCB), polyimide, hexamethyldisiloxane (HMDSO), polymethylmethacrylate (PMMA), or polystyrene (PS), polymer derivatives having a phenol-based group, acryl-based polymers, imide-based polymers, arylether-based polymers, amide-based polymers, fluorine-based polymers, p-xylene-based polymers, vinylalcohol-based polymers, and a blend thereof.

The organic light-emitting diode OLED may be arranged on the second organic insulating layer 118 as a display element. The organic light-emitting diode OLED may include the pixel electrode 210, an intermediate layer 220 including an organic emission layer 220b, and an opposite electrode 230.

The pixel electrode 210 may include a (semi-) transmissive electrode or a reflection electrode. In an embodiment, the pixel electrode 210 may include a reflective layer including Ag, Mg, Al, Pt, Pd, Au, Ni, Nd, Ir, Cr, and a compound thereof, and a transparent or semi-transparent electrode layer on the reflective layer. The transparent or semi-transparent electrode layer may include at least one selected from the group consisting of ITO, IZO, ZnO, $In_2O_3$, IGO, or AZO. For example, the pixel electrode 210 may include ITO/Ag/ITO.

A pixel-defining layer 120 may be arranged on the third organic insulating layer 119. The pixel-defining layer 120 may increase a distance between the edge of the pixel electrode 210 and an opposite electrode 230 above the pixel electrode 210 so as to prevent arcs, etc. from occurring at the edge of the pixel electrode 210.

The pixel-defining layer 120 may be formed by spin coating, etc. by including at least one organic insulating material selected from the group consisting of polyimide, polyamide, acryl resins, BCB, and phenol resins.

The intermediate layer 220 of the organic light-emitting diode OLED may be arranged in an opening 1200P formed by the pixel-defining layer 120. An emission area EA of the organic light-emitting diode OLED may be defined by the opening 1200P.

The intermediate layer 220 may include the organic emission layer 220b. The organic emission layer 220b may include an organic material including a fluorescent or phosphorescent material for emitting red, green, blue, or white light. The organic emission layer 220b may include a low molecular-weight organic material or a high molecular-weight organic material. Also, a first functional layer 220a including a hole transport layer HTL and a hole injection layer HIL, and a second functional layer 220c including an electron transport layer ETL and an electron injection layer EIL may be selectively further arranged below and above the organic emission layer 220b, respectively.

The opposite electrode 230 may include a transmissive electrode or a reflection electrode. In some embodiments, the opposite electrode 230 may include a transparent or semi-transparent electrode and may include a metal thin-film having a low work function, such as Li, Ca, LiF/Ca, LiF/Al, Al, Ag, Mg, and a compound thereof. Also, a transparent conductive oxide (TCO) layer, such as ITO, IZO, ZnO, or $In_2O_3$, may further be arranged above the metal thin-film. The opposite electrode 230 may be integrally formed on the entire surface of the display area DA and may be arranged above the intermediate layer 220 and the pixel-defining layer 120.

An upper layer 250 including an organic material may be formed on the opposite electrode 230. The upper layer 250 may be provided to protect the opposite electrode 230 and increase the light extraction efficiency. The upper layer 250 may include an organic material having a higher refractive index than an organic material of the opposite electrode 230. Alternatively, the upper layer 250 may include stacked layers having different refractive indices. For example, the upper layer 250 may be formed by including a high refractive index layer, a low refractive index layer, and a high refractive index layer that are stacked. Here, a refractive index of the high refractive index layer may be about equal to or higher than 1.7 and a refractive index of the low refractive index layer may be about equal to or lower than 1.3.

The upper layer 250 may additionally include LiF. Alternatively, the upper layer 250 may additionally include an inorganic insulating material, such as $SiO_2$, $SiN_x$, etc.

The first and second active patterns 1100 and 1400 and the first through fifth conductive patterns 1200, 1300, 1500, 1600, and 1700 of FIGS. 7A through 7G described above may form a silicon thin-film transistor S-TFT and an oxide thin-film transistor O-TFT as illustrated in FIG. 8. The silicon thin-film transistor S-TFT and the oxide thin-film transistor O-TFT of FIG. 8 may be one of the plurality of thin-film transistors T1 through T7 of FIG. 5 described above.

The silicon thin-film transistor S-TFT may include a first electrode layer E1 including a silicon semiconductor layer SA, a first gate electrode G1, a source electrode S1, and a drain electrode D1. The silicon semiconductor layer SA may correspond to a portion of the first active pattern 1100 of FIG. 7A, the first gate electrode G1 may correspond to a portion of the first conductive pattern 1200 of FIG. 7B, and the first electrode layer E1 may correspond to a portion of the fourth conductive pattern 1600 of FIG. 7F. The first electrode layer E1 may be connected to the pixel electrode 210 through a contact metal CM.

An upper electrode CE2 may be arranged on the first gate electrode G1 and may form a storage capacitor Cst together with a lower electrode CE1 which is integrally formed with the first gate electrode G1.

The oxide thin-film transistor O-TFT may include a second electrode layer E2 including an oxide semiconductor layer OA, a second gate electrode G2, a source electrode S2, and a drain electrode D2. The oxide semiconductor layer OA may correspond to a portion of the second active pattern 1400 of FIG. 7D, the second gate electrode G2 may correspond to a portion of the third conductive pattern 1500 of FIG. 7E, and the second electrode layer E2 may correspond to a portion of the fourth conductive pattern 1600 of FIG. 7F.

Figure 9:
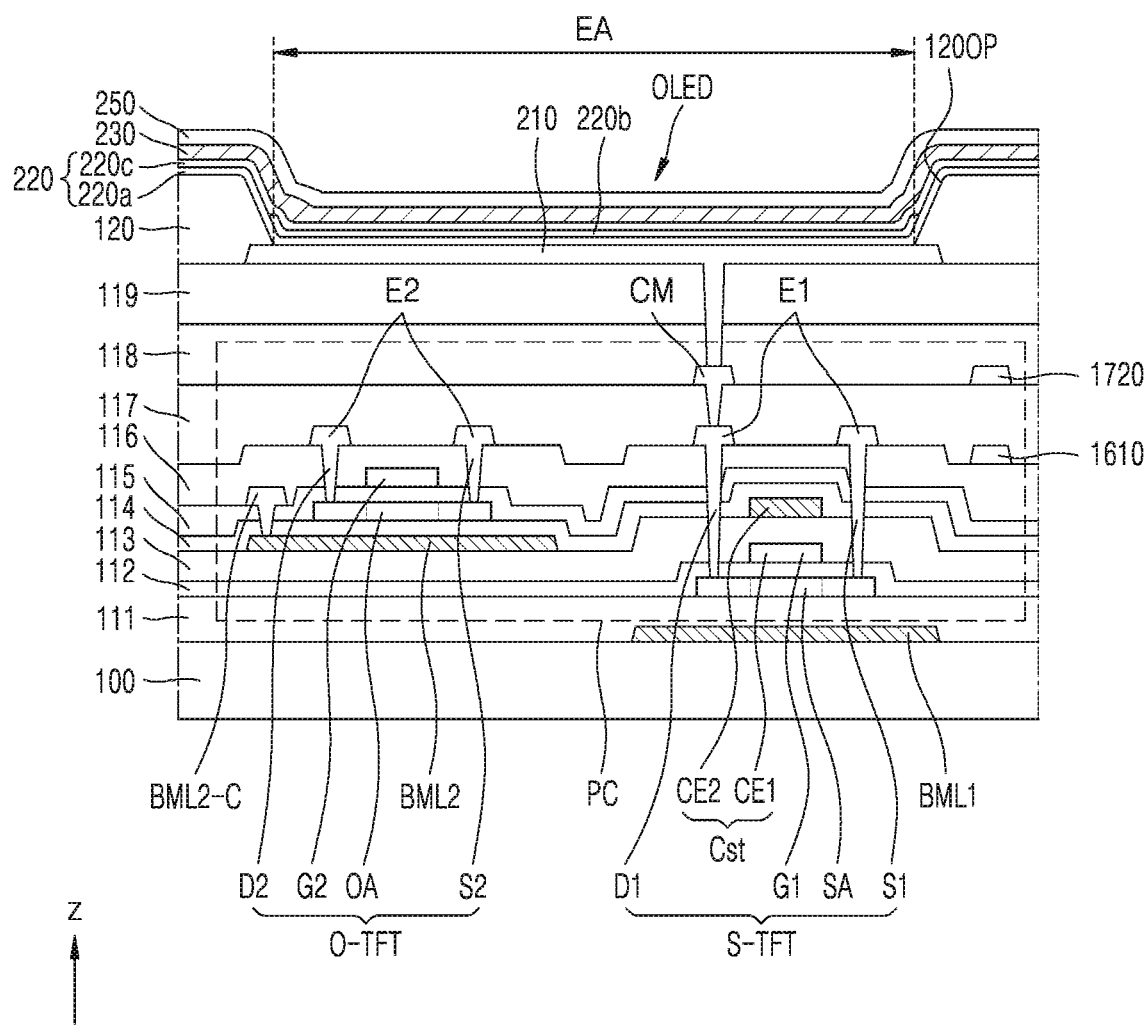
FIG. 9 is a schematic cross-sectional view of a partial structure of a pixel circuit, according to an embodiment.

FIG. 9 is a schematic cross-sectional view of a partial structure of a pixel circuit, according to an embodiment.

In another embodiment, while a shape of a cross-sectional structure of FIG. 9 may be similar to a cross-sectional structure of FIG. 8 described above, the cross-sectional structure of FIG. 9 may further include a first bottom surface metal layer BML1 and a second bottom surface metal layer BML2 arranged below the silicon and oxide thin-film transistors S-TFT and O-TFT, respectively.

The first bottom surface metal layer BML1 may be arranged to correspond to at least an area of the pixel circuit PC. In an embodiment, the first bottom surface metal layer BML1 may be arranged to overlap the driving thin-film transistor T1 (see FIG. 5) provided as the silicon thin-film transistor S-TFT.

The first bottom surface metal layer BML1 may be arranged between the substrate 100 and the buffer layer 111. In an embodiment, the first bottom surface metal layer BML1 may be arranged on the substrate 100, on which an organic layer and an inorganic layer are alternately stacked, and an inorganic barrier layer may further be arranged between the first bottom surface metal layer BML1 and the buffer layer 111. The first bottom surface metal layer BML1 may be connected to an electrode or a line and may receive a constant voltage or signal from the electrode or the line. In another embodiment, the first bottom surface metal layer BML1 may be provided to have an isolated shape with respect to another electrode or line.

The second bottom surface metal layer BML2 may be arranged below the oxide thin-film transistor O-TFT. The second bottom surface metal layer BML2 may be arranged between the second gate insulating layer 113 and the first interlayer insulating layer 114. The second bottom surface metal layer BML2 and the upper electrode CE2 of the storage capacitor Cst may be arranged on the same layer. The second bottom surface metal layer BML2 may be connected to a contact electrode BML2-C and may receive a constant voltage or signal. The contact electrode BML2-C and the second gate electrode G2 of the oxide thin-film transistor O-TFT may be arranged on the same layer.

The first bottom surface metal layer BML1 and the second bottom surface metal layer BML2 may include a reflective metal and may include, for example, Ag, an alloy including Ag, Mo, an alloy including Mo, Al, an alloy including Al, AlN, W, WN, Cu, p+ doped amorphous silicon, etc. The first bottom surface metal layer BML1 and the second bottom surface metal layer BML2 may include the same material as each other or different materials from each other.

Figure 10:
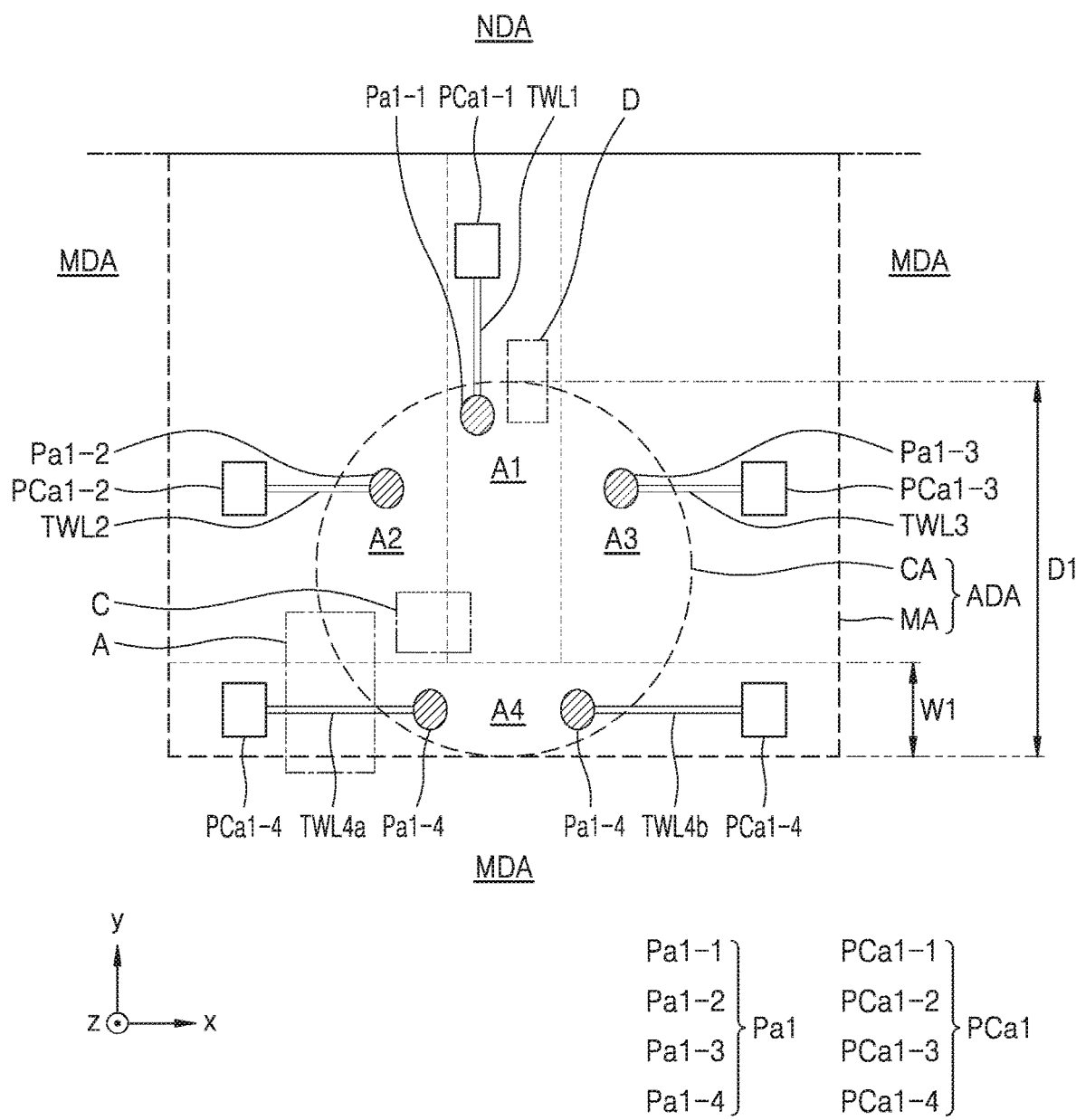
FIG. 10 is a schematic plan view of a portion of a display area of a display apparatus, the display area including an auxiliary display area, according to an embodiment.

FIG. 10 is a schematic plan view of a portion of a display area of a display apparatus, the display area including an auxiliary display area ADA, according to an embodiment.

Referring to FIG. 10, the auxiliary display area ADA may include a component area CA and a middle area MA at least partially surrounding the component area CA. The auxiliary display area ADA may include a first area A1 including a central portion of the component area CA and a portion of the middle area MA, and a second area A2, a third area A3, and a fourth area A4 each including a portion of the component area CA and a portion of the middle area MA. The second area A2 may be arranged at a side of the first area A1, and the third area A3 may be arranged at the other side of the first area A1. That is, the second area A2 and the third area A3 may be symmetrically arranged based on the first area A1. The fourth area A4 may be arranged below the first area A1, the second area A2, and the third area A3, and may contact the first area A1, the second area A2, the third area A3, and a main display area MDA.

First, second, third, and fourth connecting lines TWL1, TWL2, TWL3, and TWL4 may be arranged on the first, second, third, and fourth areas A1, A2, A3, and A4, respectively, and the first, second, third, and fourth areas A1, A2, A3, and A4 in the auxiliary display area ADA may be areas that are divided based on the arrangement relationship of the first, second, third, and fourth connecting lines TWL1, TWL2, TWL3, and TWL4.

A $1$-$1^{st}$ auxiliary display element Pa1-1 may be arranged on the component area CA corresponding to the first area A1, and a $1$-$1^{st}$ auxiliary pixel circuit PCa1-1 may be arranged on the middle area MA. The $1$-$1^{st}$ auxiliary display element Pa1-1 and the $1$-$1^{st}$ auxiliary pixel circuit PCa1-1 may be connected to each other through the first connecting line TWL1. The first connecting line TWL1 may extend in the y direction on the first area A1.

A $1$-$2^{nd}$ auxiliary display element Pa1-2 may be arranged on the component area CA corresponding to the second area A2, and a 1-2$^{nd}$ auxiliary pixel circuit PCa1-2 may be arranged on the middle area MA. The 1-2$^{nd}$ auxiliary display element Pa1-2 and the 1-2$^{nd}$ auxiliary pixel circuit PCa1-2 may be connected to each other through the second connecting line TWL2. The second connecting line TWL2 may extend in the x direction on the second area A2.

Similarly to the second area A2, a 1-3$^{rd}$ auxiliary display element Pa1-3 may be arranged on the component area CA corresponding to the third area A3, and a 1-3$^{rd}$ auxiliary pixel circuit PCa1-3 may be arranged on the middle area MA. The 1-3$^{rd}$ auxiliary display element Pa1-3 and the 1-3$^{rd}$ auxiliary pixel circuit PCa1-3 may be connected to each other through the third connecting line TWL3. The third connecting line TWL3 may extend in the x direction on the third area A3.

A 1-4$^{th}$ auxiliary display element Pa1-4 may be arranged on the component area CA corresponding to the fourth area A4, and a 1-4$^{th}$ auxiliary pixel circuit PCa1-4 may be arranged on the middle area MA. The 1-4th auxiliary display element Pa1-4 and the 1-4$^{th}$ auxiliary pixel circuit PCa1-4 may be connected to each other through the fourth connecting line TWL4. The fourth connecting line TWL4 may extend in the x direction on the fourth area A4.

In an embodiment, the fourth connecting line TWL4 on the fourth area A4 may include fourth connecting lines TWL4-1 and TWL4-2 arranged to face each other. The fourth connecting lines TWL4-1 and TWL4-2 may be symmetrically arranged based on a virtual central line crossing the center of the fourth area A4. For example, the virtual central line crossing the center of the fourth area A4 may be a central line crossing the center of the component area CA. Here, the center of the component area CA may denote a center of a figure forming a shape of the component area CA.

Referring to FIGS. 9 and 10, the fourth area A4 may contact the first area A1, the second area A2, and the third area A3 in an upper direction and may contact the main display area MDA in a lower direction. The fourth area A4 may include a portion of the component area CA arranged in a direction (for example, −y direction) in which the first area A1 extends. In a comparative embodiment, assuming that a first area extends onto a main display area, a maximum length of a first connecting line arranged on the first area may have to be further increased, and thus, the resistance of a first connecting line may be increased.

Thus, according to an embodiment, a hybrid structure may be implemented, in which the first connecting line TWL1 may extend in the first direction (for example, the y direction) on the first area A1, and the second, third, and fourth connecting lines TWL2, TWL3, and TWL4 may extend in the second direction (for example, the x direction) on the second through fourth areas A2 through A4. Based on this structure, the auxiliary display area ADA may be divided such that each of the first, second, third, and fourth areas A1, A2, A3, and A4 includes the component area CA and the middle area MA, wherein the fourth area A4 may be arranged between the first area A1 and the main display area MDA. Accordingly, a length of the first connecting line TWL1 extending in the y direction may be reduced, in order to efficiently control the resistance according to a length of a connecting line extending in a particular direction.

In an embodiment, in order to maximize the effect described above, a first width W1 of the fourth area A4 in the y direction may be about 25% (or about ¼) of a second width D1 of the component area CA in the y direction. Here, the second width D1 of the component area CA may indicate a maximum value of a width in the y direction. For example, when the component area CA has a circular shape, the second width D1 may denote a diameter of the component area CA. As described above, when the first width W1 of the fourth area A4 is obtained as ¼ of the second width D1 of the component area CA, lengths of the first connecting line TWL1 arranged on the first area A1 and the fourth connecting line TWL4 arranged on the fourth area A4 may be optimally designed.

The first, second, third, and fourth connecting lines TWL1, TWL2, TWL3, and TWL4 may include a transparent conductive material. For example, the first, second, third, and fourth connecting lines TWL1, TWL2, TWL3, and TWL4 may include a transparent conductive oxide (TCO) layer, such as IGZO, ITO, IZO, ZnO, or $In_2O_3$. Thus, the area of the component area CA, in which the first auxiliary sub-pixel Pa1 is not arranged, may be provided as the transmission area TA, regardless of the arrangement of the first, second, third, and fourth connecting lines TWL1, TWL2, TWL3, and TWL4.

FIGS. 11, 12, 13, 14, and 15 are detailed plan views of a portion of the auxiliary display area ADA of FIG. 10.

Hereinafter, referring to FIGS. 11, 12, 13, 14, and 15, a structure of each of the first through fourth areas A1, A2, A3, and A4 of the auxiliary display area ADA will be described in detail.

Figure 11:
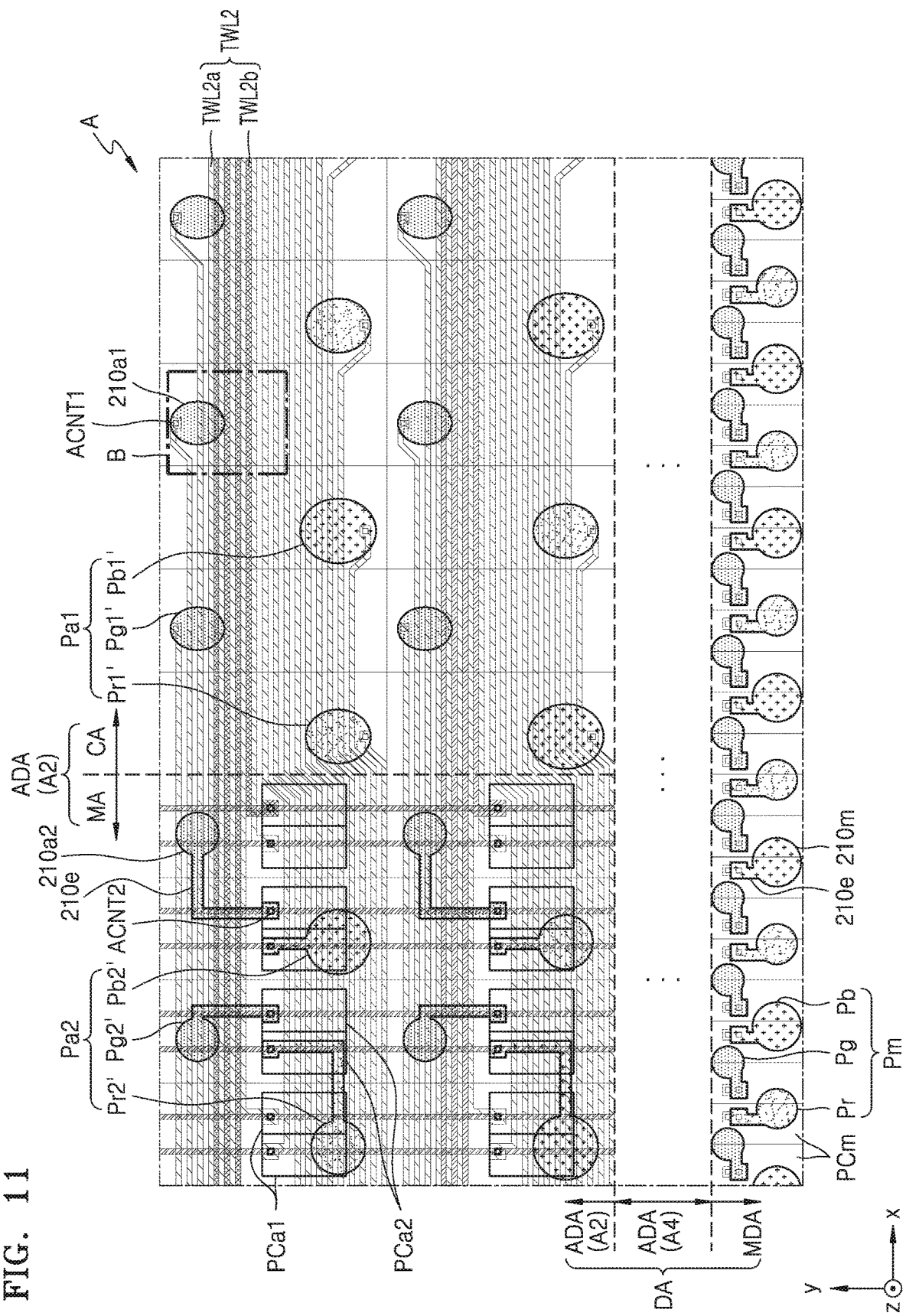
FIGS. 11, 12, 13, 14, and 15 are detailed plan views of a portion of the auxiliary display area of FIG. 10.

FIG. 11 illustrates an enlarged view of portions of the second area A2, the fourth area A4, and the main display area MDA. FIG. 11 may correspond to region A of FIG. 10. The structure of the fourth area A4 may be substantially equal to the structure of the second area A2, and thus, for convenience of explanation, a detailed description thereof will be omitted.

Referring to FIG. 11, a first auxiliary sub-pixel Pa1 may be arranged on the component area CA corresponding to the second area A2. Here, the first auxiliary sub-pixel Pa1 arranged on the component area CA corresponding to the second area A2 may actually denote the 1-2$^{nd}$ auxiliary display element Pa1-2 corresponding to the light-emitting device (that is, the organic light-emitting diode OLED). The first auxiliary sub-pixel Pa1 may emit any one of red, green, blue, and white light. In an embodiment, the first auxiliary sub-pixel Pa1 may include a first red auxiliary sub-pixel Pr1', a first green auxiliary sub-pixel Pg1', and a first blue auxiliary sub-pixel Pb1'.

As illustrated in FIG. 11, a pixel circuit for driving the 1-2$^{nd}$ auxiliary display element Pa1-2 may not be arranged below the 1-2$^{nd}$ auxiliary display element Pa1-2. In an embodiment, the 1-2$^{nd}$ auxiliary pixel circuit PCa1-2 for driving the 1-2$^{nd}$ auxiliary display element Pa1-2 may be arranged on the middle area MA corresponding to the second area A2.

The second connecting line TWL2 may be arranged to extend in the x direction. The second connecting line TWL2 may be arranged to intersect a second data line DL2 extending in the y direction. For example, the second connecting line TWL2 may extend in a crossing direction with respect to the second data line DL2. In an embodiment, the second data line DL2 of FIG. 11 may correspond to a second data line DL2 of FIG. 19.

The 1-2$^{nd}$ auxiliary pixel circuit PCa1-2 may be connected to the 1-2$^{nd}$ auxiliary pixel element Pa1-2 through the second connecting line TWL2. In an embodiment, the second connecting line TWL2 may include a 2-1$^{st}$ connecting line TWL2a and a 2-2$^{nd}$ connecting line TWL2b alternately arranged on a plane. The 2-1$^{st}$ connecting line TWL2a and the 2-2$^{nd}$ connecting line TWL2b may be arranged on different layers from each other. Based on this structure, a distance between the second connecting lines TWL2a and TWL2b may further be reduced, and thus, the resolution of the component area CA may increase, and defects, such as a short phenomenon, etc., disposed between the second connecting lines TWL2a and TWL2b may be prevented.

A second auxiliary sub-pixel Pa2 and a second auxiliary pixel circuit PCa2 may be arranged on the middle area MA corresponding to the second area A2. Here, the second auxiliary sub-pixel Pa2 arranged on the middle area MA corresponding to the second area A2 may actually denote a display element (that is, the organic light-emitting diode OELD) corresponding to a light-emitting device. The second auxiliary sub-pixel Pa2 may emit any one of red, green, blue, and white light. In an embodiment, the second auxiliary sub-pixel Pa2 may include a second red auxiliary sub-pixel Pr2', a second green auxiliary sub-pixel Pg2', and a second blue auxiliary sub-pixel Pb2'.

The second auxiliary pixel circuit PCa2 may overlap the second auxiliary sub-pixel Pa2 or may be arranged to be adjacent to the second auxiliary sub-pixel Pa2. The second auxiliary sub-pixel Pa2 may be directly connected to the second auxiliary pixel circuit PCa2 without the second connecting line TWL2 connecting the second auxiliary sub-pixel Pa2 with the second auxiliary pixel circuit PCa2.

The first auxiliary pixel circuit PCa1 and the second auxiliary pixel circuit PCa2 may be arranged on the middle area MA. In an embodiment, the first auxiliary pixel circuit PCa1 and the second auxiliary pixel circuit PCa2 may be arranged to be adjacent to each other and may be alternately arranged. As described above with reference to FIG. 6, etc., each of the first auxiliary pixel circuit PCa1 and the second auxiliary pixel circuit PCa2 may include a pair of two pixel circuits.

In an embodiment, assuming that the first auxiliary sub-pixel Pa1 and the second auxiliary sub-pixel Pa2 are arranged to have a matrix shape having rows and columns, the first auxiliary pixel circuit PCa1 and the second auxiliary pixel circuit PCa2 may be arranged in even number rows or odd number rows. That is, the first auxiliary pixel circuit PCa1 and the second auxiliary pixel circuit PCa2 may not be continually arranged in every row, and when the first auxiliary pixel circuit PCa1 and the second auxiliary pixel circuit PCa2 are arranged in even number rows, the first auxiliary pixel circuit PCa1 and the second auxiliary pixel circuit PCa2 may not be arranged in odd number rows. Based on this arrangement of the pixels, the resolution of the auxiliary display area ADA may be lower than the resolution of the main display area MDA.

Figure 12:
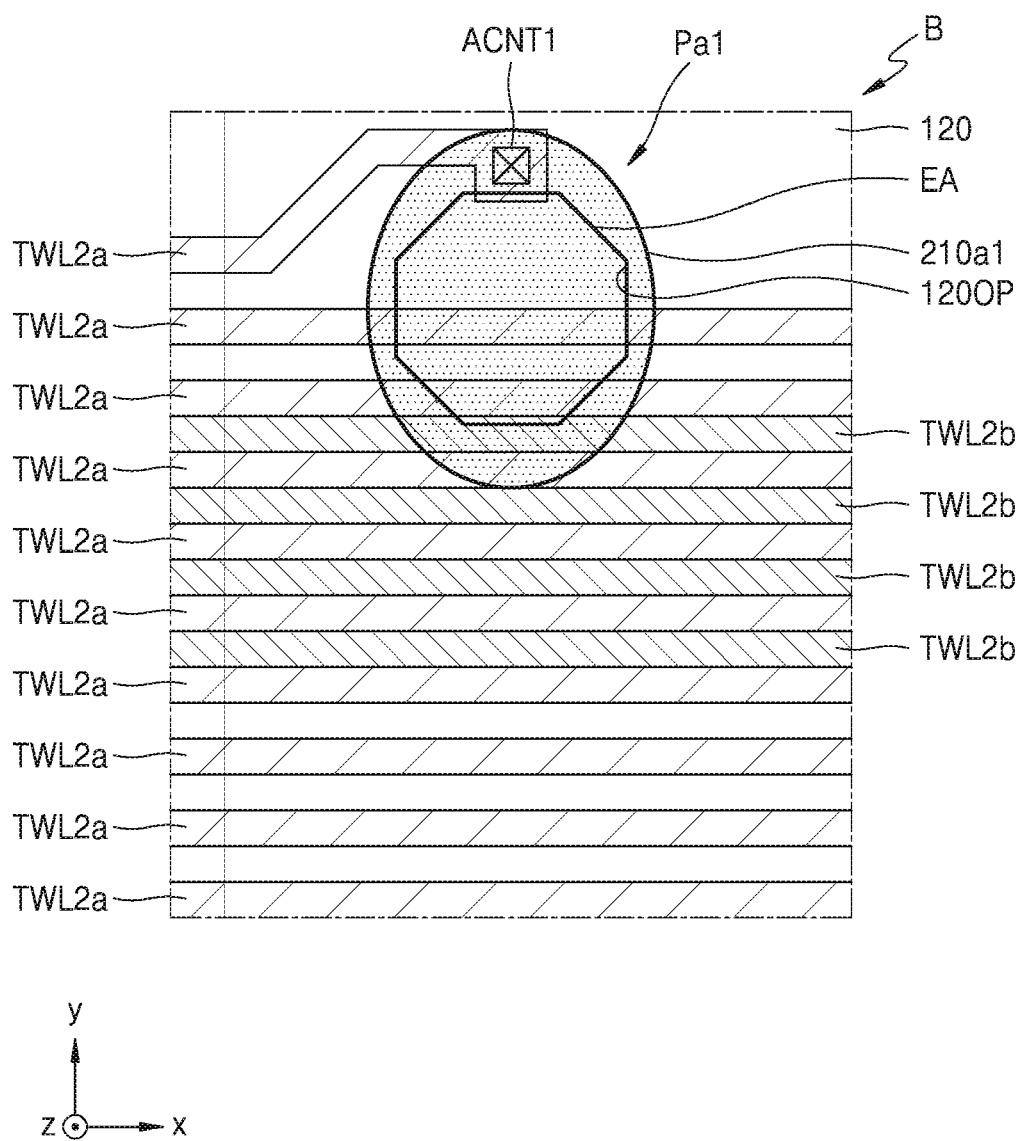

The first auxiliary sub-pixel Pa1 arranged on the component area CA may include a first auxiliary pixel electrode 210a1. Referring to FIG. 12, the first auxiliary pixel electrode 210a1 may have a shape of a curved line which does not include an edge or a corner at which a straight line meets a straight line. That is, in an embodiment, the present embodiment illustrates that the first auxiliary pixel electrode 210a1 is provided to have an oval shape. However, the disclosure is not limited thereto. The first auxiliary pixel electrode 210a1 may have a circular shape, an oval shape, a partial circular shape, or a partial oval shape. As described above, by forming the first auxiliary pixel electrode 210a1 to have the shape of the curved line, the diffraction of light passing through the transmission area TA of the component area CA may be minimized.

The second connecting line TWL2 may directly contact the first auxiliary pixel electrode 210a1 and may transmit a signal of the first auxiliary pixel circuit PCa1 located on the middle area MA to the first auxiliary pixel electrode 210a1. FIG. 12 illustrates that the 2-1$^{st}$ connecting line TWL2a may be connected to the first auxiliary pixel electrode 210a1. However, the first auxiliary pixel electrode 210a1 may be connected to the 2-2$^{nd}$ connecting line TWL2b.

The second connecting line TWL2 may be connected to the first auxiliary pixel electrode 210a1 through a first contact portion ACNT1. The first contact portion ACNT1 may be defined by an insulating layer arranged between the second connecting line TWL2 and the first auxiliary pixel electrode 210a1. In an embodiment, the first contact portion ACNT1 may be arranged at a side of the first auxiliary pixel electrode 210a1 and may overlap the first auxiliary pixel electrode 210a1. However, in this case, the first contact portion ACNT1 may not overlap an emission area EA of the first auxiliary sub-pixel Pa1. The emission area EA may be defined by an opening 1200P of the pixel-defining layer 120 arranged on the first auxiliary pixel electrode 210a1.

Because the first contact portion ACNT1 is arranged not to overlap the emission area EA, the deterioration of the flatness of the emission area EA due to the first contact portion ACNT1, which may cause distortion of color coordinates, may be prevented. As described above, because the first auxiliary pixel electrode 210a1 is provided to have an approximately oval shape, the first contact portion ACNT1 may be provided at a side of a major axis direction so that the first contact portion ACNT1 and the emission area EA may not overlap each other.

Referring back to FIG. 11, the second auxiliary sub-pixel Pa2 arranged on the middle area MA may include a second auxiliary pixel electrode 210a2. The second auxiliary pixel electrode 210a2 may be provided to have an approximately circular shape and may include an extension portion 210e extending in a direction. A second contact portion ACNT2 may be formed at an end of the extension portion 210e. The second auxiliary pixel circuit PCa2 may be connected to the second auxiliary pixel electrode 210a2 through the second contact portion ACNT2. Because the second auxiliary pixel electrode 210a2 includes the extension portion 210e extending in a direction, the second auxiliary pixel electrode 210a2 may be arranged not to completely overlap the second auxiliary pixel circuit PCa2 configured to drive the second auxiliary pixel electrode 210a2. That is, the second auxiliary pixel electrode 210a2 may be arranged partially overlap the second auxiliary pixel circuit PCa2.

In FIG. 11, the main display area MDA may contact the second area A2. A main pixel Pm and a main sub-pixel Pm connected thereto may be arranged on the main display area MDA. The main sub-pixel Pm may emit any one of red, green, blue, and white lights. In an embodiment, the main sub-pixel Pm may include a red main sub-pixel Pr, a green main sub-pixel Pg, and a blue main sub-pixel Pb.

The main sub-pixel Pm may include a main pixel electrode 210m. Similar to the second auxiliary pixel electrode 210a2, the main pixel electrode 210m may be provided to have an approximately circular shape and may have an extension portion 210e extending in a direction. A contact portion may be formed at an end of the extension portion 210e. A main pixel circuit PCm may be connected to the main pixel electrode 210m through the contact portion.

Each of the main pixel electrodes 210m of each of the main sub-pixels Pm may have a less area than the first auxiliary pixel circuit PCa1 and the second auxiliary pixel circuit PCa2 emitting the same color as each other. Thus, the number of main sub-pixels Pm arranged in the same area may be greater than the number of first auxiliary sub-pixels Pa1 and the number of second auxiliary sub-pixels Pa2. The resolution of the main pixel area MDA may be higher than the resolution of the auxiliary pixel area ADA.

As described above, the arrangement and the structure of the first auxiliary pixel electrode 210a1 and the second auxiliary pixel electrode 210a2 described with reference to FIG. 11 may be likewise applied to FIGS. 13, 14 and 15 described below.

Figure 13:
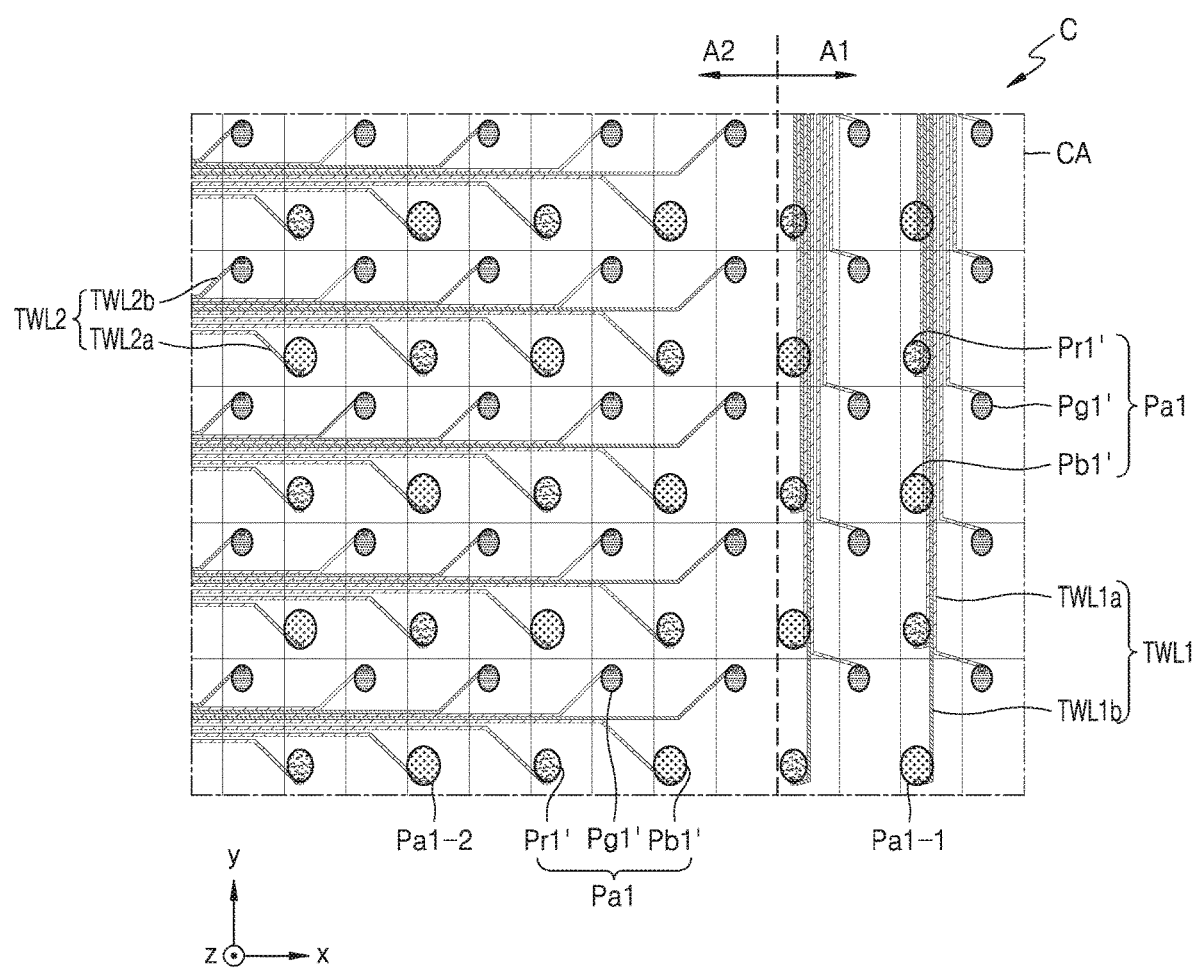

FIG. 13 may correspond to region C of FIG. 10. FIGS. 10, 11, 12, 13 illustrate the first area A1 and the second area A2 contacting the first area A1. The 1-1$^{st}$ auxiliary display element Pa1-1 may be arranged on the component area CA corresponding to the first area A1, and the 1-2$^{nd}$ auxiliary display element Pa1-2 may be arranged on the component area CA corresponding to the second area A2. The 1-1$^{st}$ auxiliary display element Pa1-1 may be connected to the 1-1$^{st}$ auxiliary pixel circuit PCa1-1 arranged on the middle area MA corresponding to the first area A1 through the first connecting line TWL1, and the 1-2$^{nd}$ auxiliary display element Pa1-2 may be connected to the 1-2$^{nd}$ auxiliary pixel circuit PCa1-2 arranged on the middle area MA corresponding to the second area A2 through the second connecting line TWL2.

The first connecting line TWL1 may extend in the y direction on the first area A1. Also, the second connecting line TWL2 may extend in the x direction on the second area A2.

Figure 14:
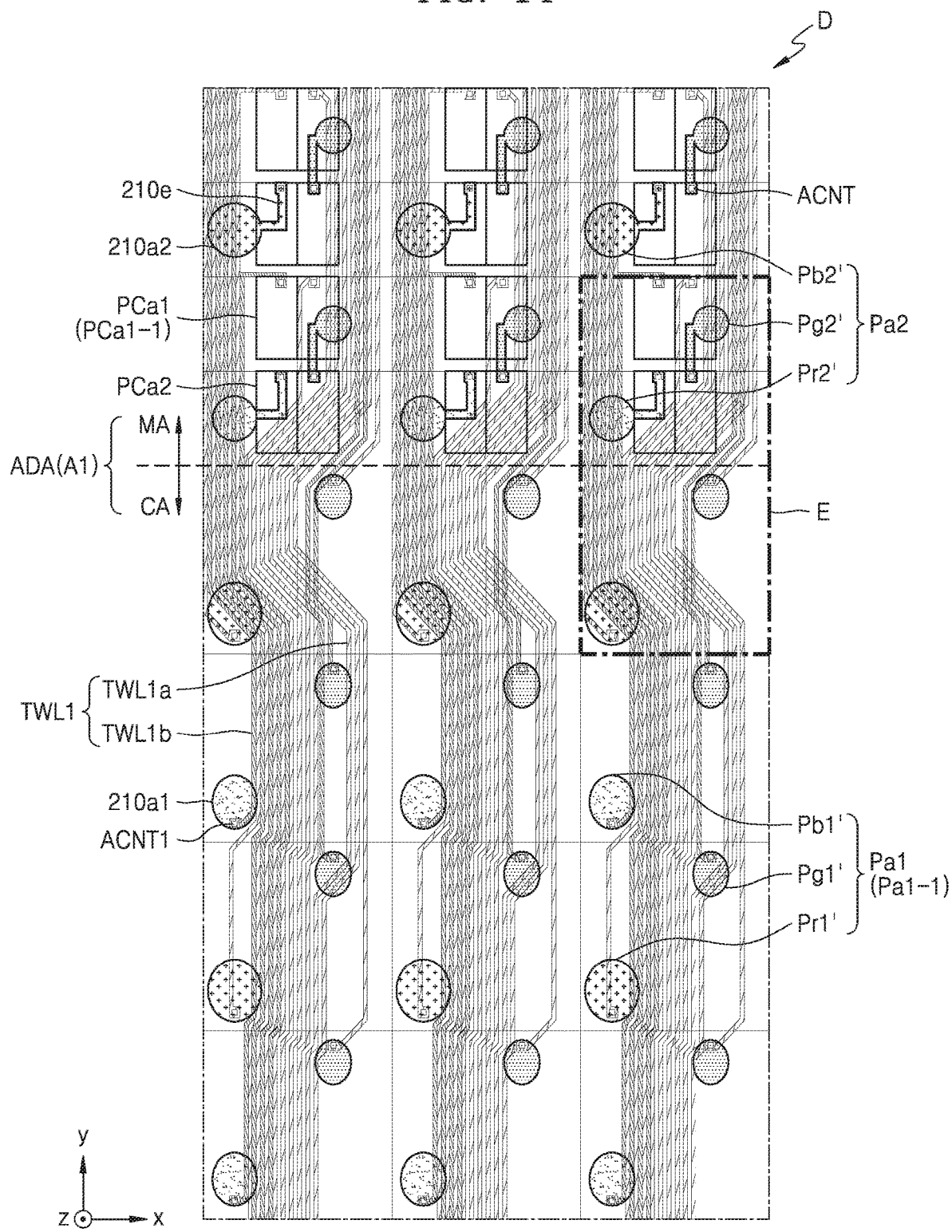
Figure 15:
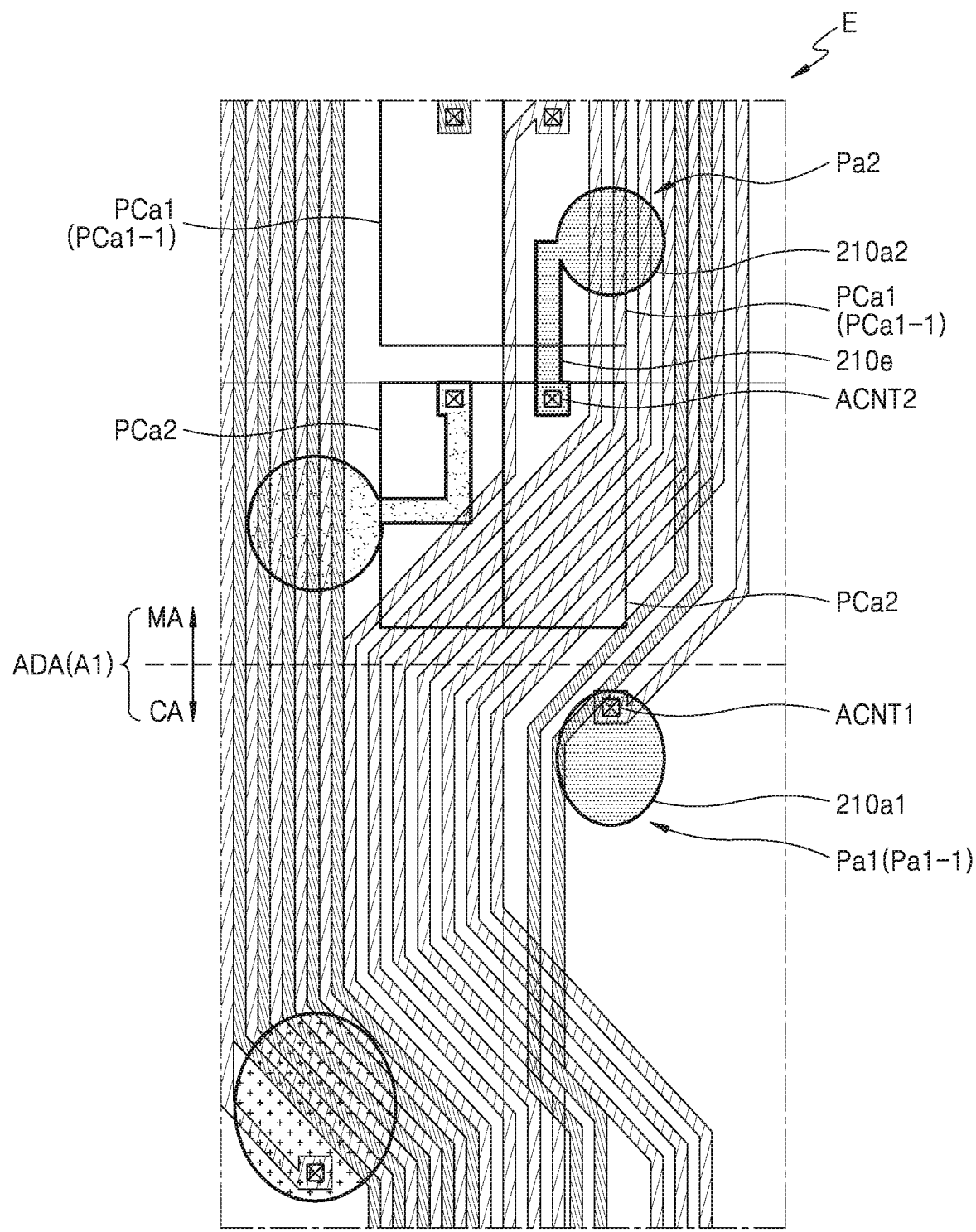

FIG. 14 may correspond to region D of FIG. 10, and FIG. 15 may correspond to region E of FIG. 14. FIGS. 14 and 15 are enlarged views of a portion of the first area A1.

Referring to FIGS. 10, 14, and 15, the first auxiliary sub-pixel Pa1 may be arranged on the component area CA corresponding to the first area A1. Here, the first auxiliary sub-pixel Pa1 may actually denote the 1-1$^{st}$ auxiliary display element Pa1-1 corresponding to a light-emitting device (that is, an organic light-emitting diode OLED). The first auxiliary sub-pixel Pa1 may emit any one of red, green, blue, and white lights. In an embodiment, the first auxiliary sub-pixel Pa1 may include a first red auxiliary sub-pixel Pr1', a first green auxiliary sub-pixel Pg1', and a first blue auxiliary sub-pixel Pb1'.

As illustrated in FIGS. 14 and 15, a pixel circuit configured to drive the 1-1st auxiliary display element Pa1-1 may not be arranged below the 1-1$^{st}$ auxiliary display element Pa1-1. In an embodiment, the 1-1$^{st}$ auxiliary pixel circuit PCa1-1 for driving the 1-1$^{st}$ auxiliary display element Pa1-1 may be arranged on the middle area MA corresponding to the first area A1.

The first connecting line TWL1 may be arranged to extend in the y direction. The 1-1$^{st}$ auxiliary pixel circuit PCa1-1 may be connected to the 1-1$^{st}$ auxiliary display element Pa1-1 through the first connecting line TWL1.

In an embodiment, the first connecting line TWL1 may include a 1-1$^{st}$ connecting line TWL1a and a 1-2$^{nd}$ connecting line TWL1b alternately arranged on a plane. The 1-1$^{st}$ connecting line TWL1a and the 1-2$^{nd}$ connecting line TWL1b may be arranged on different layers from each other. Based on this structure, a distance between the first connecting lines TWL1a and TWL1b may further be reduced, and thus, the resolution of the component area CA may be increased, and defects, such as a short phenomenon, etc., between the first connecting lines TWL1a and TWL1b may be prevented.

A second auxiliary sub-pixel Pa2 and a second auxiliary pixel circuit PCa2 may be arranged on the middle area MA corresponding to the first area A1. The second auxiliary sub-pixel Pa2 may emit any one of red, green, blue, and white light. In an embodiment, the second auxiliary sub-pixel Pa2 may include a second red auxiliary sub-pixel Pr2', a second green auxiliary sub-pixel Pg2', and a second blue auxiliary sub-pixel Pb2'.

The second auxiliary pixel circuit PCa2 may overlap the second auxiliary sub-pixel Pa2 or may be arranged to be adjacent to the second auxiliary sub-pixel Pa2. The second auxiliary sub-pixel Pa2 may be directly connected to the second auxiliary pixel circuit PCa2 without the second connecting line TWL2 for connecting the second auxiliary sub-pixel Pa2 with the second auxiliary pixel circuit PCa2.

The first auxiliary pixel circuit PCa1 and the second auxiliary pixel circuit PCa2 may be arranged on the middle area MA. In an embodiment, the first auxiliary pixel circuit PCa1 and the second auxiliary pixel circuit PCa2 may be arranged to be adjacent to each other and may be alternately arranged. As described above with reference to FIG. 6, etc., each of the first auxiliary pixel circuit PCa1 and the second auxiliary pixel circuit PCa2 may include a pair of two pixel circuits.

The first auxiliary sub-pixel Pa1 arranged on the component area CA may include a first auxiliary pixel electrode 210a1. In an embodiment, the first auxiliary pixel electrode 210a1 may be provided to have an approximately oval shape. As described above, by forming the first auxiliary pixel electrode 210a1 to have a shape of a curved line, the diffraction of light passing through the transmission area TA of the component area CA may be minimized. The second connecting line TWL2 may be connected to the first auxiliary pixel electrode 210a1 through a first contact portion ACNT1.

The second auxiliary sub-pixel Pa2 arranged on the middle area MA may include a second auxiliary pixel electrode 210a2. In an embodiment, the second auxiliary pixel electrode 210a2 may be provided to have an approximately circular shape and may include an extension portion 210e extending in a direction. A second contact portion ACNT2 may be formed at an end of the extension portion 210e. The second auxiliary pixel circuit PCa2 may be connected to the second auxiliary pixel electrode 210a2 through the second contact portion ACNT2.

As described above with reference to FIGS. 10, 11, 12, 13, 14, and 15, when connecting the first auxiliary sub-pixel Pa1 arranged on the component area CA with the pixel circuits PCa1-1, PCa1-2, PCa1-3, and PCa1-4 arranged on the middle area MA through the connecting lines TWL1, TWL2, TWL3, and TWL4, the component area CA and the middle area MA may be divided into the first through fourth areas A1, A2, A3, and A4, and the connecting lines TWL1, TWL2, TWL3, and TWL4 may be separately arranged in the y direction or the x direction on the first, second, third, and fourth areas A1, A2, A3, and A4. Thus, the transmittance may be selectively obtained on the component area CA, and thus, the general resolution may increase, and the general image quality of the display area DA may be improved. Additionally, by reducing the general length of the connecting lines TWL1, TWL2, TWL3, and TWL4, the thickness and the width of the connecting lines TWL1, TWL2, TWL3, and TWL4 may be reduced, to decrease the resistance of the connecting lines TWL1, TWL2, TWL3, and TWL4 and improve the display quality of the first auxiliary sub-pixel Pa1.

Figure 16:
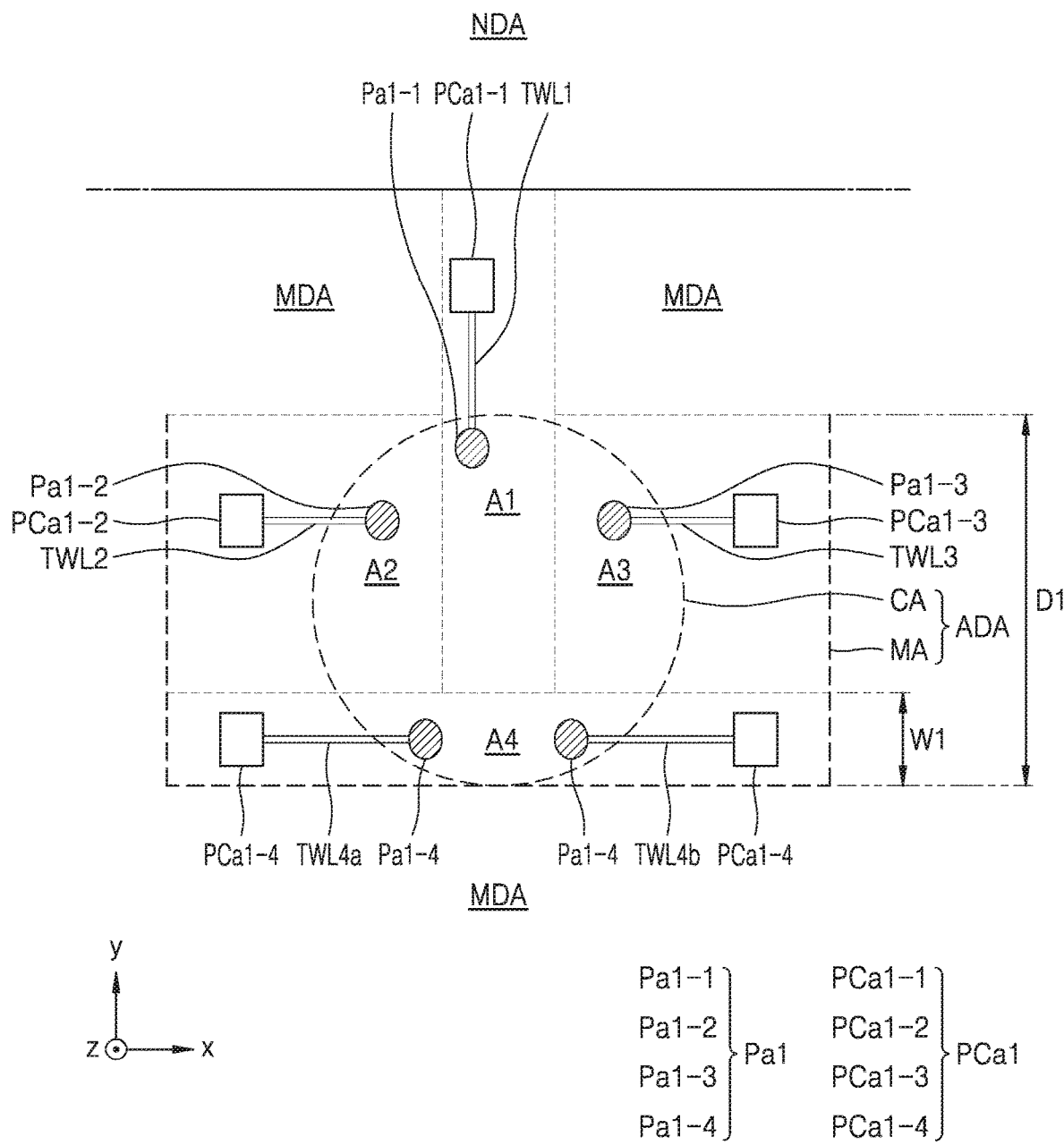
FIGS. 16 and 17 are schematic plan views of a portion of a display area of a display apparatus, the display area including an auxiliary display area, according to an embodiment.
Figure 17:
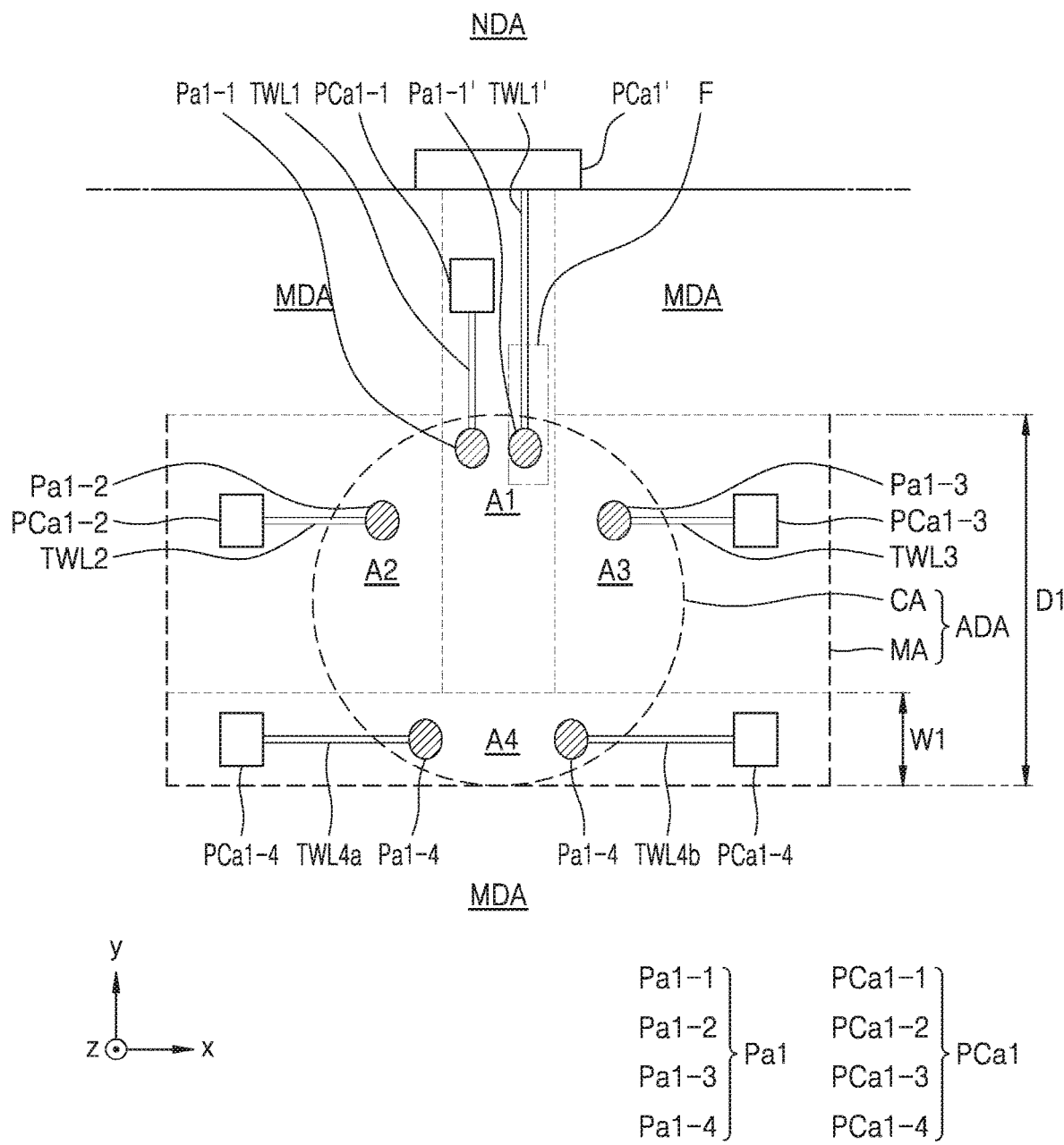

FIGS. 16 and 17 are schematic plan views of a portion of a display area of a display apparatus, the display area including an auxiliary display area ADA, according to an embodiment.

FIGS. 16 and 17 may correspond to a modified example of FIG. 10.

FIG. 16 is substantially the same as FIG. 10 described above, but is different from FIG. 10 in terms of a shape of the auxiliary display area ADA. Other structures of FIG. 16 except for the shape of the auxiliary display area ADA are the same as the structures of FIG. 10 described above. Thus, the same configurations in FIG. 10 are applied to FIG. 16, and the descriptions below are given based on differences.

The auxiliary display area ADA illustrated in FIG. 16 may correspond to the auxiliary display area ADA in FIG. 1B described above. The auxiliary display area ADA may be formed such that a width of a portion thereof toward the peripheral area NDA is less than a width of the other portion. Compared to FIG. 10, in the auxiliary display area ADA of FIG. 16, areas of the middle area MA corresponding to the second area A2 and the third area A3 may be reduced, and areas corresponding to the reduction may be provided as the main display area MDA. The resolution and the image quality of an image displayed on the main display area MDA may be higher than the resolution and the image quality of an image displayed on the auxiliary display area ADA. Accordingly, by increasing the main display area MDA, the general display quality of the display area DA may be increased.

FIG. 17 is substantially the same as FIGS. 10 and 16 described above, but is different from FIGS. 10 and 16 in that in FIG. 17, a third auxiliary pixel circuit PCa1' may be further provided on the peripheral area NDA. Other structures of FIG. 17 except for the third auxiliary pixel circuit PCa1' are equal to the structures of FIGS. 10 and 16 described above. Thus, the same configurations in FIGS. 10 and 16 are applied to FIG. 17, and the descriptions below are given based on differences.

The third auxiliary pixel circuit PCa1 may be arranged on the peripheral area NDA adjacent to the auxiliary display area ADA. In an embodiment, the third auxiliary pixel circuit PCa1' may be arranged to be adjacent to the first area A1 of the auxiliary display area ADA. The third auxiliary pixel circuit PCa1' may be connected to the 1-1$^{st}$ auxiliary sub-pixel Pa1-1' located on the component area CA corresponding to the first area A1 through a first connecting line TWL1'. As described above, the third auxiliary pixel circuit PCa1' may further be provided in addition to the 1-1$^{st}$ auxiliary pixel circuit PCa1-1 located on the middle area MA corresponding to the first area A1, and thus, a width of the middle area MA corresponding to the first area A1 may further be reduced, and an area of the main display area MDA may correspondingly increase.

Figure 18:
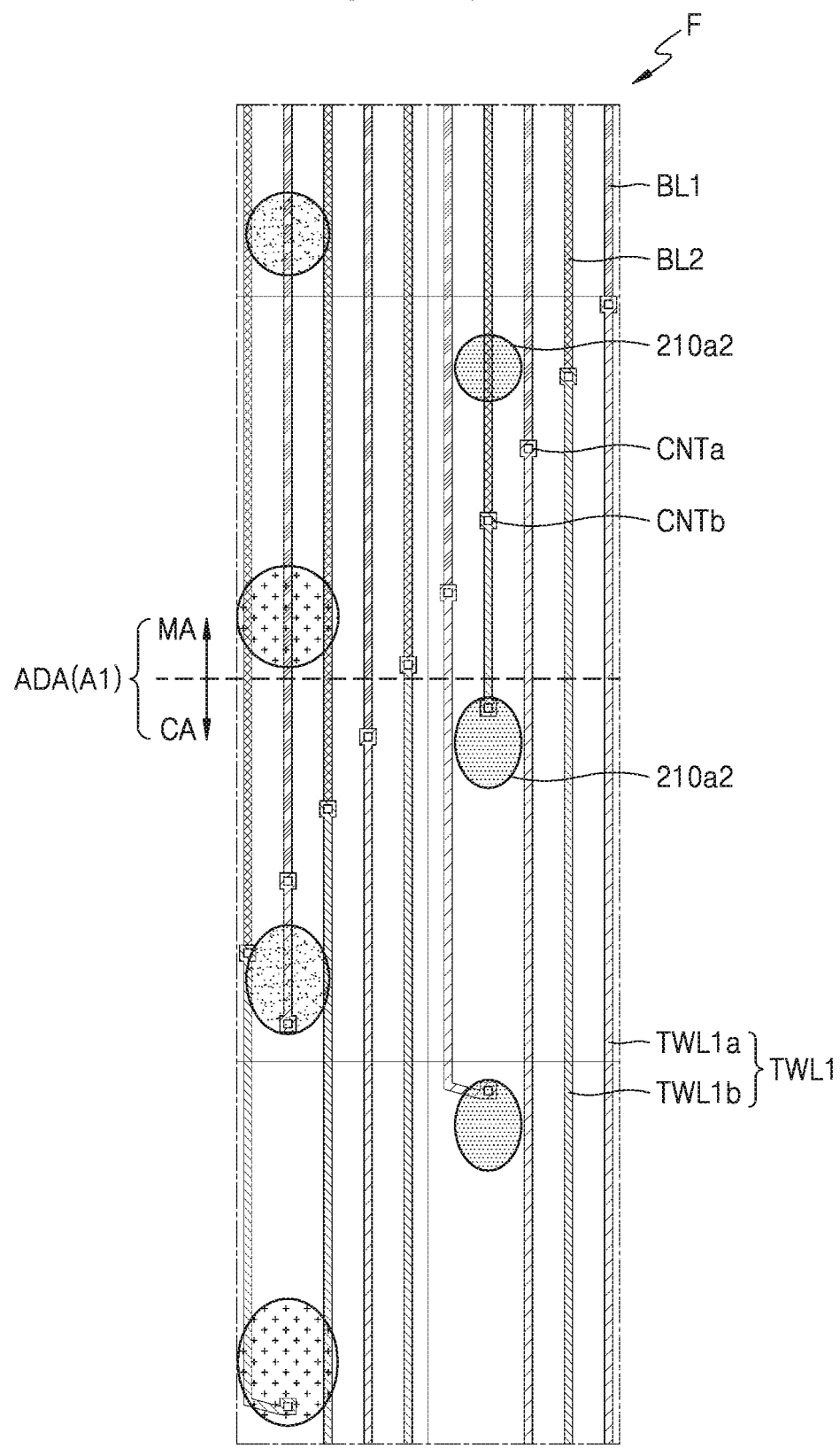
FIG. 18 is a schematic enlarged plan view of region F of FIG. 17.

FIG. 18 is a schematic enlarged plan view of region F of FIG. 17.

Referring to FIG. 18, a first conductive line BL1 and a second conductive line BL2 may be located to correspond to at least a portion of the middle area MA corresponding to the first area A1. The first conductive line BL1 and the second conductive line BL2 may continually extend in the y direction along the first connecting line TWL1. In an embodiment, the first conductive line BL1 and the second conductive line BL2 may be arranged on different layers from each other and may be alternately arranged without overlapping each other on a plane, as illustrated in FIG. 18.

In an embodiment, the first conductive line BL1 and the second conductive line BL2 may include a reflective metal, for example, Ag, an alloy including Ag, Mo, an alloy including Mo, Al, an alloy including Al, AlN, W, WN, Cu, Ni, Cr, CrN, Ti, Ta, Pt, Sc, ITO, IZO, etc.

In the first area A1, unlike the component area CA, the middle area MA may not include the transmission area TA, and thus, the first conductive line BL1 and the second conductive line BL2 including a reflective metal having a relatively lower resistance may be arranged on the middle area MA, and the first connecting line TWL1 including a conductive material having a relatively higher resistance but having a transmittance may be arranged on the component area CA.

In an embodiment, the first connecting line TWL1 may include a 1-1$^{st}$ connecting line TWL1a and a 1-2$^{nd}$ connecting line TWL1b arranged on different layers from each other. The 1-1$^{st}$ connecting line TWL1a may be connected to the first conductive line BL1 through a first contact portion CNTa, and the 1-2$^{nd}$ connecting line TWL1b may be connected to the second conductive line BL2 through a second contact portion CNTb. For example, the 1-1$^{st}$ connecting line TWL1a and the first conductive line BL1 may be connected to each other with an insulating layer therebetween, through the first contact portion CNTa defined on the insulating layer, or the 1-1$^{st}$ connecting line TWL1a and the first conductive line BL1 may be directly connected to each other without the insulating layer therebetween. Similarly, the 1-2$^{nd}$ connecting line TWL1b and the second conductive line BL2 may be connected to each other with an insulating layer therebetween, through the second contact portion CNTb defined on the insulating layer, or the 1-2$^{nd}$ connecting line TWL1b and the second conductive line BL2 may be directly connected to each other without the insulating layer therebetween.

Referring to FIG. 9 described above together with FIG. 18, the first conductive line BL1 may be arranged on the third interlayer insulating layer 116 and may include the same material as the first electrode layers S1 and D1 and the second electrode layers S2 and D2. The second conductive line BL2 may be arranged on the first organic insulating layer 117 and may include the same material as the contact metal layer CM. Although not shown in FIG. 9, the 1-1$^{st}$ connecting line TWL1a may be arranged on the third interlayer insulating layer 116 which is on the same layer as the first electrode layers S1 and D1 and the second electrode layers S2 and D2, and the 1-2$^{nd}$ connecting line TWL1b may be arranged on the second organic insulating layer 118. This aspect will be described in detail below with reference to FIGS. 21 and 22.

The connection structure including the first conductive line BL1 and the second conductive line BL2, described above with reference to FIG. 18, may not only be applied to the first area A1, but may also be applied to the second area A2, the third area A3, and the fourth area A4 in the same manner. Also, FIG. 18 is illustrated and described as corresponding to region F of FIG. 17, but may also be applied to region D of FIG. 10 in the same manner.

Figure 19:
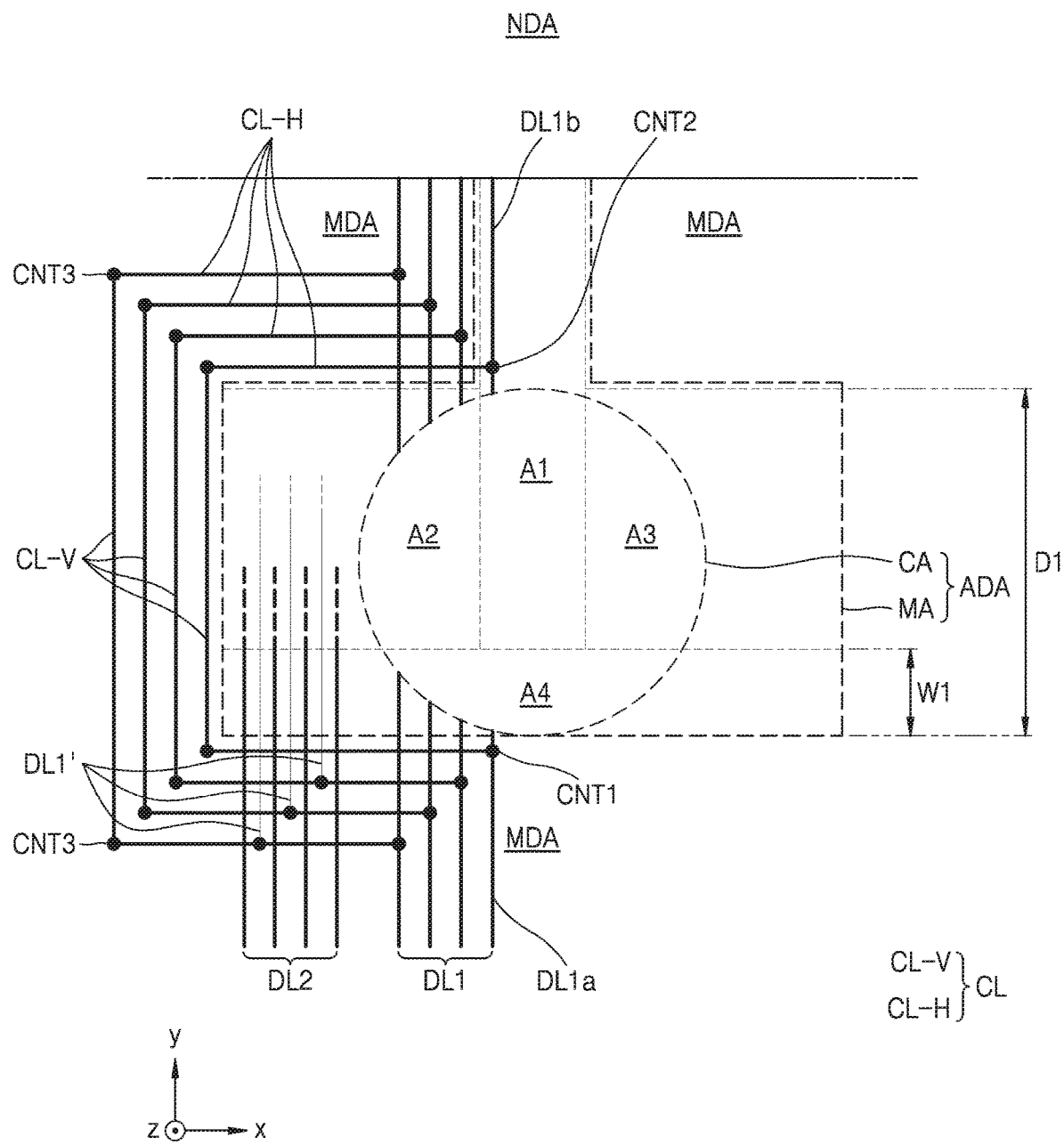
FIG. 19 is an enlarged plan view of a portion of a display apparatus according to an embodiment.
Figure 20:
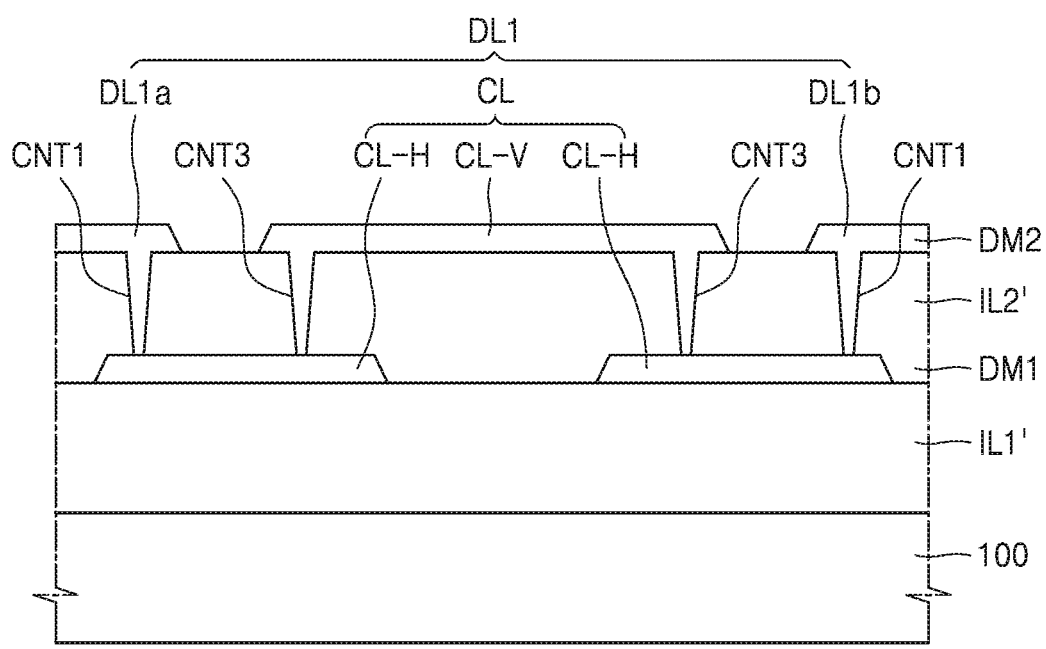
FIG. 20 is a schematic cross-sectional view of a signal transmission line of FIG. 19.

FIG. 19 is an enlarged plan view of a portion of a display apparatus according to an embodiment, and FIG. 20 is a schematic cross-sectional view of a signal transmission line of FIG. 19.

Referring to FIG. 19, first and second data lines DL1 and DL2 extending in the y direction and spaced apart from each other may be arranged on the display area DA. Each of the first and second data lines DL1 and DL2 may supply a data signal to the sub-pixels Pm, Pa1, and Pa2 of the display area DA.

The first data line DL1 may be disconnected by the component area CA of the auxiliary display area ADA. That is, while the first data line DL1 may be arranged on the main display area MDA toward the auxiliary display area ADA, the first data line DL1 may not pass through the component area CA.

In an embodiment, the first data line DL1 may include a first line DL1a and a second line DL1b spaced apart from each other with the component area CA therebetween. Based on the component area CA, the first line DL1a may be arranged below the component area CA (for example, −y direction), and the second line DL1b may be arranged above the component area CA (for example, +y direction). The first line DL1a may be connected to the main sub-pixel Pm arranged below the component area CA, and the second line DL1b may be connected to the main sub-pixel Pm (or the second pixel P2) arranged above the component area CA, so that each of the first line DL1a and the second line DL1b may transmit a data signal.

The second data line DL2 may be arranged throughout the main display area MDA and the middle area MA. That is, the second data line DL2 may be located not to overlap the component area CA. The second data line DL2 may transmit a data signal to the main sub-pixel Pm located on the main display area MDA and the second auxiliary sub-pixel Pa2 located on the middle area MA.

The first auxiliary sub-pixel Pa1 arranged on the component area CA may receive various signals including the data signal through the first through fourth connecting lines TWL1, TWL2, TWL3, and TWL4, as described above with reference to FIGS. 10, 11, 12, 13, 14, and 15.

A signal transmission line CL may be provided on the middle area MA adjacent to the component area CA and/or the main display area MDA to bypass the component area CA. The signal transmission line CL may connect the first data line DL1 that is disconnected by the component area CA, so that a data signal input into the first line DL1a may be transmitted to the second line DL1b. To this end, an end of the signal transmission line CL may be connected to the first line DL1a through a first contact hole CNT1, and the other end of the signal transmission line CL may be connected to the second line DL1b through a second contact hole CNT2.

In an embodiment, the first data line DL1 and the signal transmission line CL may be arranged on different layers from each other and may be electrically connected to each other through the contact hole. The signal transmission line CL may include a first signal transmission line CL-H extending in an x direction and a second signal transmission line CL-V extending in a y direction. The first signal transmission line CL-H and the second signal transmission line CL-V may be arranged on different layers from each other and may be connected to each other through a third contact hole CNT3.

A data transmission line DL1' configured to supply a data signal to the first auxiliary pixel circuit PCa1 located on the middle area MA may be connected to the signal transmission line CL. The data transmission line DL1' may extend in the y direction and may be connected to the signal transmission line CL (that is, the first signal transmission line CL-H). Thus, the data signal transmitted through the first data line DL1 may be provided to the data transmission line DL1'.

Referring to FIGS. 19 and 20 together, a first insulating layer IL1' and a second insulating layer IL2' may be arranged on the substrate 100, the first signal transmission line CL-H may be arranged on the first insulating layer IL1', and the first data line DL1 and the second signal transmission line CL-V may be arranged on the second insulating layer IL2'. Referring to FIG. 9 described above, the first insulating layer IL1' may correspond to the third interlayer insulating layer 116, and the second insulating layer IL2' may correspond to the first organic insulating layer 117.

The first data line DL1 may include the first line DL1a and the second line DL1b apart from each other with the component area CA therebetween. The first line DL1a and the second line DL1b may be arranged on the second insulating layer IL2'. The first line DL1a and the second line DL1b may be electrically connected to the first signal transmission line CL-H located on the first insulating layer IL1' through the first contact hole CNT1 and the second contact hole CNT2, respectively, defined in the second insulating layer IL2'.

The first signal transmission line CL-H may be arranged on the first insulating layer IL1'. The first signal transmission line CL-H may be arranged above and below the component area CA, as illustrated in FIG. 19.

The first signal transmission line CL-H above and below the component area CA may be connected to the second signal transmission line CL-V located on the second insulating layer IL2' through the third contact hole CNT3 defined in the second insulating layer IL2'. That is, as described with reference to FIGS. 6, and 7A, 7B, 7C, 7D, 7E, 7F, and 7G, the first signal transmission line CL-H may correspond to the first signal transmission line 1610 of FIG. 7F, and the second signal transmission line CL-V may correspond to the second signal transmission line 1720 of FIG. 7G.

Although not illustrated in FIG. 19, as illustrated in FIG. 20, dummy lines (not shown) spaced apart from the first signal transmission line CL-H and the second signal transmission line CL-V, respectively, may be arranged on the same layers as the first signal transmission line CL-H and the second signal transmission line CL-V, respectively. The dummy lines may be formed by the same process as the first signal transmission line CL-H and the second signal transmission line CL-V. The dummy lines may indicate portions of the first signal transmission line 1610 of FIG. 7F and the second signal transmission line 1720 of FIG. 7G, the portions not being used as the substantial signal transmission line CL and remaining. Thus, the first signal transmission line CL-H, the second signal transmission line CL-V, and the dummy lines may be disconnected from one another around the third contact portion CNT3. In an embodiment, by applying a voltage to the dummy lines, static electricity in the pixel circuit may be prevented, the dummy lines may be used as electrodes.

Figure 21:
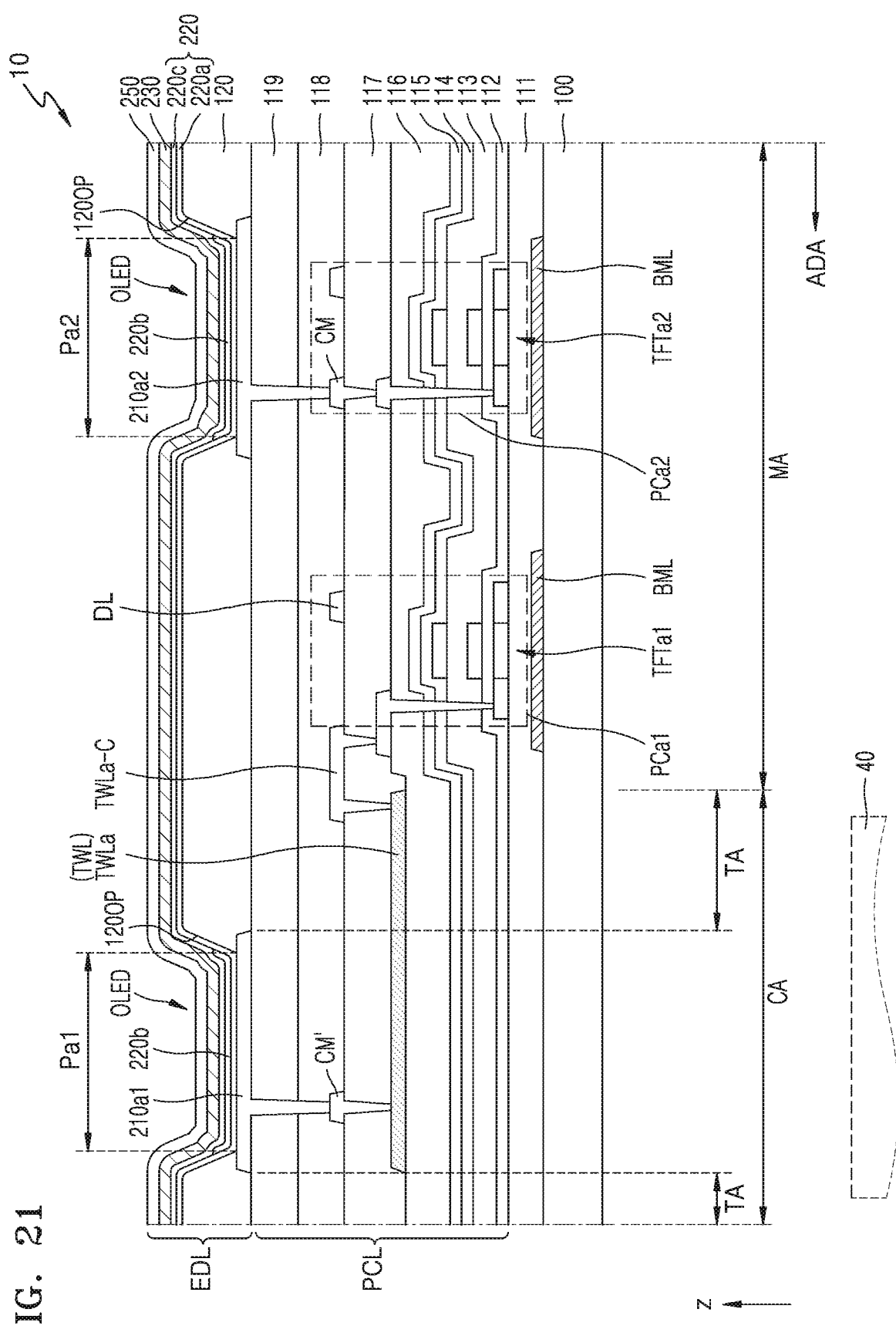
FIGS. 21, 22, and 23 are schematic cross-sectional views of a portion of an auxiliary display area of a display apparatus according to an embodiment.
Figure 22:
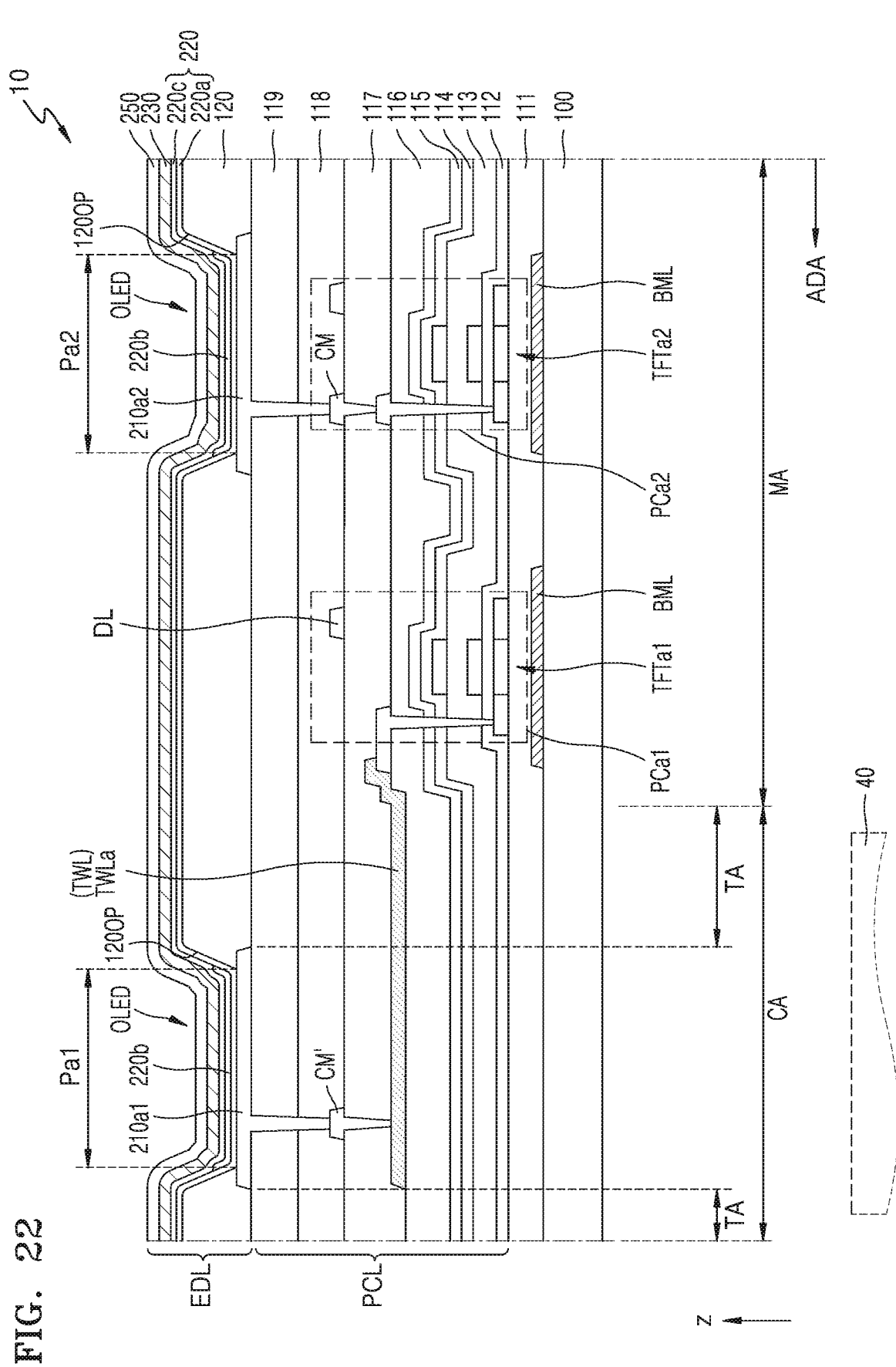
Figure 23:
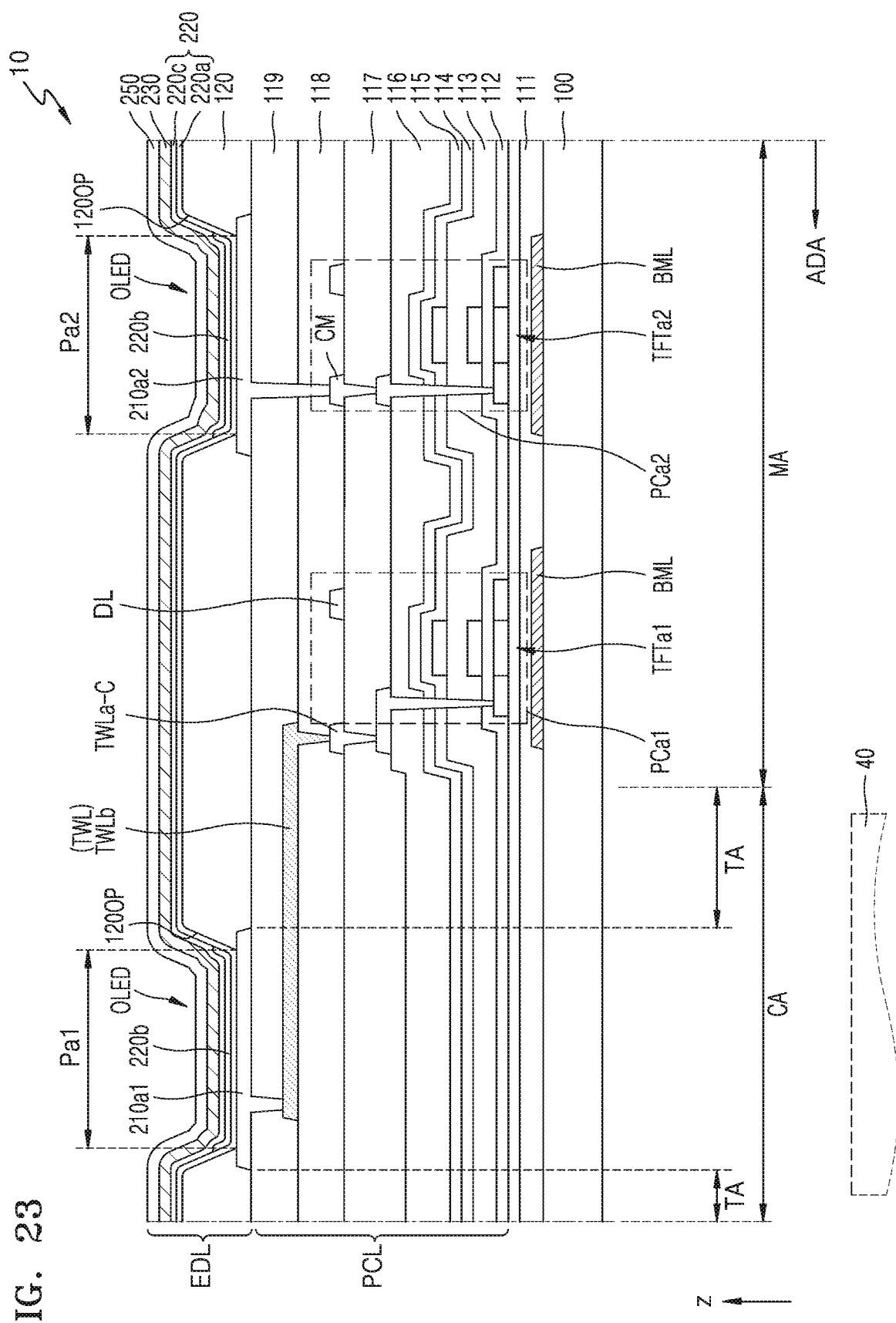

FIGS. 21, 22, and 23 are schematic cross-sectional views of a portion of an auxiliary display area of a display apparatus according to an embodiment.

Referring to FIG. 21, the first auxiliary sub-pixel Pa1 may be arranged on the component area CA of the auxiliary display area ADA, and the second auxiliary sub-pixel Pa2 may be arranged on the middle area MA of the auxiliary display area ADA. The first auxiliary pixel circuit PCa1 and the second auxiliary pixel circuit PCa2 may be arranged on the middle area MA. The first auxiliary pixel circuit PCa1 and the second auxiliary pixel circuit PCa2 may be arranged to be adjacent to each other. The first auxiliary pixel circuit PCa1 and the second auxiliary pixel circuit PCa2 may be provided in a multiple number and may be alternately arranged. In FIG. 21, for convenience of explanation and illustration, it is illustrated that a first thin-film transistor TFT1 and a second thin-film transistor TFT2 are included in the first auxiliary pixel circuit PCa1 and the second auxiliary pixel circuit PCa2, respectively, as silicon thin-film transistors. However, in detail, the first auxiliary pixel circuit PCa1 and the second auxiliary pixel circuit PCa2 may implement the arrangement structure of FIGS. 6, 7A, 7B, 7C, 7D, 7E, 7F, and 7G, FIG. 9, or FIG. 10 described above. Thus, descriptions of the first auxiliary pixel circuit PCa1 and the second auxiliary pixel circuit PCa2 are the same as the descriptions of FIG. 9 or FIG. 10.

The first auxiliary sub-pixel Pa1 may be driven by the first auxiliary pixel circuit PCa1 arranged on the middle area MA, and the second auxiliary sub-pixel Pa2 may be driven by the second auxiliary pixel circuit PCa2 arranged on the middle area MA.

The first auxiliary sub-pixel Pa1 may be connected to the first auxiliary pixel circuit PCa1 through the connecting line TWL. A side of the connecting line TWL may be connected to the first auxiliary pixel circuit PCa1, and the other side of the connecting line TWL may be connected to the first auxiliary pixel electrode 210a1. A contact electrode layer CM' may be arranged between the connecting line TWL and the first auxiliary pixel electrode 210a1, and thus, through the contact electrode layer CM', the connecting line TWL and the first auxiliary pixel electrode 210a1 may be electrically connected to each other.

In an embodiment, as illustrated in FIG. 21, the connecting line TWL may include a first transmissive conductive layer TWLa arranged on the third interlayer insulating layer 116. The first transmissive conductive layer TWLa may be connected to the first auxiliary pixel circuit PCa1 through a conductive line TWLa-C. For example, the conductive line TWLa-C of FIG. 21 may correspond to the first conductive line BL1 or the second conductive line BL2 of FIG. 18 described above. In another embodiment, as illustrated in FIG. 22, the conductive line TWLa-C may not be provided, and the first transmissive conductive layer TWLa may be directly connected to the first auxiliary pixel circuit PCa1.

Referring to FIG. 23, the first auxiliary sub-pixel Pa1 may be connected to the first auxiliary pixel circuit PCa1 through the connecting line TWL. The connecting line TWL of FIG. 23 may include a second transmissive conductive layer TWLb arranged on the second organic insulating layer 118. The second transmissive conductive layer TWLb may be connected to the first auxiliary pixel circuit PCa1 through a conductive line TWLb-C. For example, the conductive line TWLb-C of FIG. 23 may correspond to the first conductive line BL1 or the second conductive line BL2 described above.

The connecting line TWL illustrated in FIGS. 21, 22, and 23 may correspond to one of the first, second, third, and fourth connecting lines TWL1, TWL2, TWL3, and TWL4 described above with reference to the drawings. The first transmissive conductive layer TWLa and the second transmissive conductive layer TWLb arranged on different layers from each other may respectively correspond to the 1-1$^{st}$ connecting line TWL1a and the 1-2$^{nd}$ connecting line TWL1b and the 2-1$^{st}$ connecting line TWL2a and the 2-2$^{nd}$ connecting line TWL2b, described above with reference to the drawings.

The descriptions are given above mainly with respect to the display apparatus. However, the disclosure is not limited to the display apparatus. That is, a method of manufacturing the display apparatus may also be included in the scope of the disclosure.

FIGS. 24A, 24B, 24C, and 24D are schematic cross-sectional views for describing a portion of a manufacturing process of a display apparatus, according to an embodiment.

FIGS. 24A, 24B, 24C, and 24D illustrate the cross-sectional structure of the devices located on the substrate 100 described above with reference to FIG. 9. Hereinafter, while descriptions are given based on a stacked structure, the descriptions will be focused on the characteristics of the manufacturing process. Aspects that are the same as the aspects described above will be understood by referring to the descriptions with reference to FIGS. 1 through 23.

First, as illustrated in FIG. 9, the substrate 100 including the main display area MDA and the auxiliary display area ADA including the component area CA and the middle area MA may be prepared. A structure of a pixel circuit PC corresponding to the manufacturing process of FIGS. 24A, 24B, 24C, and 24D may be formed on the main display area MDA and the middle area MA.

Figure 24A:
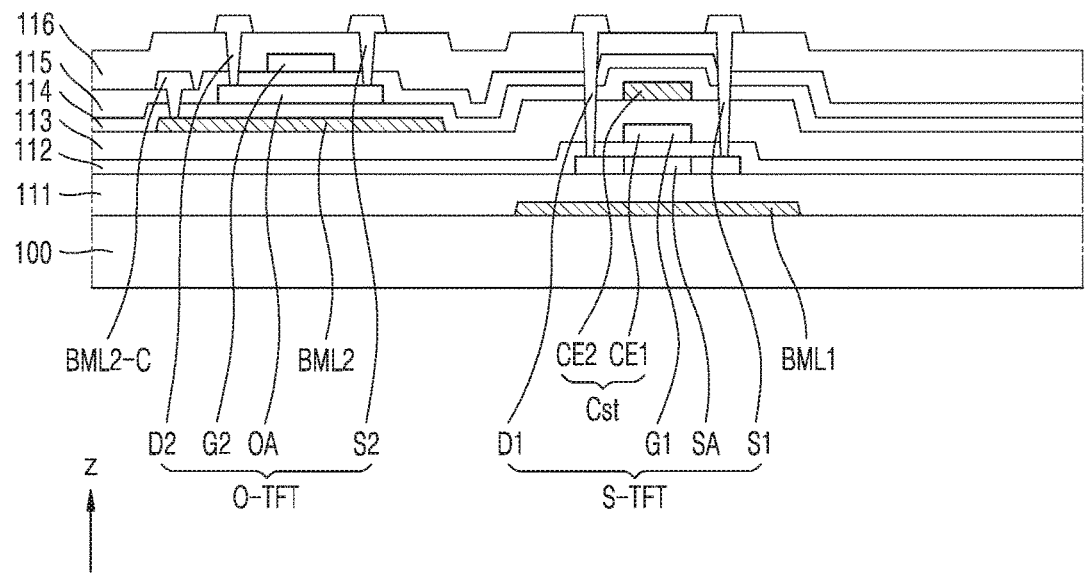
FIGS. 24A, 24B, 24C, and 24D are schematic cross-sectional views for showing a manufacturing process of a display apparatus according to an embodiment.

Referring to FIG. 24A, the first bottom surface metal layer BML1 may be formed on the substrate 100. The first bottom surface metal layer BML1 may be arranged to correspond to at least a portion of the pixel circuit PC, as described with reference to FIG. 9 or 10. In an embodiment, the first bottom surface metal layer BML1 may be arranged to overlap the driving thin-film transistor T1 (see FIG. 5) provided as the silicon thin-film transistor S-TFT.

The buffer layer 111 may be formed on the first bottom surface metal layer BML1. The first bottom surface metal layer BML1 may be formed to overlap the silicon semiconductor layer SA to be subsequently formed.

After the silicon semiconductor layer SA is formed on the buffer layer 111, the first gate electrode G1 may be formed to overlap the silicon semiconductor layer SA. Before the first gate electrode G1 is formed, the first gate insulating layer 112 may be formed on the silicon semiconductor layer SA.

After the second gate insulating layer 113 is formed to cover the first gate electrode G1, the upper electrode CE2 of the storage capacitor Cst may be formed on the second gate insulating layer 113. The lower electrode CE1 which is integrally formed with the first gate electrode G1, and the upper electrode CE2 may form the storage capacitor Cst.

Simultaneously with the process of forming the upper electrode CE2, a process of forming the second bottom surface metal layer BML2 on a side of the silicon thin-film transistor SA may be performed. The second bottom surface metal layer BML2 may be formed to overlap the oxide semiconductor layer OA subsequently formed.

After the first interlayer insulating layer 113 is formed to cover the upper electrode CE2 and the second bottom surface metal layer BML2, the oxide semiconductor layer OA may be formed on the first interlayer insulating layer 113. The second interlayer insulating layer 114 may be formed on the oxide semiconductor layer OA, and the second gate electrode G2 may be formed on the second interlayer insulating layer 114 to overlap the oxide semiconductor layer OA. Simultaneously with the manufacturing process of the second gate electrode G2, a process of forming the contact electrode BML2-C on a side of the second gate electrode G2 may be performed. The contact electrode BML2-C may be integrally formed with the gate electrode G2 or may be separately formed from the gate electrode G2. In an embodiment, the contact electrode BML2-C may be connected to the second bottom surface metal layer BML2 therebelow to form a vertical gate connection structure.

Thereafter, the third interlayer insulating layer 116 may be formed on the second gate electrode G2. Thereafter, contact holes exposing portions of the silicon semiconductor layer SA and the oxide semiconductor layer OA, respectively, may be formed in the insulating layers, and then, the first electrode layers S1 and D1 and the second electrode layers S2 and D2 may be formed on the third interlayer insulating layer 116.

Figure 24B:
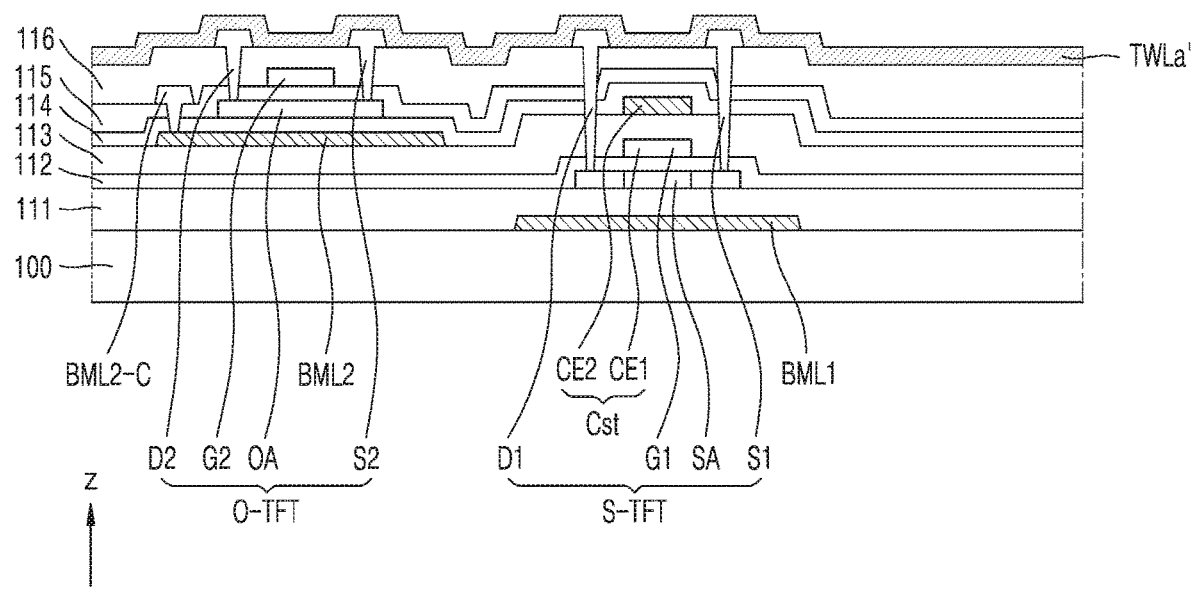
Figure 24C:
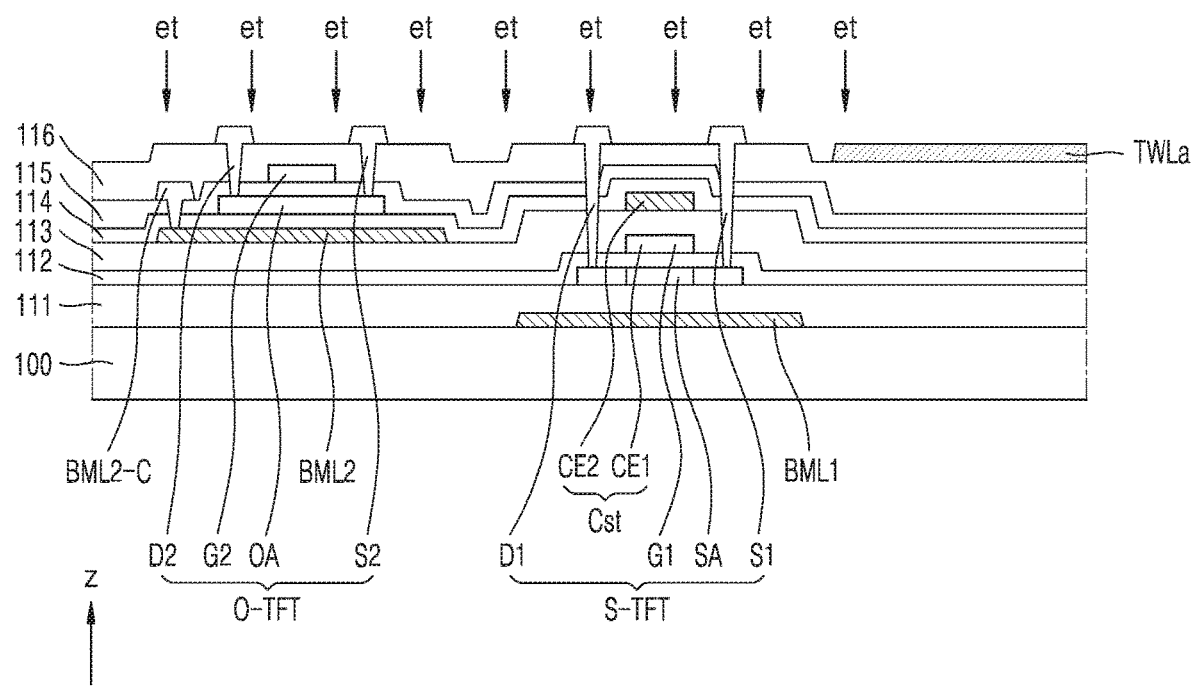

Thereafter, as illustrated in FIGS. 24B and 24C, the first transmissive conductive layer TWLa may be formed on the same layer as the first electrode layers S1 and D1 and the second electrode layers S2 and D2. Here, that two layers are formed on the same layer may denote that no insulating layer is arranged between the two layers, which are conductive layers. Thus, the first transmissive conductive layer TWLa may be formed on the third interlayer insulating layer 116 like the first electrode layers S1 and D1 and the second electrode layers S2 and D2.

Referring to FIG. 24B, a first transmissive conductive material layer TWLa' may be formed on the third interlayer insulating layer 116. The first transmissive conductive material layer TWLa' may cover the first electrode layers S1 and D1 and the second electrode layers S2 and D2 and may be formed on the entire surface of the third interlayer insulating layer 116.

Thereafter, as illustrated in FIG. 24C, except for a portion that is formed as the first transmissive conductive layer TWLa, the other portions may be patterned, for example, wet-etched, by using an etchant et. Here, the etchant et used in this process may not etch the first electrode layers S1 and D1 and the second electrode layers S2 and D2 and may selectively etch only the first transmissive conductive material layer TWLa'.

As described above with reference to the drawings, the first transmissive conductive layer TWLa and the second transmissive conductive layer TWLb to be described below with reference to FIG. 24D may include a transmissive conductive material, such as IGZO, ITO, IZO, etc., and the first electrode layers S1 and D1 and the second electrode layers S2 and D2 may include a reflective metal material, such as Ti/Al/Ti, Mo/Al/Mo, etc. Thus, the etchant et for etching the first transmissive conductive layer TWLa and the second transmissive conductive layer TWLb may be different from an etchant for etching the first electrode layers S1 and D1 and the second electrode layers S2 and D2, and the etchant et may be selected as a material not damaging the first electrode layers S1 and D1 and the second electrode layers S2 and D2.

Figure 24D:
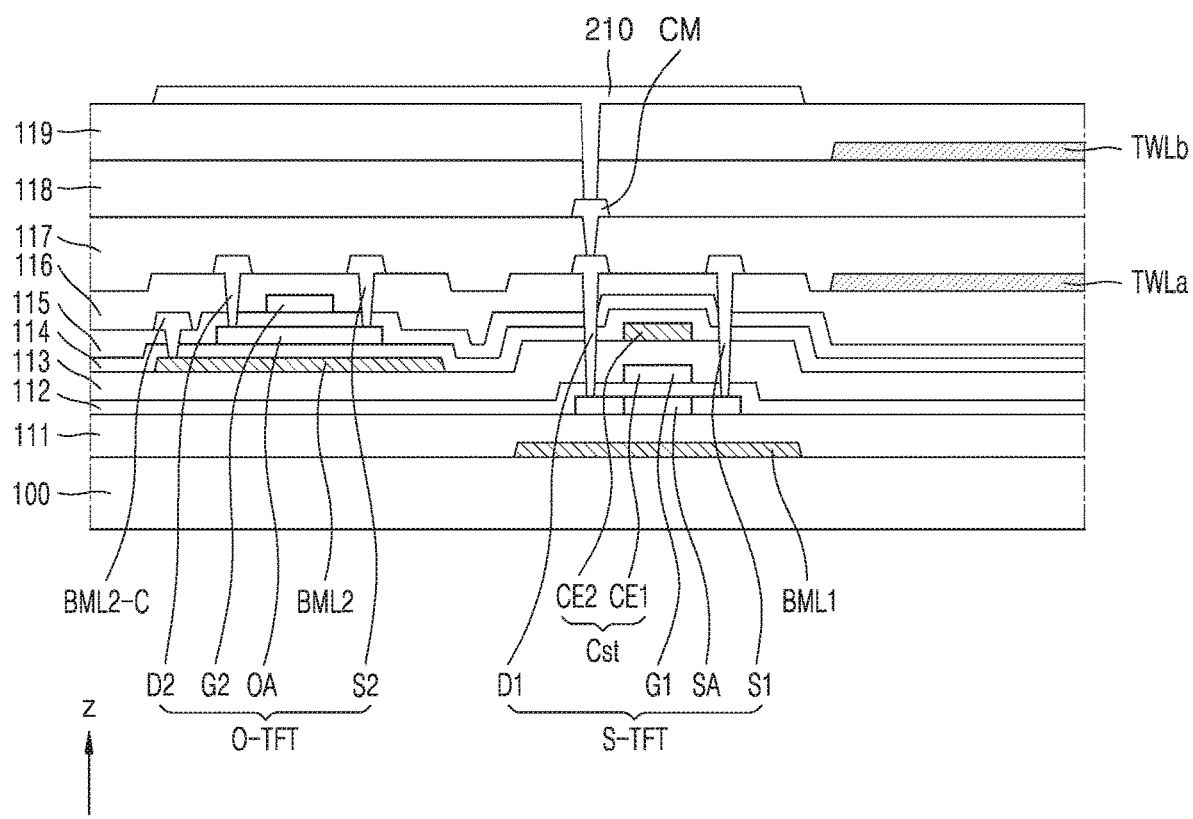

Then, as illustrated in FIG. 24D, the first organic insulating layer 117 disposed on the first transmissive conductive layer TWLa, the contact electrode layer CM on the first organic insulating layer 117, and the second organic insulating layer 118 on the contact electrode layer CM may be sequentially formed. The second transmissive conductive layer TWLb may be formed on the second organic insulating layer 118. The etchant used for forming the second transmissive conductive layer TWLb may be the same as the etchant et for etching the first transmissive conductive layer TWLa.

The third organic insulating layer 119 may be formed on the second transmissive conductive layer TWLb, and the pixel electrode 210 may be formed on the third organic insulating layer 119. Then, the structure of the organic light-emitting diode OLED and the structure of the upper layer 250 may be formed on the pixel electrode 210.

As described above, according to the one or more of the above embodiments of the disclosure, a display apparatus may be realized, in which while a high quality image is provided, an image quality output through a component is improved. However, the scope of the disclosure is not limited to the effect described above.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
a substrate including a main display area and an auxiliary display area, the auxiliary display area including a component area corresponding to an area where an electronic component is arranged and a middle area;
a main pixel circuit and a main display element connected to the main pixel circuit, wherein each of the main pixel circuit and the main display element is arranged on the main display area;
a first auxiliary display element arranged on the component area;
a first auxiliary pixel circuit, a second auxiliary pixel circuit, and a second auxiliary display element connected to the second auxiliary pixel circuit, wherein the first auxiliary pixel circuit, the second auxiliary pixel circuit, and the second auxiliary display element are arranged on the middle area; and
a connecting line connecting the first auxiliary display element to the first auxiliary pixel circuit,
wherein the auxiliary display area includes:
a first area including a central portion of the component area and a portion of the middle area; and
a second area at a side of the first area, the second area including a portion of the component area and a portion of the middle area, and
the connecting line includes a first connecting line and a second connecting line arranged on the first area and the second area, respectively, wherein the first connecting line extends in a first direction, and the second connecting line extends in a second direction crossing the first direction,
wherein the first connecting line is connected to a first conductive line or a second conductive line which are disposed in a portion of the middle area of the first area, and
wherein the first conductive line is disposed on a different layer than the second conductive layer.

2. The display apparatus of claim 1, wherein the auxiliary display area further includes a third area at an other side of the first area, the third area being symmetrically arranged with the second area and including a portion of the component area and a portion of the middle area, and
the connecting line further includes a third connecting line arranged on the third area, wherein the third connecting line extends in the second direction.

3. The display apparatus of claim 2, wherein the auxiliary display area further includes a fourth area contacting each of the main display area, the first area, the second area, and the third area and including a portion of the component area and a portion of the middle area, and
the connecting line further includes a fourth connecting line arranged on the fourth area and extending in the second direction.

4. The display apparatus of claim 3, wherein each of the first connecting line, the second connecting line, the third connecting line, and the fourth connecting line includes a transmissive conductive material.

5. The display apparatus of claim 3, wherein the fourth area has a first width in the first direction, and the component area has a second width in the first direction, wherein the first width is about 25% of a maximum value of the second width.

6. The display apparatus of claim 3, wherein the fourth connecting line disposed on the fourth area is symmetrically arranged based on a virtual central line crossing a center of the fourth area.

7. The display apparatus of claim 1, wherein the first auxiliary display element includes a first auxiliary pixel electrode, and
the first auxiliary pixel electrode has an oval shape.

8. The display apparatus of claim 7, wherein the first auxiliary pixel electrode includes a first contact portion at a side portion of the first auxiliary pixel electrode, and
the first contact portion is electrically connected to the first auxiliary pixel circuit and overlaps the first auxiliary pixel electrode.

9. The display apparatus of claim 1, wherein the second auxiliary display element includes a second auxiliary pixel electrode, and
the second auxiliary pixel electrode has a circular shape.

10. The display apparatus of claim 9, wherein the second auxiliary pixel electrode includes an extension portion extending to the second auxiliary pixel circuit, and
the extension portion includes a second contact portion electrically connected to the second auxiliary pixel circuit.

11. The display apparatus of claim 1, wherein each of the first auxiliary pixel circuit and the second auxiliary pixel circuit includes:
a silicon semiconductor layer and an oxide semiconductor layer arranged on different layers from each other;
a first gate electrode arranged to overlap the silicon semiconductor layer;
a second gate electrode arranged to overlap the oxide semiconductor layer;
an insulating layer covering the first gate electrode and the second gate electrode;
a first electrode layer disposed on the insulating layer and connected to the silicon semiconductor layer; and
a second electrode layer disposed on the insulating layer and connected to the oxide semiconductor layer.

12. The display apparatus of claim 11, wherein each of the first connecting line and the second connecting line includes a first transmissive conductive layer arranged on a same layer as the first electrode layer and the second electrode layer, and a second transmissive conductive layer arranged on the first transmissive conductive layer.

13. The display apparatus of claim 12, wherein each of the first transmissive conductive layer and the second transmissive conductive layer is provided in a multiple number, and
the first transmissive conductive layer and the second transmissive conductive layer are alternately arranged on a plane.

14. The display apparatus of claim 11, wherein each of the first auxiliary pixel circuit and the second auxiliary pixel circuit includes:
a first bottom surface metal layer arranged between the substrate and the silicon semiconductor layer; and
a second bottom surface metal layer arranged between the substrate and the oxide semiconductor layer,
wherein the first bottom surface metal layer and the second bottom surface metal layer are arranged on different layers from each other.

15. The display apparatus of claim 14, wherein each of the first auxiliary pixel circuit and the second auxiliary pixel circuit further includes a storage capacitor including:
a lower electrode which is integral with the first gate electrode; and
an upper electrode overlapping the lower electrode and disposed on the lower electrode, and
the second bottom surface metal layer is arranged on a same layer as the upper electrode.

16. The display apparatus of claim 1, wherein each of the first conductive line and the second conductive line includes a reflective conductive material.

17. The display apparatus of claim 1, wherein the first conductive line and the second conductive line are alternately arranged on a plane.

18. The display apparatus of claim 1, wherein the substrate further includes a peripheral area surrounding the main display area,
the display apparatus further comprising:
a third auxiliary pixel circuit arranged on the peripheral area adjacent to the auxiliary display area; and
a third auxiliary display element arranged on the component area and electrically connected to the third auxiliary pixel circuit.

19. The display apparatus of claim 3, wherein the first area contacts the second area, the third area, the fourth area, and the main display area.

* * * * *